United States Patent
Seto et al.

(10) Patent No.: US 8,574,459 B2
(45) Date of Patent: Nov. 5, 2013

(54) PHOSPHOR, METHOD FOR PRODUCING PHOSPHOR, PHOSPHOR-CONTAINING COMPOSITION, LIGHT-EMITTING DEVICE, LIGHTING SYSTEM AND IMAGE DISPLAY DEVICE

(75) Inventors: Takatoshi Seto, Yokohama (JP); Naoto Kijima, Yokohama (JP); Keiichi Seki, Yokohama (JP); Ryuji Adachi, Tokyo (JP); Hiroyasu Yamada, Odawara (JP); Tatsuya Inoue, Odawara (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/243,273

(22) Filed: Sep. 23, 2011

(65) Prior Publication Data
US 2012/0256533 A1    Oct. 11, 2012

Related U.S. Application Data

(63) Continuation of application No. PCT/JP2010/055934, filed on Mar. 31, 2010.

(30) Foreign Application Priority Data

Mar. 31, 2009 (JP) ................................. 2009-086840
Oct. 13, 2009 (JP) ................................. 2009-236147

(51) Int. Cl.
C09K 11/80    (2006.01)
C09K 11/79    (2006.01)
H01L 33/50    (2010.01)

(52) U.S. Cl.
USPC .................................. 252/301.4 F; 313/483

(58) Field of Classification Search
USPC ..................................... 252/301.4 F; 313/483
See application file for complete search history.

(56) References Cited

U.S. PATENT DOCUMENTS

| | | | |
|---|---|---|---|
| 6,670,748 B2 * | 12/2003 | Ellens et al. ............. | 313/503 |
| 2006/0001370 A1 | 1/2006 | Justel et al. | |
| 2009/0140205 A1 | 6/2009 | Kijima et al. | |
| 2010/0085728 A1 | 4/2010 | Seto et al. | |

FOREIGN PATENT DOCUMENTS

| | | | |
|---|---|---|---|
| EP | 2141216 | * | 1/2010 |
| JP | 2008-88362 | | 4/2008 |
| WO | WO 2007/091687 A1 | | 8/2007 |
| WO | WO 2007/135975 A1 | | 11/2007 |
| WO | WO 2008/132954 | * | 11/2008 |
| WO | WO 2008/132954 A1 | | 11/2008 |
| WO | WO 2009/017206 A1 | | 2/2009 |

OTHER PUBLICATIONS

International Search Report issued May 18, 2010, in PCT/JP2010/055934.
Chinese Office Action issued Sep. 29, 2012, in China Patent Application No. 201080012830.6 (with English translation).
U.S. Appl. No. 13/842,220, filed Mar. 15, 2013, Seto et al.
2nd Notification of Office Action issued May 17, 2013, in Chinese Patent Application No. 201080012830.6 filed Mar. 31, 2010 (with English translation).
Supplemental European Search Report issued Jul. 15, 2013, in European Patent Application No. 10758832.9 filed Mar. 31, 2010.

* cited by examiner

Primary Examiner — Carol M Koslow
(74) Attorney, Agent, or Firm — Oblon, Spivak, McClelland, Maier & Neustadt, L.L.P.

(57) ABSTRACT

To provide a yellow to orange phosphor which has high luminance and excellent temperature characteristics and which also has high luminance when mixed with a phosphor of a different color.

A phosphor containing a crystal phase represented by the following formula [I], wherein when its object color is expressed by the L*a*b* color system, the values of a*, b* and $(a^{*2}+b^{*2})^{1/2}$ satisfy $-20 \leq a^* \leq -2$, $71 \leq b^*$ and $71 \leq (a^{*2}+b^{*2})^{1/2}$, respectively:

$$R_{3-x-y-z+w2}M_z A_{1.5x+y-w2} Si_{6-w1-w2} Al_{w1+w2} O_{y+w1} N_{11-y-w1} \quad [I].$$

22 Claims, 2 Drawing Sheets

PHOSPHOR, METHOD FOR PRODUCING PHOSPHOR, PHOSPHOR-CONTAINING COMPOSITION, LIGHT-EMITTING DEVICE, LIGHTING SYSTEM AND IMAGE DISPLAY DEVICE

TECHNICAL FIELD

The present invention relates to a phosphor comprising a nitrogen-containing compound such as a composite nitride or oxynitride, a method for producing it, a phosphor-containing composition which contains such a phosphor, a light-emitting device employing such a phosphor, and an image display device and lighting system provided with such a light-emitting device. More specifically, the present invention relates to a phosphor which emits a yellow to orange light under irradiation with light from an excitation light source such as a semiconductor light-emitting element being a first illuminant, a method for its production, a phosphor-containing composition which contains such a phosphor, a light-emitting device with high efficiency employing such a phosphor, and an image display device and lighting system provided with such a light-emitting device.

BACKGROUND ART

In recent years, a semiconductor light-emitting device (LED light-emitting device) having a light source such as a light-emitting diode (hereinafter referred to as "LED") and a phosphor combined, has been practically used. Particularly, a light-emitting device having blue LED and a cerium-activated yttrium/aluminum/garnet type yellow phosphor combined is well used as a white-emitting device, and from such a viewpoint, a demand for a yellow phosphor is very high.

Accordingly, a research has been active for a novel yellow phosphor different from a conventional cerium-activated yttrium/aluminum/garnet type phosphor, and it is known that a nitride phosphor as disclosed in Patent Document 1 or 2 is particularly superior in color rendering properties to the cerium-activated yttrium/aluminum/garnet type phosphor.

PRIOR ART DOCUMENTS

Patent Documents

Patent Document 1: JP-A-2008-088362
Patent Document 2: WO2008/132954

DISCLOSURE OF INVENTION

Technical Problem

However, in the market of light-emitting devices as described above, development of products having higher performance is always desired.

The present invention has been made under such circumstances, and it is a first object of the present invention to obtain a phosphor having a higher light-emitting efficiency when applied to a LED light-emitting device, with respect to the above-mentioned nitride type yellow phosphor. Further, another object of the present invention is to provide a method for producing such a phosphor, a phosphor-containing composition and a light-emitting device employing such as phosphor, and a lighting system and image display device provided with such a light-emitting device.

Solution to Problem

The present inventors have conducted an extensive study to solve the above problem and as a result, have found that when a phosphor wherein when its object color is expressed by the $L^*a^*b^*$ color system, the values of $a^*$, $b^*$ and $(a^{*2}+b^{*2})^{1/2}$ are within certain specific ranges, is used for a light-emitting device, the pseudo white color emission will be excellent, and the color emission-efficiency will be high. The present invention has been accomplished on the basis of these discoveries.

That is, the present invention provides the following (1) to (22).

(1) A phosphor containing a crystal phase represented by the following formula [I], wherein when its object color is expressed by the $L^*a^*b^*$ color system, the values of $a^*$, $b^*$ and $(a^{*2}+b^{*2})^{1/2}$ satisfy $-20 \leq a^* \leq -2$, $71 \leq b^*$ and $71 \leq (a^{*2}+b^{*2})^{1/2}$, respectively:

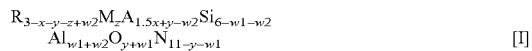
$$R_{3-x-y-z+w2}M_zA_{1.5x+y-w2}Si_{6-w1-w2}Al_{w1+w2}O_{y+w1}N_{11-y-w1} \quad [I]$$

wherein R is at least one rare earth element selected from the group consisting of La, Gd, Lu, Y and Sc; M is at least one metal element selected from the group consisting of Ce, Eu, Mn, Yb, Pr and Tb; A is at least one bivalent metal element selected from the group consisting of Ba, Sr, Ca, Mg and Zn; and x, y, z, w1 and w2 represent numerical values within the following ranges, respectively:

$(1/7) \leq (3-x-y-z+w2)/6 < (1/2)$, $0 \leq (1.5x+y-w2)/6 < (9/2)$, $0 \leq x < 3$, $0 \leq y < 2$, $0 < z < 1$, $0 \leq w1 \leq 5$, $0 \leq w2 \leq 5$, $0 \leq w1+w2 \leq 5$.

(2) The phosphor according to the above (1), wherein $0 < (1.5x+y-w2)/6 < (9/2)$.

(3) The phosphor according to the above (1) or (2), wherein the values of $b^*$ and $(a^{*2}+b^{*2})^{1/2}$ satisfy $71 \leq b^* \leq 105$ and $71 \leq (a^{*2}+b^{*2})^{1/2} \leq 105$, respectively (4) The phosphor according to any one of the above (1) to (3), wherein x is $0 < x < 3$.

(5) The phosphor according to any one of the above (1), (3) and (4), wherein $0 \leq (1.5x+y-w2) < (9/2)$.

(6) The phosphor according to any one of above (1) to (5), wherein the absorption efficiency is at least 88%.

(7) A method for producing a phosphor containing a crystal phase represented by the following formula [I], which comprises nitriding an alloy for production of a phosphor, containing at least elements of R, A and Si, wherein said alloy is subjected to firing in the presence of a flux:

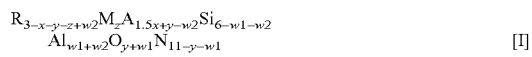
$$R_{3-x-y-z+w2}M_zA_{1.5x+y-w2}Si_{6-w1-w2}Al_{w1+w2}O_{y+w1}N_{11-y-w1} \quad [I]$$

wherein R is at least one rare earth element selected from the group consisting of La, Gd, Lu, Y and Sc; M is at least one metal element selected from the group consisting of Ce, Eu, Mn, Yb, Pr and Tb; A is at least one bivalent metal element selected from the group consisting of Ba, Sr, Ca, Mg and Zn; and x, y, z, w1 and w2 represent numerical values within the following ranges, respectively:

$(1/7) \leq (3-x-y-z+w2)/6 < (1/2)$, $0 \leq (1.5x+y-w2)/6 < (9/2)$, $0 \leq x < 3$, $0 \leq y < 2$, $0 < z < 1$, $0 \leq w1 \leq 5$, $0 \leq w2 \leq 5$, $0 \leq w1+w2 \leq 5$.

(8) The method for producing a phosphor according to the above (7), wherein $0 < (1.5x+y-w2)/6 < (9/2)$.
(9) The method for producing a phosphor according to above (7), wherein $0 \leq (1.5x+y-w2) < (9/2)$.
(10) The method for producing a phosphor according to any one of above (7) to (9), wherein the firing is carried out under a temperature condition such that the rate of temperature rise during the firing is at most 0.5° C./min within a temperature range corresponding to at least a part of the low temperature side of an exothermic peak obtainable by TG-DTA (thermogravimetry/differential thermal analysis) during the nitriding reaction of the alloy for production of a phosphor.
(11) The method for producing a phosphor according to any one of above (7) to (10), wherein the firing is carried out in a hydrogen-containing nitrogen gas atmosphere.
(12) The method for producing a phosphor according to any one of above (7) to (11), wherein after the firing, the obtained fired product is washed with an acidic aqueous solution.
(13) A phosphor containing a composition represented by the following formula [I'], wherein when its object color is expressed by the L*a*b* color system, the values of a*, b* and $(a^{*2}+b^{*2})^{1/2}$ satisfy $-20 \leq a^* \leq -2$, $71 \leq b^*$ and $71 \leq (a^{*2}+b^{*2})$ respectively:

$(Ln,Ca,Ce)_{3+\alpha}Si_6N_{11}$      [I']

wherein Ln is at least one rare earth element selected from the group consisting of La, Gd, Lu, Y and Sc, and α is a numerical value within a range of $-0.1 \leq \alpha \leq 1.5$.
(14) A phosphor-containing composition comprising the phosphor as defined in any one of the above (1) to (6) and a liquid medium.
(15) A light-emitting device having a first illuminant and a second illuminant which emits visible light under irradiation with light from the first illuminant, wherein the second illuminant contains, as a first phosphor, at least one phosphor selected from the group consisting of the phosphor as defined in any one of the above (1) to (6).
(16) The light-emitting device according to the above (15), wherein the first phosphor has an emission peak wavelength within a wavelength range of from 420 nm to 450 nm.
(17) The light-emitting device according to the above (15) or (16), wherein the second illuminant contains, as a second phosphor, at least one phosphor different in the emission peak wavelength from the first phosphor.
(18) The light-emitting device according to the above (15), wherein the first phosphor has an emission peak within a wavelength range of from 420 nm to 500 nm, and the second illuminant contains, as a second phosphor, at least one phosphor having an emission peak within a wavelength range of from 565 nm to 780 nm.
(19) The light-emitting device according to the above (15), wherein the first phosphor has an emission peak within a wavelength range of from 300 nm to 420 nm, and the second illuminant contains, as a second phosphor, at least one phosphor having an emission peak within a wavelength range of from 420 nm to 500 nm.
(20) The light-emitting device according to the above (15), wherein the first phosphor has an emission peak within a wavelength range of from 300 nm to 420 nm, and the second illuminant contains, as a second phosphor, at least one phosphor having an emission peak within a wavelength range of from 420 nm to 500 nm, at least one phosphor having an emission peak within a wavelength range of from 500 nm to 550 nm, and at least one phosphor having an emission peak within a wavelength range of from 565 nm to 780 nm.
(21) A lighting system provided with the light-emitting device as defined in any of the above (15) to (20).
(22) An image display device provided with the light-emitting device as defined in any one of the above (15) to (20).

Advantageous Effects of Invention

According to the present invention, it is possible to provided a yellow nitride phosphor which is superior in the pseudo white color to the conventional one and which has high luminance or luminous efficiency, when used for a light-emitting device. By using such a phosphor, it is possible to realize a phosphor-containing composition, a light-emitting device with high efficiency, a lighting system and a image display device.

Figure 2:
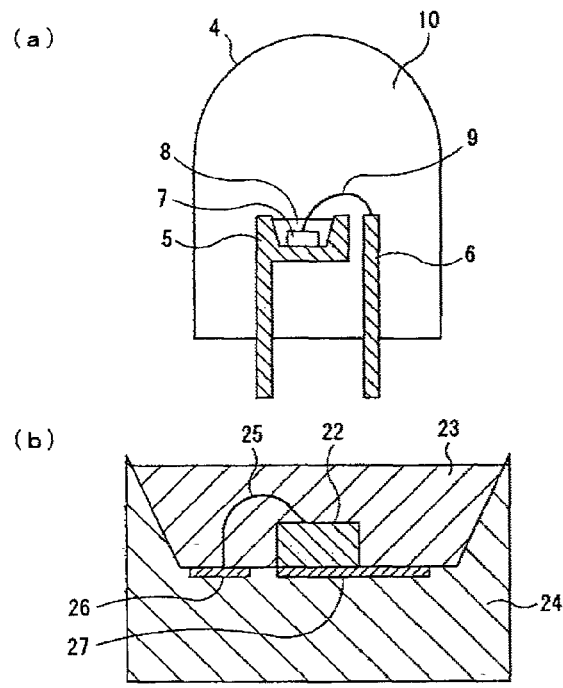

Each of FIGS. 2(a) and 2(b) is a diagrammatical cross-sectional view illustrating an embodiment of a light-emitting device having an excitation light source (first illuminant) and a phosphor-containing portion (second illuminant).

Figure 3:
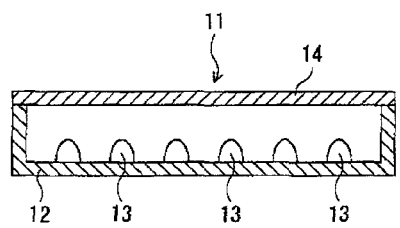

FIG. 3 is a diagrammatical cross-sectional view illustrating an embodiment of the lighting system of the present invention.

Figure 4:
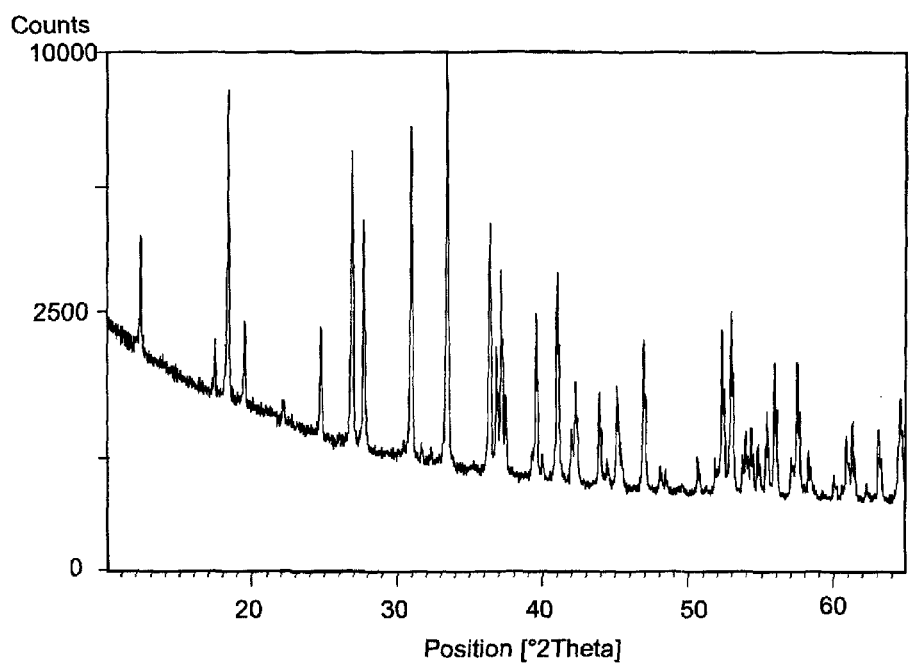

FIG. 4 is the powder X-ray diffraction pattern of the phosphor produced in Example A1.

Figure 5:
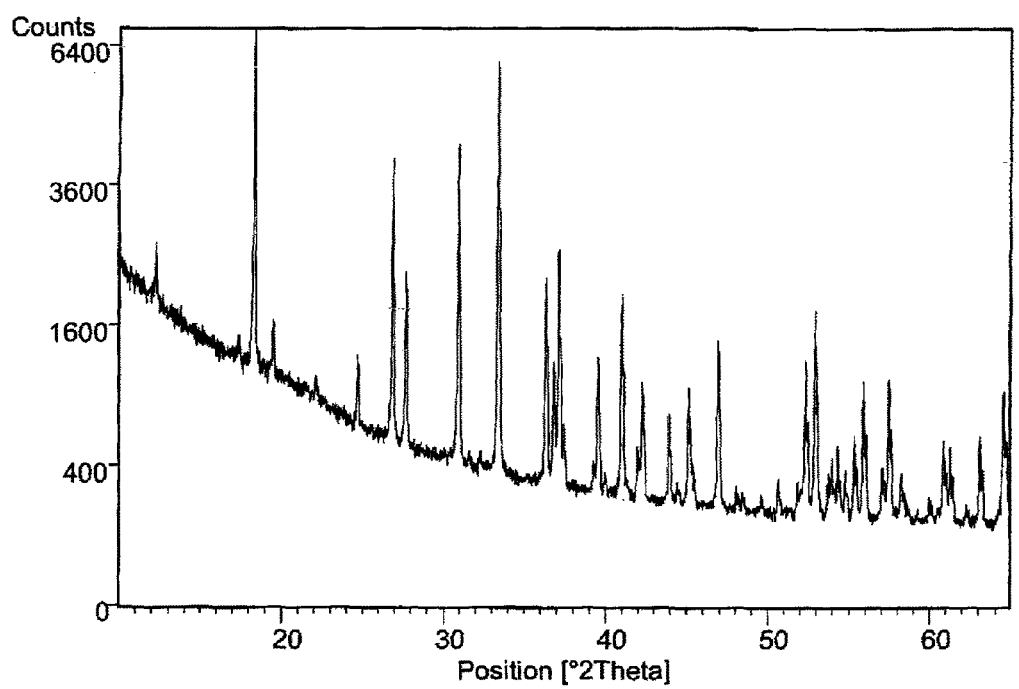

FIG. 5 is the powder X-ray diffraction pattern of the phosphor produced in Example A7.

DESCRIPTION OF EMBODIMENTS

Now, the present invention will be described with reference to its embodiments or exemplifications. However, it should be understood that the present invention is by no means restricted to the following embodiments or exemplifications and may be carried out as optionally changed or modified within a range not to depart from the gist of the present invention. In this specification, the numerical-range represented by means of "-" or "to" means the range containing the numerical values given before and after "-" or "to" as the lower and upper limit values. Further, in this specification, the relations between colors and color coordinates are all based on JIS standards (JIS Z8110).

Further, in the compositional formulae of phosphors in this specification, the adjacent compositional formulae are delimited by a comma ",". Further, plural elements being comma-delimited means that one or more of such elements may be contained in any optional combination and composition. For example, a compositional formula "(Ba,Sr,Ca)Al$_2$O$_4$:Eu" comprehensively represents all of "BaAl$_2$O$_4$:Eu", "SrAl$_2$O$_4$:Eu", "CaAl$_2$O$_4$:Eu", "Ba$_{1-x}$Sr$_x$Al$_2$O$_4$:Eu", "Ba$_{1-x}$Ca$_x$Al$_2$O$_4$:Eu", "Sr$_{1-x}$Ca$_x$Al$_2$O$_4$:Eu" and "Ba$_{1-x-y}$Sr$_x$Ca$_y$Al$_2$O$_4$:Eu" (provided that in the above formulae, 0<x<1, 0<y<1, 0<x+y<1).

[1. Phosphor of the Present Invention]

As mentioned above, the phosphor of the present invention is a phosphor containing a crystal phase represented by the formula [I]:

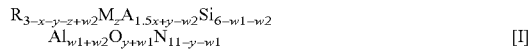

$$R_{3-x-y-z+w2}M_zA_{1.5x+y-w2}Si_{6-w1-w2}Al_{w1+w2}O_{y+w1}N_{11-y-w1} \quad [I]$$

wherein R is at least one rare earth element selected from the group consisting of La, Gd, Lu, Y and Sc; M is at least one metal element selected from the group consisting of Ce, Eu, Mn, Yb, Pr and Tb; A is at least one bivalent metal element selected from the group consisting of Ba, Sr, Ca, Mg and Zn; and x, y, z, w1 and w2 represent numerical values within the following ranges, respectively:

$(1/7) \leq (3-x-y-z+w2)/6 < (1/2)$, $0 \leq (1.5x+y-w2)/6 < (9/2)$, $0 \leq x < 3$, $0 \leq y < 2$, $0 < z < 1$, $0 \leq w1 \leq 5$, $0 \leq w2 \leq 5$, $0 \leq w1+w2 \leq 5$.

wherein when its object color is expressed by the L*a*b* color system, the values of a*, b* and $(a^{*2}+b^{*2})^{1/2}$ satisfy $-20 \leq a^* \leq -2$, $71 \leq b^*$ and $71 \leq (a^{*2}+b^{*2})^{1/2}$, respectively.

In the following, firstly, the crystal phase represented by the formula [I] will be described in more detail.

[1-1. Composition of Crystal Phase of the Phosphor of the Present Invention]

In the above formula [I], R is at least one rare earth element selected from the group consisting of La, Gd, Lu, Y and Sc. Among them, R is preferably at least one rare earth element selected from the group consisting of La, Gd and Y. Among them, R is more preferably at least one rare earth element selected from the group consisting of La and Gd. Among them, it is particularly preferably La.

Further, as R, one rare earth element may be used alone, or two or more rare earth elements may be used in an optional combination and ratio. By using two or more rare earth elements as R, it is possible to change the excitation wavelength or emission wavelength of the phosphor of the present invention thereby to adjust the CIE chromaticity coordinate (x,y).

However, in a case where R is composed of two or more elements, the proportion of La, a mixture of La and Gd, or a mixture of La, Gd and Y, in R is usually preferably at least 70 mol %, more preferably at least 80 mol %, particularly preferably at least 95 mol %, whereby it is possible to improve the luminance or emission intensity. Further, from the viewpoint of the luminance or emission intensity, the proportion of La based on the total amount of La, Gd and Y is usually preferably at least 70 mol %, more preferably at least 80 mol %, particularly preferably at least 95 mol %. Further, the proportion of the total amount of Gd and Y based on the total amount of La, Gd and Y is usually preferably from 3 to 20 mol %, more preferably from 5 to 15 mol %, from the viewpoint of good color of yellow as the emission color.

In the above formula [I], M is at least one metal element selected from the group consisting of Ce, Eu, Mn, Yb, Pr and Tb. Here, M is one to function as an activation element. Further, as M, among the above metal elements, only one type may be used, or two or more types may be used in combination in an optional combination and ratio. Among them, M is preferably one containing at least Ce from the viewpoint of the luminous efficiency and emission peak wavelength, and it is more preferred to use only Ce.

With respect to Ce as an activation element, at least a part thereof will be present in the form of a trivalent cation in the phosphor of the present invention. At that time, activation element Ce may take trivalent or tetravalent valency, but the proportion of the trivalent cation should better be high. Specifically, the proportion of Ce$^{3+}$ based on the entire Ce amount is usually at least 20 mol %, preferably at least 50 mol %, more preferably at least 80 mol %, particularly preferably at least 90 mol %, most preferably 100 mol %.

Further, with respect to Eu, Mn, Yb, Pr and Tb as activation elements other than Ce, there may be a case where cations different in the valency coexist like in the case of Ce. By an addition of a very small amount of such elements, there may be a case where a sensitizing effect is obtainable, and the luminance will be improved.

Here, the proportion of Ce$^{3+}$ in the entire Ce contained in the phosphor of the present invention can be obtained by e.g. the measurement of X-ray Absorption Fine Structure. That is, when L3 absorption edges of Ce atoms are measured, Ce$^{3+}$ and Ce$^{4+}$ exhibit separate absorption peaks, and their ratio can be quantified from their areas. Further, the proportion of Ce$^{3+}$ in the entire Ce contained in the phosphor of the present invention can be obtained also by measurement of electron spin resonance (ESR). Further, with respect to the above M, the amount of the atom with the desired valency can be measured by the measurement of X-ray Absorption Fine Structure like in the case of Ce.

In the above formula [I], A is at least one bivalent metal element selected from the group consisting of Ba, Sr, Ca, Mg and Zn. At that time, A is preferably at least one bivalent metal element selected from the group consisting of Sr, Ca and Mg, more preferably Ca and Mg, further preferably Ca. Further, as the above A, only one of such elements may be used, or two or more of them may be used in an optional combination and ratio.

The basic system of the crystal phase represented by the above formula [I] is a system wherein R and A coexist as surrounded by a SiN$_4$ tetrahedron. In the crystal phase represented by the formula [I], it is possible to increase bivalent A, while decreasing trivalent R (hereinafter this substitution will be referred to as "R–A substitution"). This represents a unique crystal phase, wherein the increase of A does not correspond to the decrease of R, but the increase of A takes place 1.5 times the reduction of R, whereby charge compensation is carried out.

Further, in the phosphor of the present invention, a part of R may be substituted by A by a system other than the above R–A substitution, and in such a case, N anions are substituted by O anions by the number of substituted R.

Further, in the above basic system of the crystal phase, a part of Si may be substituted by Al. For this purpose, Al appears in the formula [I]. In such a case, N anions are substituted by O anions, and/or bivalent A is substituted by trivalent R.

In the above formula [I], 1.5x is a numerical value representing the amount of A substituted for a part of R by the above R–A substitution. If the value x at the time of charging before the firing is too small, a byproduct is likely to be formed during the firing. However, this value x gradually decreases during the firing, and the final value x in the phosphor should better be small with a view to letting the phosphor undergo crystal growth to obtain high luminance. The value x at that time is usually at most 2.5, preferably at most 2.2, more preferably at most 1.5, in the case of utilizing a yellow emission containing a reddish component. On the other hand, in the case of utilizing the yellow emission itself, it is usually at most 1.5, preferably at most 1.0, more preferably at most 0.5, further preferably at most 0.2. The lower limit of the value x may be 0 or a value exceeding 0.

In the above formula [I], y is a numerical value representing the amount of A substituted for a part of R in a system other than the above R–A substitution. While oxygen to be included should better be less, there may be a case oxygen will be included slightly from the raw material or during the firing. In such a case, N anions in the phosphor are substituted by O anions, and for the charge compensation, substitution of A will be required. The value y may include 0, but is usually larger than 0, preferably at least 0.002, more preferably at least 0.005, further preferably at least 0.008, and in the case of utilizing a yellow emission containing a reddish component, it is usually at most 2.5, preferably at most 2.2, more preferably at most 1.5. On the other hand, in the case of utilizing the yellow emission itself, it is usually at most 1.5, preferably at most 1.0, more preferably at most 0.5, further preferably at most 0.2.

In the above formula [I], z is a numerical value representing the amount of activation element M and is usually larger than 0, preferably at least 0.002, more preferably at least 0.01, further preferably at least 0.05, and usually less than 1, preferably at most 0.7, more preferably at most 0.6. If the value z is too large, it is possible that the emission intensity decreases due to concentration quenching.

In the above formula [I], the substitution number of moles of Al is represented by w1 and w2. The range of this w1 is usually at least 0, preferably at least 0.002, more preferably at least 0005 and usually at most 5, preferably at most 2, more preferably at most 1, further preferably at most 0.5. On the other hand, the range of w2 is usually at least 0, preferably at least 0.002 and usually at most 5, preferably at most 2, more preferably at most 1, further preferably at most 0.5. By the substitution of Al, it is possible to adjust the color tone of the emission color of the phosphor of the present invention. Further, by adjusting w1 and w2 to be within the above ranges, it is possible to adjust the emission color while maintaining the crystal structure.

Further, in the above formula [I], the above-mentioned x, y and z satisfy the relations of the following two relations. $(1/7) \leq (3-x-y-z+w2)/6 < (1/2)$, and $0 \leq (1.5x+y-w2)/6 < (9/2)$.

That is, in the formula [I], "(3−x−y−z+w2)/6" represents a numerical value of at least 1/7 and less than 1/2.

Further, in the formula [I], "(1.5x+y−w2)/6" represents a numerical value of at least 0 and less than 9/2. And, more preferably, it is larger than 1.

Further, from the viewpoint of the emission intensity, the number of moles of oxygen (y+w1) in the formula [I], is preferably less than 2, more preferably less than 1.7, further preferably less than 1.5. Further, from the viewpoint of production efficiency, the above number of moles of oxygen (y+w1) is preferably at least 0.01, more preferably at least 0.04.

Further, from the viewpoint of the emission intensity, the number of moles of Al (w1+w2) in the formula [I] is usually at most 5, preferably at most 3, more preferably at most 1. On the other hand, the lower limit is preferably close to 0, particularly preferably 0, from the viewpoint of the production efficiency.

The phosphor of the present invention shows a good performance even when it has an anion or cation deficiency to some extent. The formula [I] is a usual formula assumed to be free from a cation deficiency or an anion deficiency. Therefore, when a deficiency is formed, there may be a case where x, y, z, w1 and w2 cannot be determined from the actual elemental analytical values.

Further, in a case where the phosphor of the present invention is to be actually analyzed, the coefficients of the respective elements are likely to include measurement errors, and there may be a case where it is difficult to separate oxygen or nitrogen adsorbed on the surface or a small amount of impurities, and thus, it is needless to say that in reality, the values of x, y, z, w1 and w2 have allowable ranges to some extent.

Further, the phosphor of the present invention is particularly preferably a phosphor containing a composition represented by the following formula [I'], wherein when its object color is expressed by the L*a*b* color system, the values of a*, b* and $(a^{*2}+b^{*2})^{1/2}$ satisfy $-20 \leq a^* \leq -2$, $71 \leq b^*$ and $71 \leq (a^{*2}+b^{*2})^{1/2}$, respectively:

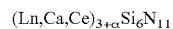
$(Ln,Ca,Ce)_{3+\alpha}Si_6N_{11}$      [I']

wherein Ln is at least one rare earth element selected from the group consisting of La, Gd, Lu, Y and Sc, and α is a numerical value within a range of $-0.1 \leq \alpha \leq 1.5$.

Such a phosphor of the formula [I'] is essentially the same as the phosphor of the formula [I], however, in order to avoid formation of anion deficiency or cation deficiency or as mentioned above, in the case of actually analyzing an obtained phosphor, in order to avoid an analytical error or formation of an impurity phase with a composition other than the present invention in the formed phosphor or in order to intentionally avoid an influence of an impurity element, including the case of adjusting the total amount of Ln, Ca and Ce which is essentially required, in a typical phosphor of the present invention, the composition within a range of the total amount of Ln, Ca and Ce allowable as the entire phosphor is defined. In such a case, $-0.1 \leq \alpha \leq 1.5$ is preferred, and more preferred is $-0.1 \leq \alpha \leq 1.0$. Especially in a case where the luminance is to be improved, $-0.1 \leq \alpha \leq 0.1$ is particularly preferred.

In the phosphor of the formula [I'], the amount of N may sometimes change to some extent for such a reason as e.g. cation deficiency or anion deficiency. When such an allowable range is represented by β, the coefficient of N becomes 11+β. At that time, a range of $-0.2 \leq \beta \leq 0.5$ is preferred, and more preferred is $0 \leq \beta \leq 0.3$, and further preferred is $0 \leq \beta \leq 0.1$. The above numerical values are numerical values when the molar ratio of Si is set to be 6. Further, when Si is set to be 6 mol, oxygen may be contained in an amount of at most 1 mol, more preferably at most 0.5 mol, further preferably at most 0.3 mol, particularly preferably at most 0.1 mol, in addition to the formula [I']. Here, from the viewpoint of the analysis, oxygen is considered to be one contained in the phosphor and one adsorbed on the surface or interior of the phosphor or present separately from the crystals. From the viewpoint of the luminance, in the formula [I'], the amount of Ca is preferably less than 2 mol, more preferably less than 1 mol, further preferably less than 0.5 mol, most preferably less than 0.2 mol. In addition to the above-mentioned adjustment of the emission color by e.g. Gd or Y, it is possible to adjust the emission color also by the number of moles of Ca, from yellow slightly close to green, to orange, within a range of from 0 to 0.5 mol.

Within the chemical composition of the above formula [I], preferred specific examples will be given below, but it should be understood that the composition of the crystal phase of the phosphor of the present invention is by no means limited to the following examples. Within the chemical composition of the formula [I], preferred examples having no oxygen included, include the following. $La_{1.37}Ce_{0.03}Ca_{2.40}Si_6N_{11}$, $La_{2.15}Ce_{0.10}Ca_{1.23}Si_6N_{11}$, $La_{2.57}Ce_{0.03}Ca_{0.60}Si_6N_{11}$, $La_{1.17}Ce_{0.03}Ca_{2.70}Si_6N_{11}$, $La_{2.68}Ce_{0.30}Ca_{0.03}Si_6N_{11}$, $La_{2.74}Ce_{0.20}Ca_{0.09}Si_6N_{11}$, $La_{2.50}Ce_{0.30}Ca_{0.30}Si_6N_{11}$, $La_{2.70}Ce_{0.30}Si_6N_{11}$, $La_{2.5}Gd_{0.20}Ce_{0.30}Si_6N_{11}$, $La_{2.3}Gd_{0.40}Ce_{0.30}Si_6N_{11}$, $La_{2.49}Gd_{0.15}Ce_{0.30}Ca_{0.09}Si_6N_{11}$, $La_{2.5}Y_{0.20}Ce_{0.30}Si_6N_{11}$, $La_{2.67}Ce_{0.03}Ca_{0.45}Si_6N_{11}$, $La_{2.60}Ce_{0.10}Ca_{0.45}Si_6N_{11}$.

Further, preferred examples wherein oxygen is present, include the following.

$La_{1.71}Ce_{0.10}Ca_{1.57}Si_6O_{0.44}N_{10.56}$,
$La_{1.17}Ce_{0.03}Ca_{2.20}Si_6O_{1.00}N_{10.00}$,
$La_{2.37}Ce_{0.03}Ca_{0.75}Si_6O_{0.30}N_{10.70}$,
$La_{2.68}Ce_{0.30}Ca_{0.02}Si_6O_{0.02}N_{10.98}$,
$La_{2.74}Ce_{0.20}Ca_{0.15}Si_6O_{0.06}N_{10.94}$,
$La_{2.50}Ce_{0.30}Ca_{0.20}Si_6O_{0.20}N_{10.80}$,
$La_{2.49}Ce_{0.30}Ca_{0.30}Si_6O_{0.03}N_{10.57}$,
$La_{1.25}Ce_{0.25}Ca_{2.20}Si_6O_{0.10}N_{10}$,
$La_{2.66}Ce_{0.20}Ca_{0.15}Si_6O_{0.12}N_{10.88}$,
$La_{2.61}Ce_{0.30}Ca_{0.09}Si_6O_{0.09}N_{10.91}$,
$La_{2.57}Gd_{0.15}Ce_{0.25}Ca_{0.03}Si_6O_{0.03}N_{10.97}$.

Further, a crystal phase wherein oxygen is present in a small amount, and no Ca is present, is also mentioned as preferred. In such a case, the crystal phase will be one wherein a very small portion of La or Si is deficient.

The above-described crystal phase represented by the formula [I] is essentially the one constituting a new structure (space group and site-constituting ratio) in an alkaline earth metal element-rare earth element (Ln)-Si—N system. Now, the difference between this crystal phase and the crystal phases of known substances will be described.

The space group of the crystal phase represented by the above formula [I] is P4bm or its analogous space group, while the space group of known $SrYbSi_4N_7$ or $BaYbSi_4N_7$ is $P6_3mc$ (Zeitschrift fur Anorganische and Allgemeine Chemie, 1997, vol. 623, p. 212), and the space group of known BaEu $(Ba_{0.5}Eu_{0.5})YbSi_6N_{11}$ is $P2_13$ (H. Huppertz, Doctoral thesis, Bayreuth University, 1997). Thus, the crystal phase represented by the formula [I] is substantially different in the space group from the known phosphors. Further, the crystal phase represented by the formula [I] is substantially different from the known phosphors in the powder X-ray diffraction pattern constituting its base, and it is therefore apparent that the crystal structure is different.

The crystal phase represented by the above formula [I] has a unique site-constituting ratio such that the total number of cations having a lower valency than Si surrounded by $SiN_4$ tetrahedrons exceeds 3/6 to the number of $SiN_4$ tetrahedrons. On the other hand, in the known Ce-activated $La_3Si_6N_{11}$, the total number of cations having a lower valency than Si surrounded by $SiN_4$ tetrahedrons is exactly 3/6 to the number of $SiN_4$ tetrahedrons (JP-A-2003-206481), and in the known $LnAl(Si_{6-z}Al_z)N_{10-z}O_z$:Ce phosphor, the total number of cations having a lower valency than Si surrounded by Si(or Al)N(or O)$_4$ tetrahedrons is 2/6 to the number of Si(or Al)N (or O)$_4$ tetrahedrons (Patent Document 1). Thus, the crystal phase represented by the formula [I] is apparently different from the known phosphors in the constituting ratio of each site characterizing the structure.

Further, in the phosphor of the present invention, a part of the constituting elements of the crystal phase represented by the above formula [I] may be deficient or may be substituted by other atoms, so long as the performance is not impaired. The following may be mentioned as examples of such other elements.

For example, in the formula [I], at the position of M, at least one transition metal element or rare earth element selected from the group consisting of Nd, Sm, Dy, Ho, Er and Tm may be substituted. Among them, it is preferred that Sm and/or Tm as a rare earth element is substituted.

Further, for example, in the formula [I], all or a part of Al may be replaced by B. In a case where raw materials are put into a BN container, followed by firing to produce a phosphor of the present invention, B will be included in the obtainable phosphor, and it is possible to produce a phosphor wherein Al is replaced by B as mentioned above. Further, for example, in the formula [I], at the positions of O and/or N, anions such as S, Cl and/or F may be substituted.

Further, in the formula [I], a part of Si may be replaced by Ge and/or C. Such a substitution ratio is preferably at most 10 mol %, more preferably at most 5 mol %, further preferably 0 mol %. Further, for such a reason that no substantial reduction of the emission strength is brought about, at each site of R, A, Si, Al O and N in the formula [I], at most 5 mol % of an element may be substituted, or at each site, at most 10 mol % of deficiency may be formed. However, both of such substitution and deficiency should better be 0 mol %.

However, in order to obtain the merits of the present invention distinctly, it is preferred that the entire phosphor is made of the crystal phase having the above-described chemical composition of the formula [I].

[1-2. Object Color of the Phosphor of the Present Invention]

The causes for coloration of inorganic crystals are generally classified into the following three types. (1) Coloration due to a ligand field absorption band (crystal field coloration), (2) coloration due to transition between molecular orbitals, and (3) coloration due to transition within substances having energy bands. Among them, the coloration (1) is due to the presence of an element having an electronic state not to completely fill the inner shell, such as a transition metal element or a rare earth element. That is, such an incomplete inner shell has an unpaired electron, and such an excited state imparts a color to a substance corresponding to a visible spectrum. The emission center element to be used in many phosphors is a transition metal element or a rare earth element and thus is provided with the requirements for (1) in consideration of a fact that no coloration is observed in the case of a matrix crystal containing no emission center element.

From the foregoing, it is considered that as the object color of the above phosphor, coloration unique to the phosphor is observed, since at the same time as the light emitted from the phosphor itself upon absorption of a visible light, light in a region where the spectral reflectance is high, is reflected. The object color is usually represented by means of the L*, a*, b* color system (JIS Z8113). Here, L* does not exceed 100, since it is usual to handle an object which does not emit light under irradiation light, but in the case of the phosphor of the present invention, it may exceeds 100, since the emitted light is superimposed on the reflected light under excitation with the irradiation light source, and its upper limit is usually L*≤110. Here, the measurement of the object color of the phosphor of the present invention may be carried out, for example, by means of a commercially available object color measuring apparatus (such as CR-300 manufactured by MINOLTA).

As mentioned above, the phosphor of the present invention is characterized in that when its object color is represented by the L*a*b* color system, the values of a*, b* and $(a^{*2}+b^{*2})^{1/2}$ satisfy $-20 \leq a^* \leq -2$, $71 \leq b^*$ and $71 \leq (a^{*2}+b^{*2})^{1/2}$, respectively.

From the viewpoint of the color, a* is usually at least −20, preferably at least −19, more preferably at least −18, further preferably at least −17 and usually at most −2, preferably at most −5, more preferably at most −8, further preferably at most −9, most preferably at most −11. If a* is too small, the color tends to be yellowish green, whereby it tends to be difficult to perform a function as a yellow phosphor. If a* is too large, the color tends to be reddish yellow, whereby it tends to be difficult to perform a function as a good yellow phosphor.

By adjusting a* to be within the above range, it is possible to obtain an object color of pure yellow. This means that in a blue color which is in a complementary relation with the yellow color, the blue light to be absorbed is a pure blue light. Therefore, when the phosphor having a* within this range is combined with a phosphor with another emission color such as a green phosphor or a bluish green phosphor to form a device to emit the desired emission color by using blue LED as the power source, it is possible to present a light-emitting device with high luminous efficiency, since it is thereby possible to suppress absorption of the emission color of the second phosphor.

In such a combination of phosphors, the good characteristic relating to this a* is an important characteristic which cannot be accomplished by yellow emission properties by a yellow phosphor alone e.g. by only a factor such as yellow light luminance. That is, in a case where a yellow phosphor and another phosphor are combined to form a light-emitting device, for example, among yellow phosphors having the same luminance, one having a* within this range will be excellent in the overall luminous efficiency.

Likewise, from the viewpoint of the color, b* is usually at least 71, preferably at least 72, more preferably at least 73, further preferably at least 74, and the upper limit is not particularly limited, but is usually at most 105, preferably at most 102, more preferably at most 100, further preferably at most 98. If b* is too small, the color tends to be blackish yellow, whereby it tends to be difficult to perform a function as a good yellow phosphor.

By adjusting b* to be within the above range, it is possible to obtain an object color of yellow which is not blackish. A substance having an object color of blackish yellow means that it absorbs a visible light other than the wavelength of blue light, such as in a green region or a red region, in addition to the blue color which is in a complementary relation with a yellow color. Therefore, when the phosphor having b* within this range and having an object color of yellow which is not blackish, is combined with a phosphor having another emission color such as a red phosphor or a green phosphor to form a device to emit a desired emission color such as a light bulb color emission or a warm white emission, by using blue LED as a light source, it is possible to provide a light-emitting device having a good luminous efficiency, since it is thereby possible to substantially suppress absorption of green or red emission of the second phosphor.

In such a combination of phosphors, the good characteristic relating to this b* is an important characteristic which cannot be accomplished by yellow emission properties by a yellow phosphor alone, e.g. by only a factor such as yellow light luminance. That is, in a case where a yellow phosphor is combined with another phosphor to form a light-emitting device, for example, among yellow phosphors having the same luminance, one having b* within this range will be excellent in the overall luminous efficiency.

Further, from the viewpoint of chroma, $(a^{*2}+b^{*2})^{1/2}$ is usually at least 71, preferably at least 72, more preferably at least 74, further preferably at least 76, and its upper limit is not particularly limited, but it is usually at most 105, preferably at most 102, more preferably at most 100, further preferably at most 98. If $(a^{*2}+b^{*2})^{1/2}$ is too small, the color tends to be a dull color of yellow, and as $(a^{*2}+b^{*2})^{1/2}$ becomes high, the color becomes bright yellow such being preferred as a yellow phosphor.

By adjusting $(a^{*2}+b^{*2})^{1/2}$ to be within the above range, it is possible to obtain an object color of dullness-free yellow. A substance having an object color of yellow with dullness means that it absorbs visible light other than a blue color which is in a complementary relation with a yellow color, by e.g. defects in the solid substance. Therefore, when the phosphor having $(a^{*2}+b^{*2})^{1/2}$ within this range and having an object color of dullness-free yellow, is combined with a phosphor having another emission color, such as a red phosphor or a green phosphor to form a device to emit a desired emission color such as a light bulb color emission or a warm white emission, by using blue LED as a light source, it is possible to provide a light-emitting device having a good luminous efficiency, since it is thereby possible to suppress absorption of the green or red emission of the second phosphor. In such a combination of phosphors, the good characteristic relating to this $(a^{*2}+b^{*2})^{1/2}$ is an important characteristic which cannot be accomplished by the yellow emission properties of a yellow phosphor alone, e.g. by only a factor such as a yellow light luminance.

[1-3. Absorption Efficiency of the Phosphor of the Present Invention]

The absorption efficiency of a phosphor means a ratio of the number of photons absorbed by the phosphor to the number of photons of excitation light. The absorption efficiency of the phosphor of the present invention is not particularly limited, but should better be high. Specifically, when the phosphor of the present invention is excited with light having a wavelength of 455 nm, the absorption efficiency is usually at least 88%, preferably at least 89%, more preferably at least 90%, further preferably at least 91%. If the absorption efficiency of the phosphor is too low, the amount of excitation light required to obtain the desired emission becomes large, and the energy consumption becomes large, whereby the luminous efficiency tends to be low. The method for measuring the absorption efficiency is as shown in the section for "EXAMPLES" given hereinafter.

[1-4. Other Properties of the Phosphor of the Present Invention]

[1-4-1. Emission Color]

The phosphor of the present invention usually emits yellow to orange light. That is, the phosphor of the present invention usually becomes a yellow to orange phosphor. The chromaticity coordinate of fluorescence of the phosphor of the present invention usually becomes a coordinate with a region defined by (x,y)=(0.400, 0.420), (0.400, 0.590), (0.570, 0.590) and (0.570, 0.420), and preferably becomes a coordinate within a region defined by (x,y)=(0.420, 0.450), (0.420, 0.560), (0.560, 0.560) and (0.560, 0.450). Therefore, in the chromaticity coordinate of fluorescence of the phosphor of the present invention, the chromaticity coordinate x is usually at least 0.400, preferably at least 0.420 and usually at most 0.570, preferably at most 0.560. On the other hand, the chromaticity coordinate y is usually at least 0.420, preferably at least 0.450 and usually at most 0.590, preferably at most 0.560.

Especially when the luminance is important, the emission color is preferably slightly greenish yellow, and in such a case, the chromaticity coordinate x being from 0.41 to 0.43, and the chromaticity coordinate y being from 0.55 to 0.56 will be the most advantageous ranges.

Here, the chromaticity coordinates of fluorescence can be calculated from the after-described emission spectrum. Further, the values of the above chromaticity coordinates x and y represent values of chromaticity coordinates in the CIE standard coordinate system of an emission color when excited with light having a wavelength of 455 nm. If a part of element R is substituted by another rare earth element, e.g. if a part of La is substituted by an element such as Y or Gd, it becomes possible to control the chromaticity coordinate (x, y) values of the emission color, and it becomes possible to present a width to the design of various devices which will be described hereinafter.

[1-4-2. Emission Spectrum]

The spectrum (emission spectrum) of fluorescence emitted from the phosphor of the present invention is not particularly limited, but from the viewpoint of the application as a yellow to orange phosphor, the emission peak wavelength of the emission spectrum when excited with light having a wavelength of 455 nm is usually at least 480 nm, preferably at least 500 nm, more preferably at least 515 nm, further preferably at least 525 nm and usually at most 640 nm, preferably at most 610 nm, more preferably at most 600 nm. Further, in a case where the luminance is particularly important, the emission peak wavelength is preferably made to be from 530 nm to 535 nm.

Further, the phosphor of the present invention has a full width at half maximum (hereinafter sometimes referred to as "FWHM") of an emission peak when excited with light having a wavelength of 455 nm, being usually at least 100 nm, preferably at least 110 nm, more preferably at least 115 nm. As the full width at half maximum is wide like this, the color rendering properties of e.g. a light-emitting device can be made good when the phosphor of the present invention is combined with e.g. blue LED. Here, the upper limit of the full width at half maximum of the emission peak is not particularly limited, but it is usually at most 280 nm.

The measurement of the emission spectrum of the phosphor of the present invention as well as the calculations of its luminous region, the emission peak wavelength and the full width at half value of the peak may, for example, be carried out at room temperature (usually 25° C.) by means of an apparatus such as a fluorescence-measuring apparatus manufactured by JASCO Corporation.

[1-4-3. Excitation Wavelength]

The wavelength of light to excite the phosphor of the present invention (excitation wavelength) varies depending upon e.g. the composition of the phosphor of the present invention. However, usually, the excitation is preferably carried out by light within a wavelength range of from a near ultraviolet region to a blue region. A specific range of the excitation wavelength is usually at least 300 nm, preferably at least 340 nm and usually at most 500 nm, preferably at most 480 nm.

[1-4-4. Weight Median Diameter]

The phosphor of the present invention preferably has a weight median diameter within a range of usually at least 0.1 μm, preferably at least 0.5 μm and usually at most 30 μm, preferably at most 20 μm. If the weight median diameter is too small, the luminance tends to decrease, and the phosphor particles tend to agglomerate. On the other hand, if the weight median diameter is too large, coating irregularities or clogging of e.g. a dispenser to tend to result.

[1-5. Merits of the Phosphor of the Present Invention]

As described above, the phosphor of the present invention substantially contains yellowish green to orange color components and is capable of emitting fluorescence with a wide full width at half maximum. That is, the phosphor of the present invention has a sufficient emission intensity in a long wavelength region of from yellowish green to orange colors, and in its emission spectrum, it is capable of emitting light having an emission peak with an extremely wide full width at half maximum. Accordingly, when the phosphor of the present invention is applied to a white-emitting device, such a white emitting device will be capable of emitting white light having various color tones and high color rendering properties, to meet with needs.

Further, the phosphor of the present invention is a phosphor which is usually particularly efficiently excited by a semiconductor light-emitting element for near ultraviolet emission or blue emission thereby to emit a yellowish green to orange color fluorescence. Further, the phosphor of the present invention is usually less likely to be susceptible to deterioration of emission efficiency due to a temperature rise, as compared with a YAG:Ce phosphor which has been commonly used in white-emitting devices.

[1-6. Uses of the Phosphor of the Present Invention]

There is no particularly limitation to uses of the phosphor of the present invention. By utilizing the above merits, it may suitably be used in fields of e.g. lighting, image display devices, etc. Among them, it is suitable for the purpose of realizing particularly high output lamps among common lighting LED, especially white LED for light bulb color which has high luminance and high color rendering properties and which has relatively low color temperature. Further, as mentioned above, the phosphor of the present invention is less susceptible to deterioration of luminous efficiency due to a temperature rise, whereby by employing the phosphor of the present invention for a light-emitting device, it is possible to realize an excellent light-emitting device which has high luminous efficiency and is less susceptible to deterioration of luminous efficiency due to a temperature rise and which has high luminance and a wide color reproduction range.

Especially, by utilizing the characteristic such that the phosphor of the present invention can be excited with blue light or near ultraviolet light, it can be suitably employed for various light-emitting devices (e.g. "light-emitting devices of the present invention" given hereinafter). In such a case, by adjusting the types or proportions of the phosphors to be combined, it is possible to produce light-emitting devices having various emission colors. Particularly, the phosphor of the present invention is usually a yellow to orange color phosphor, and accordingly, when it is combined with an excitation light source which emits blue light, it is possible to produce a white-emitting device. It is thereby possible to obtain an emission spectrum similar to an emission spectrum of so-called pseudo white [e.g. emission color of a light-emitting device having blue LED and a phosphor emitting yellow fluorescence (yellow phosphor) combined].

Further, by combining a red phosphor to the above white-emitting device and further combining a green phosphor as the case requires, it is possible to realize a light-emitting device excellent in red color rendering properties or a light-emitting device which emits light bulb color (warm white color). In a case where an excitation light source which emits near ultraviolet light, is used, by adjusting the emission wavelengths of a blue phosphor, a red phosphor and/or a green phosphor in addition to the phosphor of the present invention, it is possible to obtain a white light source whereby a desired emission color can be obtained.

Further, the emission color of a light-emitting device is not limited to white color. For example, in a case where a light-emitting device is constituted by using the phosphor of the present invention as a wavelength-conversion material, it is possible to produce a light-emitting device which emits an optional color, by combining other phosphors in addition to the phosphor of the present invention and adjusting the types or proportions of the phosphors. The light-emitting device thus obtained can be used as a light-emitting portion for an image display device (particularly as a backlight for liquid crystal or the like) or as a lighting system.

Such other phosphors may, for example, be preferably phosphors which exhibit emission of e.g. blue, bluish green, green, yellowish green, red or deep red color. Particularly, by combining the phosphor of the present invention, a green or red phosphor, and as an excitation light source, a blue-emitting diode, it is possible to constitute a white-emitting device, such being more preferred. Further, it is possible to constitute a preferred white-emitting device also by combining the phosphor of the present invention with a near ultraviolet-emitting diode, a blue phosphor, a red phosphor and a green phosphor. By adding a phosphor which emits red to deep red color to such a white-emitting device, it is possible to further improve the color rendering properties.

[2. Method for Producing the Phosphor of the Present Invention]

There is no particularly limitation to the method for producing the phosphor of the present invention. Any optional method may be employed so long as it is a method whereby a phosphor having the above-described properties can be obtained. For example, phosphor precursors are prepared as raw materials, and such phosphor precursors may be mixed as the case requires, and the phosphor can be produced via a step (firing step) of firing the mixed phosphor precursors. Among such production methods, a method is preferred wherein an alloy is used at least as a part of the raw materials. More specifically, it is preferred to produce the phosphor by a method which has a step of firing an alloy containing at least elements of R, A and Si in the above formula [I] (hereinafter sometimes referred to as "an alloy for production of a phosphor" in the presence of a flux.

That is, the present invention provides a method for producing a phosphor containing a crystal phase represented by the following formula [I]

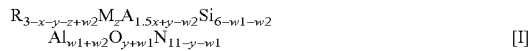

wherein R, M, A, x, y, z, w1 and w2 are as defined above, which comprises nitriding an alloy for production of a phosphor, containing at least elements of R, A and Si, wherein said alloy is subjected to firing in the presence of a flux.

In the above production method, it is preferred to carry out the firing under a temperature condition such that the rate of temperature rise during the firing is at most 0.5° C./min within a temperature range corresponding to at least a part of the low temperature side of an exothermic peak obtainable by TG-DTA (thermogravimetry/differential thermal analysis) during the nitriding reaction of the alloy for production of a phosphor. Further, it is preferred to carry out the firing in a hydrogen-containing nitrogen gas atmosphere. Further, it is preferred that after the firing, the obtained fired product is washed with an acidic aqueous solution. By using such methods in combination as the case requires, it is possible to suitably produce the phosphor of the present invention which has high luminance and a specific object color.

Now, as an embodiment of the method for producing the phosphor of the present invention, the method of employing such an alloy for production of a phosphor will be described in further detail.

[2-1. Alloy for Production of Phosphor]

As a purification method for metal simple substances to be industrially widely used, sublimation purification, a floating zone method or a distillation method is generally known. Among such metal simple substances, there are many elements which are easy to purify as compared with metal compounds. Accordingly, a method of using required metal element simple substances as starting materials for the production of a phosphor, alloying them and producing a phosphor from the obtained alloy for production of a phosphor, is superior to a method of using metal compounds as raw materials, in that it is easy to obtain raw materials having a high purity. Further, also from the viewpoint of uniform dispersion of activation elements in the crystal lattice, it is preferred that the raw materials for constituting elements are metal simple substances, whereby they may be melted and alloyed, so that the activation elements can easily and uniformly be dispersed.

From the above viewpoint, by using, as a raw material, an alloy for production of a phosphor, containing at least a part of metal elements constituting the desired phosphor, preferably an alloy for production of a phosphor containing all metal elements constituting the desired phosphor, and producing a phosphor by nitriding the alloy, it is possible to industrially produce a phosphor having a high performance.

[2-1-1. Composition of Alloy]

The alloy for production of a phosphor may be an alloy of any composition so long as it is an alloy containing at least elements of R, A and Si in the above formula [I]. Here, preferred types of such elements constituting the alloy are as mentioned above.

Preferred as the alloy for production of a phosphor is one having a composition represented by the following formula [II]:

wherein R is at least one rare earth element selected from the group consisting of La, Gd, Lu, Y and Sc, M is at least one metal element selected from the group consisting of Ce, Eu, Mn, Yb, Pr and Tb, A is at least one bivalent metal element selected from the group consisting of Ba, Sr, Ca, Mg and Zn, and a, b, c and e represent the numerical values within the following ranges, respectively: $1 \leq a \leq 4$, $0 \leq b \leq 1$, $0 < c \leq 4$ and $0 \leq e \leq 2$.

Here, preferred types of elements R, M and A in the formula [II] are the same as in the above formula [I]. With a view to suppressing cation defects, the value of a+b+c is more preferably at least the value of 3+e/2. The alloy raw material of the formula [II] is most preferably a single phase, but may not necessarily be a single phase, i.e. it is possible to use one wherein to a main phase being a single phase, another phase is intimately mixed, for example, in a μm order or a 100 nm order. For example, in the case of $Ca_{0.45}La_{2.6}Ce_{0.1}Si_6$, one wherein to a $Ca_{0.3}La_{2.6}Ce_{0.1}Si_6$ single phase, $Ca_{0.15}$ is intimately mixed may be mentioned as an example.

[2-1-2. Particle Diameter of Alloy]

The average particle diameter (weight median diameter $D_{50}$) of an alloy for production of a phosphor is usually at least 1 μm, preferably at least 2 μm, more preferably at least 3 μm and usually at most 8 μm, preferably at most 7.5 μm, more preferably at most 7 μm. Even if the alloy contains a non-uniform portion, homogenization is carried out by this pulverization step macroscopically, but microscopically, the pulverized particles having different compositions cannot be regarded as a preferred state. Therefore, it is desired that the entire alloy is homogeneous.

[2-1-3. Contents of Carbon and Oxygen in the Alloy]

As impurities contained in the alloy, various elements are possible. It is preferred to use, as the raw material for the production of a phosphor, an alloy wherein the carbon content is less than 1 wt %. The upper limit is usually at most 1 wt %, preferably at most 0.3%, most preferably at most 0.1%, further preferably at most 0.01%. The lower limit is not particularly limited. However, for the stability of the quality for the production, a certain amount of at most 0.01% may be added.

In a case where in the step of converting the alloy containing the above-mentioned amount of carbon to a phosphor, firing is carried out in an atmosphere gas of hydrogen-containing nitrogen, the amount of carbon in the phosphor will be substantially reduced. It is considered that the carbon in the alloy is reacted with hydrogen to form a hydrocarbon.

Further, oxygen in the alloy is likely to be included in various steps among steps for producing the alloy. It is preferred to use, as the raw material for production of a phosphor, an alloy wherein the oxygen content is less than 2 wt %. From the viewpoint of the luminance, the upper limit is usually less than 2 wt %, preferably at most 0.6%, more preferably at most 0.1%. If it is too much, the oxygen contamination amount during the firing tends to be large, whereby it tends to be difficult to obtain the phosphor of the present invention having high luminance. The lower limit is not particularly limited.

In a case where hydrogen-containing nitrogen is used as the atmosphere gas in the step of converting the alloy containing the above amount of oxygen to a phosphor, the oxygen content in the phosphor may be maintained or reduced. Usually, via a firing step, the amount of oxygen in the phosphor is likely to increase over the oxygen content in the starting material in many cases, but it is considered that by conversion to CO and/or $H_2O$, the amount of oxygen in the phosphor is maintained or reduced. Here, the contents of carbon and oxygen in the alloy can be measured by the methods shown in the section of "EXAMPLES" given hereinafter.

[2-2. Preparation of Alloy for Production of Phosphor]

The alloy for production of a phosphor having the above-described composition and physical properties can be prepared as follows. Firstly, an alloy for production of a phosphor to be a raw material for a phosphor is prepared. At the time of preparing the alloy for production of a phosphor, usually, starting materials such as metal simple substances, metal alloys, etc. (hereinafter sometimes referred to as "raw material metals") are melted to obtain an alloy for production of a phosphor. In such a case, there is no limitation to the melting method, and a known melting method such as an arc melting method or a high frequency induction heating method (a high frequency melting method) may, for example, be used.

[2-2-1. Types of Raw Material Metals]

As the raw material metals, metals, alloys of such metals, etc. may be used. Further, the raw material metals corresponding to elements which the phosphor of the present invention contains, may be in an optional combination and ratio, taking into consideration a loss such as vaporization of a part of components in the after-mentioned melting step. However, among the raw material metals, as the raw material metals of metal element M being an activation element (such as the raw material metals corresponding to Eu, Ce, etc.), it is preferred to use Eu metal or Ce metal, since such raw materials are readily available.

The raw materials for the alloy for production of the phosphor of the present invention, other than the formula [II], include, for example, $LaSi_2$, $Ce_xLa_{1-x}Si_2$ ($0<x<1$), LaSi, $La_3Si_2$, $La_5Si_3$, $Ca_{24}Si_{60}$, $Ca_{28}Si_{60}$, $CaSi_2$, $Ca_{31}Si_{60}$, $Ca_{14}Si_{19}$, $Ca_3Si_4$, CaSi, $Ca_5Si_3$, $Ca_2Si$, $Ca_xLa_{3-x}Si_6$ ($0<x<3$), $Ce_yCa_xLa_{3-x-y}Si_6$ ($0<x<3$, $0<y<3$), $Ca_7Si$, $Ca_2Si$, $Ca_5Si_3$, CaSi, $Ca_2Si_2$, $Ca_{14}Si_{19}$, $Ca_3Si_4$, SrSi, $SrSi_2$, $Sr_4Si_7$, $Sr_5Si_3$, $Sr_7Si$, etc. Further, an alloy containing Si, aluminum and an alkaline earth metal may, for example, be one having alloy phases of e.g. $Ca(Si_{1-x}Al_x)_2$, $Sr(Si_{1-x}Al_x)_2$, $Ba(Si_{1-x}Al_x)_2$ and $Ca_{1-x}Sr_x(Si_{1-y}Al_y)_2$ suitably combined. Particularly, LaSi, $La_3Si_2$, $La_5Si_3$ and an alloy having a part of its La position substituted by Ce, are preferred. Among them, LaSi is preferred, since the ratio of La is low, whereby the safety in handling is high. In such a case, in order to obtain $La_3Si_6N_{11}$ crystal, $Si_3N_4$ tends to be deficient, and it is necessary to heat the raw material having a silicon source added, to prepare the phosphor. As such a silicon source, $Si_3N_4$ is preferred.

[2-2-2. Purity of Raw Material Metals]

The purity of metals to be used as raw material metals for the alloy for production of a phosphor should better be high. Specifically, from the viewpoint of the emission characteristics of the phosphor to be prepared, as a raw material metal corresponding to activation element M, it is preferred to use a metal purified to such an extent that impurities are usually at most 0.1 mol %, preferably at most 0.01 mol %. Further, also a metal to be used as a raw material metal for an element other than activation element M preferably has an impurity concentration of at most 0.1 mol %, more preferably at most 0.01 mol %, for the same reason as in the case of activation element M. For example, when at least one member selected from the group consisting of Fe, Ni and Co is contained as an impurity, the content of each impurity element is usually at most 500 ppm, preferably at most 100 ppm.

[2-2-3. Shape of Raw Material Metals]

There is no particularly limitation to the shape of raw material metals, but usually, granular or massive ones having a diameter of from a few mm to a few tens mm are used. Here, ones having a diameter of at least 10 mm are referred to as massive, and ones having a diameter less than 10 mm are referred to as granular.

Further, raw material metals corresponding to alkaline earth metal elements are not concerned about their shapes such as granular or massive shapes, and a proper shape is preferably selected depending upon the chemical nature of the particular raw material metals. For example, Ca is stable and useful in the atmospheric air in either granular or massive form, while Sr is chemically more active, and therefore it is preferred to use a massive raw material.

Further, a metal element to be lost by its evaporation during the melting or its reaction with a crucible material, may be preliminarily excessively weighed and used, as the case requires.

[2-2-4. Melting of Raw Material Metals]

After weighing raw material metals, such raw material metals are melted and alloyed to produce an alloy for production of a phosphor (melting step). At the time of melting the raw material metals, there is the following problem, particularly in the case of producing an alloy for production of a phosphor containing Si, rare earth element and an alkaline earth element.

The melting point of Si is 1,410° C., which is the same level as the boiling point of an alkaline earth metal (e.g. the boiling point of Ca is 1,494° C., the boiling point of Sr is 1,350° C. and the boiling-point of Ba is 1,537° C.). Therefore, there has been a problem such that the alkaline earth metal undergoes evaporation during the melting, whereby an alloy having the desired composition cannot be obtained.

Therefore, in the present invention, the composition of the alloy to be formed is controlled by utilizing the nature of an eutectic point composition of Si and rare earth element alloy, e.g. in the case of a Si—La type alloy, the eutectic point temperature of $LaSi_2$ is 1,205° C. which is lower than the melting point of Si simple substance. That is, it has been found possible to obtain an alloy having a prescribed composition by firstly arranging so that an alloy with a composition having a melting point close to the eutectic point will be formed first, for example, by arranging the charging so that $(La, Ca)Si_2$ will be formed first and then, the rest of metals will be melted therein, and thus, the above problem has been solved. Further, there will be such an effect that the purity of the obtainable alloy will be improved, and the properties of a phosphor prepared by using it as the raw material will be remarkably improved.

The obtainable alloy for production of a phosphor is one containing at least elements of R, A and Si among metal elements constituting the phosphor of the present invention, and is preferably one having a composition represented by the above formula [II]. Further, even in a case where one alloy for production of a phosphor does not contain all of the metal elements to constitute the phosphor of the present invention, it is possible to produce the phosphor of the present invention by using two or more alloys for production of phosphors and/or other raw materials (such as metals) in combination in the subsequent firing step.

There is no particularly limitation to the method for melting raw material metals, and an optional method may be adopted. For example, it is possible to employ a resistance heating method, an electron beam method, an arc melting method, a high frequency induction heating method (high frequency melting method) or the like. Further, two or more of such methods may be used in an optional combination for the melting.

Further, the material for a crucible useful for the melting may, for example, be alumina, calcia, graphite, molybdenum, boron nitride or iridium. Further, to prevent inclusion of the crucible material, it is possible to employ a high frequency melting method employing a water-cooled copper crucible (so-called scull melting method or cold crucible melting method). This method is very preferable as a method for producing an alloy for the present phosphor, of which the melting point exceeds 1,500° C.

However, in the case of producing an alloy for production of a phosphor containing metal elements which cannot be melted simultaneously, such as Si and alkaline earth metal elements, the alloy for production of a phosphor may be produced by producing a matrix alloy and then mixing other metal raw materials. For a detailed method in such a case, WO2006/106948 may be referred to.

In the case of melting any raw material metal, with respect to the specific temperature condition and melting time at the time of melting the raw material metal, a suitable temperature and time may be set depending upon the raw material metal to be used. Further, the atmosphere during the melting of the raw material metal is optional so long as an alloy for the production of a phosphor is thereby obtainable, but an inert gas atmosphere is preferred, and an argon atmosphere is particularly preferred. Here, one of inert gases may be used alone, or two or more of them may be used in an optional combination and ratio. Further, the pressure during the melting of the raw material metals is optional so long as an alloy for production of a phosphor can thereby be obtainable, but it is preferably at least $1\times10^3$ Pa and preferably at most $1\times10^5$ Pa. Further, also from the viewpoint of safety, it is preferred to carry out the melting under atmospheric pressure or lower.

[2-2-5. Casting of Melt]

By the above-described melting of raw material metals, an alloy for production of a phosphor is obtained. This alloy for production of a phosphor is obtained usually as an alloy melt, however, there are many technical problems to directly produce a phosphor from such an alloy melt. Therefore, it is preferred to obtain a solidified product (hereinafter sometimes referred to as an "alloy lump") via a casting step wherein the alloy melt is cast in a mold.

However, there may be a case where in this casting step, segregation results by a cooling speed of molten metals, whereby the alloy for production of a phosphor having a uniform composition in a molten state is likely to have a deviation in the distribution of the composition. Accordingly, the cooling speed should better be fast. Further, the mold is preferably made of a material having good thermal conductivity such as copper, and is preferably in a shape to readily release the heat. Further, as the case requires, it is also preferred to cool the mold by such a means as cooling with water.

As such an idea, it is, for example, preferred that by using a mold having a large bottom surface to the thickness, the melt is solidified as quickly as possible after being poured into the mold.

Further, the degree of such deviation varies depending upon the composition of the alloy for production of a phosphor, and it is preferred that by sampling samples from several portions of the obtained solidified product and carrying out an analysis of the composition by means of a necessary analyzing means such as an ICP emission spectroscopic analysis, the cooling speed required to prevent the segregation is determined.

Further, the atmosphere during the casting is preferably an inert gas atmosphere, particularly preferably an argon atmosphere. At that time, one of such inert gases may be used alone, or two or more of them may be used in an optional combination and ratio.

[2-2-6. Pulverization of Alloy Lumps]

The alloy for production of a phosphor may be in the form of lumps, or powder. However, in the form of lumps, the reaction to form a phosphor tends to hardly proceed, and therefore, it is preferred to pulverize them to a predetermined particle diameter, prior to the firing. Therefore, the alloy lumps obtained by the casting are pulverized (pulverization step) to obtain a powder of an alloy for production of a phosphor (hereinafter sometimes referred to as an "alloy powder") having the desired particle diameter and particle size distribution.

Here, from the viewpoint of the production of a phosphor having high luminance and safe raw materials, if the particle diameter of the alloy is too large, nitriding tends to hardly take place, whereby the luminance of the obtainable phosphor tends to be low. Further, if it is too small, in the pulverization step of the powder, a danger of ignition of the powder increases due to leakage of the powder into the atmospheric air or leakage of the atmospheric air to the powder, and at the same time, deterioration of the luminance is likely to occur due to an increase of the oxygen contamination amount.

The pulverization method is not particularly limited, and for example, the pulverization can be carried out by a dry method or a wet method using an organic solvent such as ethylene glycol, hexane or acetone.

Now, the method will be described in detail with reference to the dry method. This pulverization step may be carried out dividedly in a plurality of steps such as a roughly pulverizing step, an intermediately pulverizing step and a finely pulverizing step, as the case requires. In such a case, in all pulverization steps, the same apparatus may be used for pulverization, but the apparatus may be changed depending upon the particular step.

Here, the roughly pulverizing step is a step of pulverization so that about 90 wt % of the alloy powder will have a particle diameter of at most 1 cm, and for example, a pulverization apparatus such as a jaw crusher, a gyratory crusher, a crushing roll or an impact crusher may be used. The intermediately crushing step is a step of pulverization so that about 90 wt % of the alloy powder will have a particle diameter of at most 1 mm, and for example, a pulverization apparatus such as a corn crusher, a crushing roll, a hammer mill or a disk mill may, for example, be used. The finely pulverizing step is a step of pulverization so that the alloy powder will have the aftermentioned weight median diameter, and for example, a pulverizing apparatus such as a ball mill, a tube mill, a rod mill, a roller mill, a stamp mill, an edge runner, a vibration mill or a jet mill may be used.

With a view to preventing inclusion of impurities, in the final pulverization step, it is preferred to use a jet mill. To use a jet mill, the alloy lumps are preferably preliminarily pulverized to a particle diameter of at most about 2 mm. In a jet mill, pulverization of particles is carried out by utilizing the expansion energy of a fluid jetted from the nozzle initial pressure to the atmospheric pressure, whereby it is possible to control the particle diameter by the pulverization pressure and to prevent inclusion of impurities. The pulverization pressure varies depending upon the apparatus, but it is usually at least 0.01 MPa, preferably at least 0.05 MPa, more preferably at least 0.1 MPa and usually at most 2 MPa, preferably at most 0.4 MPa, more preferably at most 0.3 MPa, by gauge pressure. If the gauge pressure is too low, the particle diameter of the obtainable particles is likely to be too large, and if it is too high, the particle diameter of the obtainable particles is likely to be small.

In any case, it is preferred to properly select the relation between the material of the pulverizer and the object to be pulverized so as to avoid inclusion of impurities such as iron during the pulverization step. For example, the portion in contact with the powder preferably has a ceramic lining applied, and among ceramics, alumina, silicon nitride, tungsten carbide or zirconia may, for example, be preferred. Here, they may be used alone, or two or more of them may be used in an optional combination and ratio.

In order to prevent oxidation of the alloy powder, it is preferred to carry out the pulverization step in an inert gas atmosphere. The type of the inert gas is not particularly limited, but usually, it is possible to use a single atmosphere of one gas among nitrogen, argon, helium, etc. or a mixed atmosphere of two or more such gases. Among them, nitrogen is particularly preferred from the viewpoint of the economical efficiency.

The oxygen concentration in the atmosphere is not particularly limited so long as oxidation of the alloy powder can be prevented, but it is usually at most 10 vol %, particularly preferably at most 5 vol %. Further, the lower limit of the oxygen concentration is usually about 10 ppm. It is considered that by adjusting the oxygen concentration to be within the specified range, an oxidized coating film will be formed on the surface of the alloy during the pulverization, whereby the powder will be stabilized. In a case where the pulverization step is carried out in an atmosphere wherein the oxygen concentration is higher than 5 vol %, it is possible that the powder dust will explode during the pulverization, and therefore, it is preferred to provide an equipment not to let such powder dust be formed.

Further, cooling may be applied, as the case requires, to prevent a temperature rise of the alloy powder during the pulverization step.

[2-2-7. Classification of Alloy Powder]

The alloy powder obtained as described above is preferably adjusted to have the desired weight median diameter $D_{50}$ and particle size distribution (classification step) by means of e.g. a sieving apparatus using a mesh such as a vibration screen or a shifter; an inertial classification apparatus such as an air separator; or a centrifugal separator such as a cyclone, and then subjected to the subsequent steps.

Here, in the adjustment of the particle size distribution, it is preferred that coarse particles are classified and recycled to the pulverizer, and it is more preferred that the classification and/or the recycling is continuous.

The classification step is also preferably carried out in an inert gas atmosphere. The type of the inert gas is not particularly limited, but usually, a single atmosphere of one gas among nitrogen, argon, helium, etc. or a mixed atmosphere of two or more such gases, is used and nitrogen is particularly preferred from the viewpoint of the economical efficiency. Further, the oxygen concentration in the inert gas atmosphere is preferably at most 10 vol %, particularly preferably at most 5 vol %.

[2-2-8. Preparation of the Alloy by Atomizing Method or the Like]

The alloy for production of a phosphor may be produced via the following steps (a) to (c), other than the production by the above-described method. It is thereby possible to obtain a powder of an alloy for production of a phosphor having an angle of repose of at most 45°. (a) Two or more among raw material metals corresponding to the metals constituting the phosphor are melted to prepare an alloy melt containing such elements (melting step). (b) The alloy melt is atomized in an inert gas (atomizing step). (c) The atomized alloy melt is solidified to obtain an alloy powder (solidification step).

That is, this method is one wherein the alloy melt is atomized in a gas, followed by solidification to obtain a powder. The above atomizing step (b) and the solidification step (c) are preferably carried out, for example, by a method of spraying the alloy melt, a method of quenching by means of a roll or a gas stream to finely form the alloy melt into a ribbon, or an atomizing method to obtain a powder. Among them, it is preferred to employ an atomizing method. Specifically, a known method disclosed in WO2007/135975 may be employed by suitable modification as the case requires.

[2-3. Firing Step]

The obtained alloy for production of a phosphor is fired in the presence of flux and nitrided to obtain a phosphor of the present invention. Here, the firing is preferably carried out in a hydrogen-containing nitrogen gas atmosphere, as described hereinafter.

[2-3-1. Mixing of Raw Materials]

In a case where the composition of metal elements contained in the alloy for production of a phosphor agrees to the composition of metal elements contained in the crystal phase represented by the formula [I], only the alloy for production of a phosphor may be fired. On the other hand, in a case where they do not agree, the alloy for production of a phosphor is mixed with an alloy for production of a phosphor, metal simple substances, metal compounds, etc. having another composition to adjust so that the composition of metal elements contained in the raw materials will agree to the composition of metal elements contained in the crystal phase represented by the formula [I], and then the firing is carried out.

Here, even in a case where the composition of metal elements contained in the alloy for production of a phosphor agrees to the composition of metal elements contained in the crystal phase represented by the formula [I], if a nitride or oxynitride (which may be a nitride or oxynitride containing an activation element of the phosphor of the present invention itself) is mixed to the alloy for production of a phosphor, it becomes possible to suppress the heat generation rate per unit volume during the nitriding thereby to let the nitriding reaction proceed smoothly, as disclosed in WO2007/135975, whereby it becomes possible to obtain a phosphor having high properties at a high productivity. For the production of the phosphor of the present invention, the nitriding treatment may be carried out in the presence of a suitable nitride or oxynitride with reference to WO2007/135975 with suitable modifications as the case requires.

At that time, there is no particular limitation to metal compounds which may be used as mixed to the alloy for production of a phosphor, and for example, a nitride, an oxide, a hydroxide, a carbonate, a nitrate, a sulfate, an oxalate, a carboxylate, a halide, etc. may be mentioned. Specific types may suitably be selected among these metal compounds in consideration of e.g. low generation of $NO_x$ or $SO_x$ during the firing or the reactivity to the desired product. However, from such a viewpoint that the phosphor of the present invention is a nitrogen-containing phosphor, it is preferred to use a nitride and/or oxynitride. Among them, it is particularly preferred to employ a nitride, since it also plays a role as a nitrogen source.

Specific examples of the nitride and oxynitride include nitrides of elements constituting the phosphor, such as AlN, $Si_3N_4$, $Ca_3N_2$, $Sr_3N_2$, EuN, etc., and composite nitrides of elements constituting the phosphor, such as $CaAlSiN_3$, $(Sr,Ca)AlSiN_3$, $(Sr,Ca)_2Si_5N_8$, $CaSiN_2$, $SrSiN_2$, $BaSi_4N_7$, etc. Further, the above nitrides may contain a very small amount of oxygen. In the nitrides, the ratio (molar ratio) of oxygen/(oxygen+nitrogen) is optional so long as the phosphor of the present invention is thereby obtainable, but it is usually at most 5%, preferably at most 1%, more preferably at most 0.5%, further preferably at most 0.3%, particularly preferably at most 0.2%. If the ratio of oxygen in a nitride is too much, the luminance is likely to be low.

The weight median diameter $D_{50}$ of a metal compound is not particularly limited so long as there is no trouble in mixing with other raw materials. However, it is preferably readily mixed with other raw materials, and for example, it is preferably at the same level as the alloy powder. The specific value for the weight median diameter $D_{50}$ of a metal compound is optional so long as the phosphor can be obtained, but it is preferably at most 200 μm, more preferably at most 100 μm, particularly preferably at most 80 μm, further preferably at most 60 μm and preferably at least 0.1 μm, more preferably at least 0.5 μm. Further, each of the above-mentioned alloy for production of a phosphor, metal simple substance, metal compound, etc. may be used alone, or two or more of them may be used in an optional combination and ratio.

It is preferred that an alloy for production of a phosphor, containing all of metal elements to constitute a phosphor, is prepared, and a phosphor is produced by firing such an alloy, whereby it is possible to simply produce a good phosphor in a small number of steps. Further, in a conventional production method wherein an alloy is not used, there has been a case where a phosphor having a desired element composition ratio cannot be obtained as the compositional ratio of the metal elements contained in the raw materials has changed by e.g. the firing. Whereas, by using an alloy for production of a phosphor, it is possible to simply obtain a phosphor having the desired compositional ratio simply by charging metal elements along the stoichiometry of the desired phosphor.

[2-3-2. Flux]

In the firing step, it is preferred that a flux is permitted to coexist in the reaction system with a view to letting good crystals grow.

The type of the flux is not particularly limited, and it may, for example, be ammonium halide such as $NH_4Cl$ or $NH_4F \cdot HF$; an alkali metal carbonate such as $NaCO_3$ or $LiCO_3$; an alkali metal halide such as LiCl, NaCl, KCl, CsCl, LiF, NaF, KF or CsF; an alkaline earth metal halide such as $CaCl_2$, $BaCl_2$, $SrCl_2$, $CaF_2$, $BaF_2$, $SrF_2$, $MgCl_2$ or $MgF_2$; an alkaline earth metal oxide such as BaO; boron oxide, boric acid or an alkali metal or alkaline earth metal borate compound such as $B_2O_3$, $H_3BO_3$ or $Na_2B_4O_7$; a phosphate compound such as $Li_3PO_4$ or $NH_4H_2PO_4$; an aluminum halide such as $AlF_3$; a zinc compound such as a zinc halide such as $ZnCl_2$ or $ZnF_2$, or zinc oxide, a compound of a Group 15 element of the Periodic Table, such as $Bi_2O_3$ or a nitride of an alkali metal, alkaline earth metal or Group 13 element, such as $Li_3N$, $Ca_3N_2$, $Sr_3N_2$, $Ba_3N_2$ or BN.

Further, the flux may, for example, be a halide of a rare earth element, such as $LaF_3$, $LaCl_3$, $GdF_3$, $GdCl_3$, $LuF_3$, $LuCl_3$, $YF_3$, $YCl_3$, $ScF_3$ or $ScCl_3$, or an oxide of a rare earth element, such as $La_2O_3$, $Gd_2O_3$, $Lu_2O_3$, $Y_2O_3$ or $Sc_2O_3$.

As the above flux, a halide is preferred, and specifically, a halide such as an alkali metal halide, an alkaline earth metal halide, a halide of Zn or a halide of a rare earth element, is preferred. Further, among halides, a fluoride or a chloride is preferred, and further preferred is a fluoride. Specifically, an alkali metal fluoride, an alkaline earth metal fluoride, $ZnF_2$ or a fluoride of a rare earth element, is preferred, and particularly preferred is a rare earth metal fluoride or an alkaline earth metal fluoride.

Here, an anhydride should better be used for one having a deliquescent nature among the above fluxes. Further, one of the fluxes may be used alone, or two or more of them may be used in an optional combination and ratio.

As a further preferred flux, $MgF_2$ may be mentioned, but other than that, $CeF_3$, $LaF_3$, $YF_3$ or $GdF_3$ may also be suitably used. Among them, $YF_3$, $GdF_3$, etc. have an effect to change the chromaticity coordinate (x,y) of the emission color. In a case where $CeF_3$ is used, Ce being a light emission center may not be contained in the raw material (an alloy or a mixture of an alloy with a nitride) constituting the matrix crystal, such being desirable. When Ce is incorporated in the alloy, it may be localized by e.g. segregation, since its amount is small. Accordingly, from the viewpoint of the stability for the production, it is particularly preferred to use $CeF_3$.

The amount of the flux to be used varies depending on the type of the raw material or the material for the flux and is optional, but it is usually within a range of at least 0.01 wt %, preferably at least 0.1 wt %, more preferably at least 0.3 wt % and usually at most 20 wt %, preferably at most 10 wt %, based on the entire raw material. If the amount of the flux is too small, the effect of the flux may not be obtained, and if the amount of the flux is too much, the effect of the flux is likely to be saturated, or it is likely to be included in the matrix crystal to change the emission color or to bring about deterioration of the luminance, or to bring about deterioration of the firing furnace.

[2-3-3. Heating Conditions]

The alloy powder thus obtained and other compounds added, as the case requires, are usually filled in a crucible or a container such as a tray, which is then set in a heating furnace capable of controlling the atmosphere. At that time, as the material for the firing container to be used here, boron nitride, silicon nitride, carbon, aluminum nitride, molybdenum or tungsten may, for example, be mentioned, since the reactivity with the metal compounds is low as the material for the container. Among them, molybdenum or boron nitride is preferred, since it is excellent in corrosion resistance. Further, one of such materials may be used alone, or two or more of them may be used in an optional combination and ratio.

The shape of the firing container to be used here is optional. For example, the bottom surface of the firing container may be no angular shape such as circular or oval, or a polygonal shape such as triangular or square, and the height of the firing container is also optional so long as acceptable in the heating furnace and may be low or high. It is preferred to select a shape which presents a good heat releasing property.

And, by heating the alloy powder, the phosphor of the present invention can be obtained. Here, the alloy powder is preferably fired in a state where it is held at a volume filling rate of at most 40%. Here, the volume filling rate can be obtained by (bulk density of the mixed powder)/(theoretical density of the mixed powder)×100[%].

The firing container filled with such a raw material for a phosphor is set in a firing apparatus (hereinafter sometimes referred to as "a heating furnace"). The firing apparatus to be used here is optional so long as the effects of the present invention can be obtained, but an apparatus capable of controlling the atmosphere in the apparatus is preferred, and an apparatus capable of controlling also the pressure is further preferred. For example, a hot isostatic press apparatus (HIP) or a resistance-heating type vacuum pressure atmosphere thermal treatment furnace is preferred. Further, it is preferred that before initiation of the heating, a gas containing nitrogen is permitted to flow in the firing apparatus to sufficiently replace the interior of the system with this nitrogen-containing gas. As the case requires, after evacuating the interior of the system, the nitrogen-containing gas may be introduced.

As the nitrogen-containing gas to be used for the nitriding treatment, a gas containing nitrogen element such as nitrogen, ammonia or a mixed gas of nitrogen and hydrogen, may, for example, be mentioned. Further, one of such nitrogen-containing gases may be used alone, or two or more of them may be used in an optional combination and ratio. Among them, a nitrogen gas containing hydrogen (hydrogen-containing nitrogen gas) is preferred as the nitrogen-containing gas. Here, the mixing proportion of hydrogen in the hydrogen-containing nitrogen gas is preferably at most 4 vol %, since this is outside the explosion limit and thus is safe.

The first effective reason as to why it was possible to realize a nitride yellow phosphor having high luminance and a specific object color by employing an alloy as the raw material, and the hydrogen gas-containing nitrogen gas, is considered to be as follows. That is, in order for the metal to be nitrided, nitrogen molecules are required to be dissociated, and it is considered that hydrogen radicals are formed on the alloy surface, and they assist the dissociation of the nitrogen molecules to accelerate nitriding of the alloy by dissociated nitrogen. It is known that when nitrogen atoms in a gas phase are dissociated and adsorbed on the surface of a metal such as a transition metal, H radicals assist such dissociation and adsorption, whereby NHx species having two atomic molecules of nitrogen dissociated, will be readily formed on the surface.

Further, as the second reason as to why it was possible to realize the high luminance and the specific object color, it is considered that hydrogen in the gas phase is reacted with a small amount of carbon during the firing to suppress the amount of carbon in the phosphor thereby to suppress deterioration of the luminance due to the coexisting carbon. After the firing under $N_2$—$H_2$, it was confirmed that the amount of carbon in the solid was reduced to a half. Thus, it is considered that in a case where the alloy is used as the raw material, coexistence of hydrogen atoms in addition to nitrogen atoms presents good effects to remove carbon and to assist good nitriding with less nitrogen deficiency. In that sense, it is also preferred to use ammonia gas containing both nitrogen atoms and hydrogen atoms, so long as gas tightness of the firing furnace is ensured.

The oxygen concentration in the system is influential over the oxygen content of the phosphor to be produced, and if the content is too high, high luminance tends to be hardly obtainable. Accordingly, the oxygen concentration in the atmosphere for nitriding treatment should better be low, and it is usually at most 0.1 vol %, preferably at most 100 ppm, more preferably at most 10 ppm, further preferably at most 5 ppm. Further, as the case requires, the oxygen concentration may be lowered by introducing an oxygen getter such as carbon or molybdenum into the heating portion in the system. Here, one of oxygen getters may be used alone, or two or more of them may be used in an optional combination and ratio.

The nitriding treatment is carried out by heating the phosphor raw material in a state where the hydrogen-containing nitrogen gas is filled or is permitted to flow, and the pressure at that time may be slightly lower than the atmospheric pressure, or equal or higher than the atmospheric pressure. However, to prevent inclusion of oxygen in the atmospheric air, the pressure is preferably at least the atmospheric pressure. If the pressure is lower than the atmospheric pressure, if the air tightness of the heating furnace is poor, a large amount of oxygen will be included, whereby it may be difficult to obtain a phosphor having good properties. The pressure of the hydrogen-containing nitrogen gas is preferably at least 0.1 MPa (at least ordinary pressure) by gauge pressure. Otherwise, it is also possible to carry out the heating under a high pressure of at least 20 MPa. The pressure is preferably at most 200 MPa. Thereafter, a gas containing nitrogen is permitted to flow to sufficiently replace the inside of the system with this gas. As the case requires, after evacuating the inside of the system, the gas may be introduced.

By the way, the nitriding reaction of a metal is usually an exothermic reaction. Accordingly, during the production of a phosphor by an alloying method, it is possible that due to a reaction heat discharged abruptly, the alloy is re-melted, and the surface area decreases. If the surface area decreases like this, the reaction between the nitrogen gas and the alloy may be delayed. For this reason, in the alloying method, it is preferred to maintain the reaction rate at which the alloy will not be melted, so that a high performance phosphor can constantly be produced. Particularly, it is preferred to carry out the firing by raising the temperature at a low rate of at most 1.5° C./min at least in a temperature region of the rising of the exothermic peak in the firing temperature region of from 1,150 to 1,400° C. where the heat generation of the nitriding is vigorous. The upper limit in the temperature-raising rate is usually at most 1.5° C./min, preferably at most 0.5° C./min, more preferably at most 0.1° C./min. Further, the lower limit is not particularly limited and may be determined from the economical viewpoint for industrial production. Here, the exothermic peak is an exothermic peak obtainable by TG-DTA (thermogravimetry/differential thermal analysis).

By this method, it is possible to suppress abrupt generation of the nitriding heat of the alloy and it is possible to suppress a local temperature rise and to obtain a good phosphor, and at the same time, by setting a high temperature raising rate in another temperature region where no nitriding heat is generated, it is possible to accomplish efficient production of a phosphor wherein the overall firing time is shortened.

Further, the heating temperature varies also depending upon e.g. the composition of the alloy for production of a phosphor, but it is usually at least 1,000° C. and at most 1,800° C., more preferably at least 1,400° C. and at most 1,700° C. Here, the temperature means the temperature in the furnace during the heat treatment, i.e. the set temperature of the firing apparatus.

In a case where a phosphor is prepared by nitriding an alloy, heretofore, no flux was added at the stage of nitriding the alloy, and after nitriding the alloy, particles were grown in the presence of a flux at the time of the second firing. Advantages of the nitriding the alloy in the presence of a flux in the present invention will be described. Firstly, this nitride phosphor easily loses luminance if oxygen is included during the preparation, but by limiting the firing to once, it is possible to prevent inclusion of oxygen by oxidation of an instable byproduct due to contact with the atmospheric air. Secondly, melting or partial evaporation of the flux during the firing will bring about the effect to reduce the nitriding heat of the alloy thereby to suppress a local temperature rise and contribute to the synthesis of good phosphor particles. Thirdly, crystal growth will start in the presence of the flux from the nitrided portion, whereby efficient crystal growth will be accomplished, such being advantageous for high luminance.

The heating time (retention time at the maximum temperature) for the nitriding treatment may be a time required for the reaction between the phosphor raw material and nitrogen, and it is usually at least 1 minute, preferably at least 10 minutes, more preferably at least 30 minutes, further preferably at least 60 minutes. If the heating time is shorter than 1 minute, the nitriding reaction may not be completed, and a phosphor having good properties may not be obtained. Here, the upper limit for the heating time is determined from the viewpoint of the production efficiency, and it is usually at most 50 hours, preferably at most 24 hours.

In the production method of the present invention, as the case requires, the alloy for production of a phosphor may preliminarily be nitrided (primary nitriding), and then, the above-described nitriding treatment may be carried out. Specifically, the preliminary nitriding may be carried out by heating the alloy for production of a phosphor in a nitrogen-containing atmosphere for a prescribed time in a prescribed temperature region. By introducing such a primary nitriding step, it becomes possible to control the reactivity between the alloy and nitrogen in the subsequent nitriding treatment, and it is possible to industrially facilitate the production of the phosphor from the alloy.

Further, the nitriding treatment may be carried out repeatedly in a plurality of times, as the case requires. In such a case, the conditions for the first firing (primary firing) and the firing conditions for the second firing (secondary firing) and subsequent firings are as described above, respectively. The conditions for the second and subsequent firings may be set to be the same or different from the conditions for the primary firing. By applying the nitriding treatment to the phosphor raw material in such a manner, it is possible to obtain the phosphor of the present invention wherein a nitride or oxynitride is a matrix.

[2-4. Post Treatments]

In the production method of the present invention, in addition to the above-described steps, other steps may be carried out as the case requires. For example, after the above-described firing step, a pulverization step, a cleaning step, a classification step, a surface treatment step, a drying step, etc. may be carried out, as the case requires.

[2-4-1. Pulverization Step]

In the pulverization, a pulverizer such as a hammer mill, a roll mill, a ball mill, a jet mill, a ribbon blender, a V-type blender or a Henschel mixer, or pulverization by means of a mortar and a muddler may, for example, be used. At that time, in order to suppress destruction of the formed phosphor crystals and to proceed with treatment for the purpose of e.g. disintegrating secondary particles, it is preferred that into a container made of e.g. alumina, silicon nitride, $ZrO_2$ or glass, balls made of the same material as such or made of iron-core polyurethane are put, and ball mill treatment is carried out for from 10 minutes to 24 hours. In such a case, a dispersing agent such as an alkali phosphate of an organic acid or hexamethaphosphoric acid may be used in an amount of from 0.05 wt % to 2 wt %.

[2-4-2. Cleaning Step]

The cleaning step may be carried out, for example, by water such as deionized water, an organic solvent such as ethanol, or an alkaline aqueous solution such as aqueous ammonia. For the purpose of removing an impurity phase deposited on the surface of the phosphor, such as to remove the used flux, thereby to improve the emission properties, it is also possible to use an acidic aqueous solution containing an inorganic acid such as hydrochloric acid, nitric acid, sulfuric acid, aquaregia or a mixture of hydrofluoric acid and sulfuric acid, or an organic acid such as acetic acid.

For the purpose of removing an amorphous content being an impurity phase, an acidic aqueous solution containing e.g. hydrofluoric acid, ammonium fluoride ($NH_4F$), ammonium hydrogen fluoride ($NH_4HF_2$), sodium hydrogen fluoride or potassium hydrogen fluoride, may be used. Among them, a $NH_4HF_2$ aqueous solution is preferred. The concentration of the $NH_4HF_2$ aqueous solution is usually from 1 wt % to 30 wt %, preferably from 5 wt % to 25 wt %. Further, as the case requires, these reagents may suitably be mixed for use.

Further, after the cleaning treatment with an alkaline aqueous solution or an acidic aqueous solution, it is preferred to carry out further cleaning with water. By such a cleaning step, it is possible to improve the luminance, emission intensity, absorption efficiency and object color of the phosphor.

In an example of the cleaning step, a fired product after cleaning is stirred for 1 hour in a 10 wt % $NH_4HF_2$ aqueous solution in an amount 10 times by weight ratio, then dispersed in water and then left to stand still for 1 hours, so that cleaning is preferably carried out to such an extent that the pH of the supernatant will be neutral (about pH 5 to 9). If the above supernatant is deviated to basic or acidic, when it is mixed with the after-mentioned liquid medium or the like, it may adversely affect the liquid medium or the like.

In order to remove an impurity formed during the acid cleaning, preferred is a method of carrying out cleaning with a second liquid after cleaning with a first liquid, or a method of cleaning with a liquid having two or more substances mixed. As an example of the former, a process may be mentioned wherein cleaning with a $NH_4HF_2$ aqueous solution is followed by cleaning with hydrochloric acid and finally by washing with water. As an example of the latter, a process may be mentioned wherein cleaning with a mixed aqueous solution of $NH_4HF_2$ and $HNO_3$, is followed by washing with water.

The degree of the above cleaning may be represented by an electrical conductivity of the supernatant obtained by dispersing the phosphor after the cleaning in water 10 times by weight ratio, followed by being left to stand still for 1 hour. Such an electrical conductivity should better be low from the viewpoint of the emission properties, but when also the productivity is taken into consideration, it is preferred to carry out the cleaning treatment repeatedly until it becomes usually at most 10 mS/m, preferably at most 5 mS/m, more preferably at most 4 mS/m.

For the electrical conductivity, the phosphor is dispersed by stirring in water 10 times by weight for a prescribed time (e.g. 10 minutes), then left to stand still for 1 hour to let particles having heavier specific gravity than water be naturally precipitated, whereupon the electrical conductivity of the supernatant may be measured by means of e.g. an electrical conductivity meter "EC METE CM-30G" manufactured by DKK-TOA Corporation. Water to be used for the cleaning treatment or the measurement of the electrical conductivity is not particularly limited, but demineralized water or distilled water is preferred. One having low electrical conductivity is particularly preferred, and one having an electrical conductivity of usually at least 0.0064 mS/m and usually at most 1 mS/m, preferably at most 0.5 mS/m, is used. Here, the measurement of the electrical conductivity is carried out usually at room temperature (about 25° C.).

[2-4-3. Classification Step]

The classification step can be carried out, for example, by water sieving or by means of various classifiers such as various air flow classifiers or shaking sieves. It is particularly preferred to employ a dry system classification by means of nylon mesh, whereby it is possible to obtain a phosphor having good dispersibility having a weight median diameter of about 10 μm.

Further, it is preferred to use the dry system classification by means of nylon mesh and water sieving treatment in combination, whereby it is possible to obtain a phosphor having good dispersibility having a weight median diameter of about 20 μm. Here, water sieving or water sieving treatment is usually capable of dispersing phosphor particles at a concentration of from 0.1 wt % to 10 wt % in an aqueous medium. Further, in order to suppress modification of the phosphor, the pH of the aqueous medium is adjusted usually at least 4, preferably at least 5 and usually at most 9, preferably at most 8. Further, at the time of obtaining phosphor particles having the above-mentioned weight median diameter, in the water sieving and hydraulic elutriation treatment, it is preferred to carry out the sieving treatment in two steps e.g. particles of at most 50 μm are obtained, and then particles of at most 30 μm are obtained, from the viewpoint of the balance of the operation efficiency and yield. Further, it is preferred to carry out sieving treatment wherein the lower limit is usually at least 1 μm, preferably at least 5 μm.

[2-4-4. Surface Treatment Step]

At the time of producing a light-emitting device by using the phosphor of the present invention, in order to further improve the weather resistance such as moisture resistance or to improve the dispersibility in a resin in the after-mentioned phosphor-containing portion of the light-emitting device, surface treatment such as covering the surface of the phosphor with a different material, may be carried out as the case requires.

The material which may be present on the surface of the phosphor (hereinafter sometimes referred to as "a surface treatment material") may, for example, be an organic compound, an inorganic compound and a glass material.

The organic compound may, for example, be a heat meltable polymer such as an acrylic resin, a polycarbonate, a polyamide or a polyethylene, a latex, or a polyorganosiloxane.

The inorganic compound may, for example, be a metal oxide such as magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide or bismuth oxide, a metal nitride such as silicon nitride or aluminum nitride, an orthophosphate such as calcium phosphate, barium phosphate or strontium phosphate, a polyphosphate, or a combination of a phosphate of an alkali metal and/or alkaline earth metal with a calcium salt such as a combination of sodium phosphate with calcium nitrate.

The glass material may, for example, be a borosilicate, a phoshosilicate or an alkali metal silicate. One of such surface treatment materials may be used alone, or two or more of them may be used in an optional combination and ratio.

In the phosphor of the present invention obtainable by the above surface treatment, the presence of the surface treatment material is prerequisite, and the following may, for example, be mentioned as the embodiments. (i) An embodiment wherein the above surface treatment material constitutes a continuous film to cover the surface of the phosphor. (ii) An embodiment wherein the above surface treatment material is deposited on the surface of the phosphor in the form of numeral fine particles to cover the surface of the phosphor.

The deposition amount or covering amount of the surface treatment material on the surface of the phosphor is optional so long as the effects of the present invention are not substantially thereby impaired, but it is usually at least 0.1 wt %, preferably at least 1 wt %, more preferably at least 5 wt %, further preferably at least 10 wt % and usually at most 50 wt %, preferably at most 30 wt %, more preferably at most 20 wt %, based on the weight of the phosphor. If the amount of the surface treatment material is too much to the phosphor, the emission properties of the phosphor may be impaired, and if it is too little, the surface coverage tends to be incomplete, and no improvement of the moisture resistance or dispersibility may be observed.

The film thickness (layer thickness) of the surface treatment material to be formed by the surface treatment is optional so long as the effects of the present invention are not substantially thereby impaired, but it is usually at least 10 nm, preferably at least 50 nm and usually at most 2,000 nm, preferably at most 1,000 nm. If this film thickness of too thick, the emission properties of the phosphor may be impaired, and if it is too thin, the surface coverage tends to be inadequate, and no improvement of the moisture resistance or dispersibility may be observed.

The method for the surface treatment is not particularly limited, and for example, a coverage treatment method by the following metal oxide (silicon oxide) may be mentioned.

The phosphor of the present invention is mixed in an alcohol such as ethanol and stirred, and further, an alkaline aqueous solution such as aqueous ammonia is mixed and stirred. Then, a hydrolyzable alkyl silicic acid ester such as tetraethylorthosilicic acid is mixed and stirred. The obtained solution is left to stand for from 3 minutes to 60 minutes, whereupon the supernatant containing silicon oxide particles not deposited on the surface of the phosphor, is removed by e.g. a dropper. Then, the mixing of an alcohol, stirring, being left to stand still and removal of the supernatant, are repeated a few times, and then, via a reduced pressure drying step at from 120° C. to 150° C. for from 10 minutes to 5 hours, e.g. 2 hours, the surface treated phosphor is obtained.

As the method for surface treatment of the phosphor, a known method may further be used, such as a method of depositing e.g. spherical silicon oxide fine powder on the phosphor (JP-A-2-209989, JP-A-2-233794), a method of depositing a coating film of a silicon-type compound on the phosphor (JP-A-3-231987), a method of covering the surface of fine particles of a phosphor with fine particles of a polymer (JP-A-6-314593), a method of coating a phosphor with an organic material, an inorganic material and glass material, etc. (JP-A-2002-223008), a method of covering the surface of a phosphor by a chemical vapor phase reaction method (JP-A-2005-82788), or a method of depositing particles of a metal compound (JP-A-2006-28458).

[3. Phosphor-Containing Composition]

The phosphor-containing composition of the present invention comprises the phosphor of the present invention and a liquid medium. In a case where the phosphor of the present invention is used for an application to e.g. a light-emitting device, it is preferred to use it in a form dispersed in a liquid medium i.e. in a form of a phosphor-containing composition.

As the liquid medium useful for the phosphor-containing composition of the present invention, an optional one may be selected for use depending upon the purpose, so long as it shows a liquid nature under the desired application conditions and so long as the phosphor of the present invention can suitably be dispersed therein, and no undesirable reaction or the like will take place. Examples of such a liquid medium include a silicone resin, an epoxy resin, a polyvinyl resin, a polyethylene resin, a polypropylene resin, a polyester resin, etc. One of such liquid media may be used alone, or two or more of them may be used in an optional combination and ratio. Further, an organic solvent may be incorporated to the above liquid medium.

The amount of the liquid medium to be used may suitably be adjusted depending upon the particularly application, but usually, it is within a range of usually at least 3 wt %, preferably at least 5 wt % and usually at most 30 wt %, preferably at most 15 wt %, by the weight ratio of the liquid medium to the phosphor of the present invention. If the liquid medium is too little, the amount of luminescence from the phosphor-containing composition per volume tends to be low, and if it is too much, the dispersibility of the phosphor powder tends to be poor, and color unevenness tends to occur.

The phosphor-containing composition of the present invention may contain, in addition to the phosphor of the present invention and the liquid medium, other optional components depending upon the particular application, etc. As such other components, a diffusing agent, a thickener, a filler, an interfering agent, etc. may be mentioned. Specifically, a silica type fine powder such as aerosol, alumina or the like may be mentioned. One of such other components may be used alone, or two or more of them may be used in an optional combination and ratio.

In a case where the phosphor-containing composition is used as a constituting component of a light-emitting device (e.g. the after-descried second illuminant), the phosphor-containing composition can be made to be the above constituting component by curing the liquid medium.

[4. Light-Emitting Device]

Now, the light-emitting device of the present invention will be described. The light-emitting device of the present invention is a light-emitting device having a first illuminant and a second illuminant which emits visible light under irradiation with light from the first illuminant, wherein as the second illuminant, a first phosphor is contained, which contains at least one phosphor of the present invention.

[4-1. First Illuminant]

The first illuminant in the light-emitting device of the present invention is one which emits light to excite the after-described second illuminant. The emission wavelength of the first illuminant is not particularly limited so long as it is one which overlaps with the absorption wavelength of the after-described second illuminant, and illuminants within a wide emission wavelength region can be used. Further, as the first illuminant to be suitably used, for example, one having an emission peak within a wavelength range of from 300 nm to 420 nm, one having an emission peak within a wavelength range of from 420 to 450 nm, or one having an emission peak within a wavelength range of from 420 nm to 500 nm, may, for example, be mentioned.

Usually, an illuminant having an emission wavelength within a range of from a near ultraviolet region to a blue color region is used, and as a specific numerical value, an illuminant having an emission wavelength of usually at least 300 nm, preferably at least 330 nm and usually at most 500 nm, preferably at most 480 nm, is used.

As such a first illuminant, a semiconductor light-emitting element is usually employed. Specifically, a light-emitting diode (LED) or a semiconductor laser diode (hereinafter sometimes referred to simply as "LD") may, for example, be used.

Among them, as the first illuminant, a GaN type LED or LD using a GaN type compound semiconductor is preferred. Because, the GaN type LED or LD has a remarkably large emission output or external quantum efficiency as compared with a SiC type LED or the like which emits light in this region, and by combining it with the above phosphor, it is possible to obtain very bright emission of light with a very low electric power. For example, to a current load of 20 mA, the GaN type LED or LD usually has an emission intensity at a level of at least 100 times that of the SiC type. In the GaN type LED or LD, one having an $Al_XGa_YN$ light-emitting layer, a GaN light-emitting layer or an $In_XGa_YN$ light-emitting layer is preferred. In the GaN type LED, one having an $In_XGa_YN$ light-emitting layer is particularly preferred among them, since the emission intensity is very high. In the GaN type LD, one having a multiple quantum well structure of an $In_XGa_YN$ layer and a GaN layer is particularly preferred, since the emission intensity is very high.

Here, in the above description, the value of X+Y is usually a value within a range of from 0.8 to 1.2. In the GaN type LED, one having Zn or Si doped to such a light-emitting layer or one having no dopant is preferred for adjustment of the emission properties.

The GaN type LED is one comprising such a light-emitting layer, a p-layer, a n-layer, electrodes and an substrate, as basic structural elements, and one having a hetero structure wherein a light-emitting layer is sandwiched between n-type and p-type $Al_XGa_YN$ layers, GaN layers or $In_XGa_YN$ layers is preferred, since the luminous efficiency is high. Further, one having such a hetero structure made into a quantum well structure is more preferred, since the luminous efficiency is higher. Such LED or LD is already commercialized and readily available.

[4-2. Second Illuminant]

The second illuminant in the light-emitting device of the present invention is an illuminant which emits visible light under irradiation with light from the above-described first illuminant, and it contains a first phosphor (the phosphor of the present invention) and at the same time, may suitably contain a second phosphor depending upon the particular application, etc. Further, the second illuminant is, for example, constituted by dispersing the first and/or second phosphor in a sealing material.

[4-2-1. First Phosphor]

In the light-emitting device of the present invention, the second illuminant is one containing the above-described phosphor of the present invention, and contains, as a first phosphor, at least one phosphor of the present invention. Further, as the first phosphor, in addition to the phosphor of the present invention, a phosphor which emits fluorescence of the same color as the phosphor of the present invention (hereinafter sometimes referred to as "the same color concomitant phosphor") may be used at the same time. Usually, the phosphor of the present invention is a yellow phosphor, and as the first phosphor, together with the phosphor of the present invention, another type of yellow to orange phosphor (the same color concomitant phosphor) may be used in combination.

The same color concomitant phosphor may, for example, be $Y_3Al_5O_{12}$:Ce, or Eu-activated $M_x$ (Si, Al)$_{12}$(O, N)$_{16}$ (wherein M is a metal element such as Ca or Y, and x is one obtained by dividing the number of moles of the oxygen atom by the average valency of M, and the number of moles of the oxygen atom is usually larger than 0 and at most 4.3). Here, one of these may be used alone, or two or more of them may be used in an optional combination and ratio.

The emission peak wavelength $\lambda_p$ (nm) of the same color concomitant phosphor is not particularly limited, but it is within a wavelength range of usually at least 500 nm, preferably at least 520 nm, and usually at most 650 nm, preferably at most 630 nm. If the emission peak wavelength of the first phosphor is too short or too long, it tends to be difficult to obtain a good white color in the combination with the first illuminant or with the second phosphor.

The full width at half maximum (FWHM) of the emission peak of the same color concomitant phosphor is not limited, but it is usually at least 110 nm, preferably at least 120 nm and usually at most 280 nm. If this full width at half maximum is too narrow, the color rendering property is likely to be low.

In a case where as the first phosphor, the phosphor of the present invention and another phosphor (the same color concomitant phosphor) are used, the ratio of the two is optional so long as the effects of the present invention are not substantially thereby impaired. However, the ratio of the phosphor of the present invention should better be large. Specifically, the ratio of the phosphor of the present invention in the entire first phosphor is usually at least 40 wt %, preferably at least 60 wt %, more preferably at least 70 wt %. However, it is particularly preferred to use only the phosphor of the present invention as the first phosphor.

[4-2-2. Second Phosphor]

The second illuminant in the light-emitting device of the present invention may contain, in addition to the above-described first phosphor, another phosphor (i.e. a second phosphor). This second phosphor is a phosphor having an emission wavelength different from the first phosphor. Usually, such a second phosphor is used to adjust the emission color of the second illuminant, and therefore, as the second phosphor, a phosphor to emit fluorescence of a color different from the first phosphor, is used in many cases.

As mentioned above, as the first phosphor, the phosphor of the present invention is usually used, and therefore, as the second phosphor, it is preferred to use, for example, a phosphor having an emission peak within a wavelength range of from 565 nm to 780 nm (hereinafter sometimes referred to as "an orange or red phosphor"), a phosphor having an emission peak within a wavelength of from 420 nm to 500 nm (hereinafter sometimes referred to as "a blue phosphor"), or a phosphor having an emission peak within a wavelength range of from 500 nm to 550 nm (hereinafter sometimes referred to as "a green phosphor").

Further, as the second phosphor, one phosphor may be used alone, or two or more phosphors may be used in an optional combination and ratio. Further, the ratio of the second phosphor to the first phosphor is also optional unless the effects of the present invention are not substantially impaired. Accordingly, the amount of the second phosphor to be used as well as the combination of phosphors to be used as the second phosphor and their ratio may optionally be set depending upon the particular application of the light-emitting device, etc. Now, the second phosphor will be described in further detail.

[4-2-2-1. Orange or Red Phosphor]

The emission peak wavelength of the orange or red phosphor is preferably within a wavelength range of usually at least 565 nm, preferably at least 575 nm, more preferably at least 580 nm and usually at most 780 nm, preferably at most 700 nm, more preferably at most 680 nm.

Such an orange or red phosphor may, for example, be a europium-activated alkaline earth silicon nitride phosphor represented by $(Mg,Ca,Sr,Ba)_2Si_5N_8$:Eu, which is constituted by fractured particles having a red fracture surface and which emits light in a red color region, or a europium-activated rare earth oxychalcogenide phosphor represented by $(Y,La,Gd,Lu)_2O_2S$:Eu, which is constituted by grown particles having substantially a spherical shape as a regular crystal-growth shape and which emits light in a red color region.

The full width at half maximum of the emission peak of the red phosphor is usually within a range of from 1 nm to 100 nm. Further, the external quantum efficiency is usually at least 60%, preferably at least 70%, and the weight median diameter is usually at least 1 μm, preferably at least 5 μm, further preferably at least 10 μm and usually at most 30 μm, preferably at most 20 μm, further preferably at most 15 μm.

Further, a phosphor containing an oxynitride and/or oxysulfide containing at least one element selected from the group consisting of Ti, Zr, Hf, Nb, Ta, W and Mo, as disclosed in JP-A-2004-300247, which contains an oxynitride having an α-SiAlON structure having a part or all of Al element substituted by Ga element, may also be used in the present invention.

Further, as the red phosphor, it is possible to use, for example, an Eu-activated oxysulfide phosphor such as $(La, Y)_2O_2S$:Eu, an Eu-activated oxide phosphor such as $Y(V,P)O_4$:Eu or $Y_2O_3$:Eu, Eu, Mn-activated silicate phosphor such as $(Ba,Mg)_2SiO_4$:Eu,Mn, or $(Ba,Sr,Ca,Mg)_2SiO_4$:Eu,Mn, an Eu-activated tungstenate phosphor such as $LiW_2O_8$:Eu, $LiW_2O_8$:Eu,Sm, $Eu_2W_2O_9$, $Eu_2W_2O_9$:Nb, or $Eu_2W_2O_9$:Sm, an Eu-activated sulfide phosphor such as $(Ca,Sr)S$:Eu, an Eu-activated aluminate phosphor such as $YAlO_3$:Eu, an Eu-activated silicate phosphor such as $Ca_2Y_8(SiO_4)_8O_2$:Eu, $LiY_9(SiO_4)_6O_2$:Eu, $(Sr,Ba,Ca)_3SiO_5$:Eu, or $Sr_2BaSiO_5$:Eu, a Ce-activated aluminate phosphor such as $(Y,Gd)_3Al_5O_{12}$:Ce, or $(Tb,Gd)_3Al_5O_{12}$:Ce, an Eu-activated oxide, nitride or oxynitride phosphor such as $(Mg,Ca,Sr,Ba)_2Si_5(N,O)_8$:Eu, $(Mg,Ca,Sr,Ba)Si(N,O)_2$:Eu, or $(Mg,Ca,Sr,Ba)AlSi(N,O)_3$:Eu, an Eu,Mn-activated halophosphate phosphor such as $(Sr,Ca,Ba,Mg)_{10}(PO_4)_6Cl_2$:Eu,Mn, an Eu,Mn-activated silicate phosphor such as $Ba_3MgSi_2O_8$:Eu,Mn, or $(Ba,Sr,Ca,Mg)_3(Zn,Mg)Si_2O_8$:Eu,Mn, a Mn-activated germinate phosphor such as $3.5MgO.0.5MgF_2.GeO_2$:Mn, an Eu-activated oxynitride phosphor such as an Eu-activated α-SiAlON, an Eu,Bi-activated oxide phosphor such as $(Gd,Y,Lu,La)_2O_3$:Eu,Bi, an Eu,Bi-activated oxysulfie phosphor such as $(Gd,Y,Lu,La)_2O_2S$:Eu,Bi, an Eu,Bi-activated vanadinate phosphor such as $(Gd,Y,Lu,La)VO_4$:Eu,Bi, an Eu, Ce-activated sulfide phosphor such as $SrY_2S_4$:Eu, Ce, a Ce-activated sulfide phosphor such as $CaLa_2S_4$:Ce, an Eu,Mn-activated phosphate phosphor such as $(Ba,Sr,Ca)MgP_2O_7$:Eu,Mn, or $(Sr,Ca,Ba,Mg,Zn)_2P_2O_7$:Eu,Mn, an Eu,Mo-activated tungstate phosphor such as $(Y,Lu)_2WO_6$:Eu,Mo, an Eu, Ce-activated nitride phosphor such as $(Ba,Sr,Ca)_xSi_yN_z$:Eu, Ce (wherein each of x, y and z is an integer of at least 1), an Eu,Mn-activated halophosphate phosphor such as $(Ca,Sr,Ba,Mg)_{10}(PO_4)_6(F,$ Cl,Br,OH):Eu,Mn, or a Ce-activated silicate phosphor such as $((Y,Lu,Gd,Tb)_{1-x-y}Sc_xCe_y)_2(Ca,Mg)_{1-r}(Mg,Zn)_{2+r}Si_{z-q}Ge_qO_{12+\delta}$.

As the red phosphor, it is also possible to use a red organic phosphor made of a rare earth element ion complex having, as a ligand, an anion such as a β-diketonate, a β-diketone, an aromatic carboxylic acid or a Brønsted acid, a perylene pigment (such as dibenzo{[f,f']-4,4',7,7'-tetraphenyl}diindeno[1,2,3-cd:1',2',3'-lm]perylene), an anthraquinone pigment, a lake pigment, an azo pigment, a quinacridone pigment, an anthracene pigment, an isoindoline pigment, an isoindolinone pigment, a phthalocyanine pigment, a triphenylmethane basic dye, an indanthrone pigment, an indophenol pigment, a cyanine pigment or a dioxazine pigment.

Among the above, the red phosphor preferably contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu or an Eu complex. More preferably, it contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu or $(La,Y)_2O_2S$:Eu, or a β-diketone type Eu complex such as an Eu (dibenzoylmethane)3.1,10-phenanthroline complex, or a carboxylic acid type Eu complex. Particularly preferred is $(Ca,Sr,Ba)_2Si_5(N,O)_8$:Eu, $(Sr,Ca)AlSi(N,O)$:Eu or $(La,Y)_2O_2S$:Eu.

Further, in the above exemplification, as the orange phosphor, $(Sr,Ba)_3SiO_5$:Eu is preferred. One of such orange or red phosphors may be used alone, or two or more of them may be used in an optional combination and ratio.

[4-2-2-2. Blue Phosphor]

The emission peak wavelength of the blue phosphor is preferably within a range of usually at least 420 nm, preferably at least 430 nm, more preferably at least 440 nm and usually at most 500 nm, preferably at most 480 nm, more preferably at most 470 nm, further preferably at most 460 nm.

The full width at half maximum of the emission peak of the blue phosphor is usually within a range of from 20 nm to 80 nm. Further, the external quantum efficiency is usually at least 60%, preferably at least 70%, and the weight median diameter is usually at least 1 μm, preferably at least 5 μm, further preferably at least 10 μm and usually at most 30 μm, preferably at most 20 μm, more preferably at most 15 μm.

Such a blue phosphor may, for example, be a europium-activated barium magnesium aluminate phosphor represented by $Ba,Sr, Ca)MgAl_{10}O_{17}$:Eu constituted by grown particles having a substantially hexagonal shape as a regular crystal growth shape and which emits light in a blue region, a europium-activated calcium halophosphate phosphor represented by $(Mg,Ca,Sr,Ba)_5(PO_4)_3(Cl,F)$:Eu which is constituted by grown particles having a substantially spherical shape as a regular crystal growth shape and which emits light in a blue region, a europium-activated alkaline earth chloroborate phosphor represented by $(Ca,Sr,Ba)_2B_5O_9Cl$:Eu which is constituted by grown particles having a substantially cubic shape as a regular crystal growth shape and which emits light in a blue region or a europium-activated alkaline earth aluminate phosphor represented by $(Sr,Ca,Ba)Al_2O_4$:Eu or $(Sr,Ca,Ba)_4Al_{14}O_{25}$:Eu, which is constituted by fractured particles having a fracture surface and which emits light in a bluish green region.

Further, as the blue phosphor, it is possible to use a Sn-activated phosphate phosphor such as $Sr_2P_2O_7$:Sn, an Eu-activated aluminate phosphor such as $(Sr,Ca,Ba)Al_2O_4$:Eu or $(Sr,Ca,Ba)_4Al_{14}O_{25}$:Eu, $BaMgAl_{10}O_{17}$:Eu, $(Ba,Sr,Ca)MgAl_{10}O_{17}$:Eu, $BaMgAl_{10}O_{17}$:Eu, Tb,Sm, $BaAl_8O_{13}$:Eu, a Ce-activated thiogalate phosphor such as $SrGa_2S_4$:Ce, or $CaGa_2S_4$:Ce, an Eu,Mn-activated aluminate phosphor such as $(Ba,Sr,Ca)MgAl_{10}O_{17}$:Eu,Mn, an Eu-activated halophosphate phosphor such as $(Sr,Ca,Ba,Mg)_{10}(PO_4)_6Cl_2$:Eu, or $(Ba,Sr,Ca)_5(PO_4)_3(Cl,F,Br,OH)$:Eu,Mn,Sb, an Eu-activated silicate phosphor such as $BaAl_2Si_2O_8$:Eu, or $(Sr,Ba)_3MgSi_2O_8$:Eu, an Eu-activated phosphate phosphor such as $Sr_2P_2O_7$:Eu, a sulfide phosphor such as ZnS:Ag, or ZnS:Ag, Al, a Ce-activated silicate phosphor such as $Y_2SiO_5$:Ce, a tungstate phosphor such as $CaWO_4$, an Eu,Mn-activated borophosphate phosphor such as $(Ba,Sr,Ca)BPO_5$:Eu,Mn, $(Sr,Ca)_{10}(PO_4)_8 \cdot nB_2O_3$:Eu, or $2SrO \cdot 0.84P_2O_5 \cdot 0.16B_2O_3$:Eu, an Eu-activated halosilicate phosphor such as $Sr_2Si_3O_{8.2}SrCl_2$:Eu, an Eu-activated oxynitride phosphor such as $SrSi_9Al_{19}ON_{31}$:Eu, or $EuSi_9Al_{19}ON_{31}$, or a Ce-activated oxynitride phosphor such as $La_{1-x}Ce_xAl(Si_{6-z}Al_z)(N_{10-z}O_z)$ (wherein x and z are numbers which satisfy $0 \le x \le 1$ and $0 \le z \le 6$, respectively), $La_{1-x-y}Ce_xCa_yAl(Si_{6-z}Al_z)(N_{10-z}O_z)$ (wherein x, y and z are numbers which satisfy $0 \le x \le 1$, $0 \le y \le 1$ and $0 \le z \le 6$, respectively), etc.

Further, as the blue phosphor, it is also possible to use a fluorescent pigment of a naphthalic acid imide type, benzoxazole type, styryl type, coumarin type, pyrazoline type or triazole type compound, or an organic phosphor such as a thulium complex.

In the above exemplification, the blue phosphor preferably contains $(Ca,Sr,Ba)MgAl_{10}O_{17}$:Eu, $(Sr,Ca,Ba,Mg)_{10}(PO_4)_6(Cl,F)_2$:Eu or $(Ba,Ca,Mg,Sr)_2SiO_4$:Eu. More preferably, it contains $(Ca,Sr,Ba)MgAl_{10}O_{17}$:Eu, $(Sr,Ca,Ba,Mg)_{10}(PO_4)_8(Cl,F)_2$:Eu or $(Ba,Ca,Sr)_3MgSi_2O_8$:Eu. Further preferably, it contains $BaMgAl_{10}O_{17}$:Eu, $Sr_{10}(PO_4)_6(Cl,F)_2$:Eu or $Ba_3MgSi_2O_8$:Eu. Further, among them, for lighting applications and display applications, $(Sr,Ca,Ba,Mg)_{10}(PO_4)_6Cl_2$:Eu or $(Ca,Sr,Ba)MgAl_{10}O_{17}$:Eu is particularly preferred. Further, one of such blue phosphors may be used alone, or two or more of them may be used in an optional combination and ratio.

[4-2-2-3. Green Phosphor]

The emission peak wavelength of the green phosphor is preferably within a range of usually more than 500 nm, preferably at least 510 nm, more preferably at least 515 nm and usually at most 550 nm, preferably at most 540 nm, further preferably at most 535 nm. If this emission peak wavelength λp is too short, the color tends to be bluish, and if it is too long, the color tends to be yellowish, and thus in either case, the properties as green light may be deteriorated.

The full width at half maximum of the emission peak of the green phosphor is usually within a range of from 40 nm to 80 nm. Further, the external quantum efficiency is usually at least 60%, preferably at least 70%, and the weight median diameter is usually at least 1 μm, preferably at least 5 μm, more preferably at least 10 μm and usually at most 30 μm, preferably at most 20 μm, more preferably at most 15 μm.

A specific example of the green phosphor may, for example, be a europium-activated alkaline earth silicon oxynitride phosphor represented by $(Mg,Ca,Sr,Ba)Si_2O_2N_2$:Eu which is constituted by fractured particles having a fracture surface and which emits light in a green region.

As other green phosphors, it is possible to use an Eu-activated aluminate phosphor such as $Sr_4Al_{14}O_{25}$:Eu, or $(Ba,Sr,Ca)Al_2O_4$:Eu, an Eu-activated silicate phosphor such as $(Sr,Ba)Al_2Si_2O_8$:Eu, $(Ba,Mg)_2SiO_4$:Eu, $(Ba,Sr, Ca,Mg)_2SiO_4$:Eu, $(Ba,Sr,Ca)_2(Mg,Zn)Si_2O_7$:Eu, or $(Ba,Ca,Sr,Mg)_9(Sc,Y,Lu,Gd)_2(Si,Ge)_6O_{24}$:Eu, a Ce,Tb-activated silicate phosphor such as $Y_2SiO_5$:Ce,Tb, an Eu-activated borophosphate phosphor such as $Sr_2P_2O_7-Sr_2B_2O_5$:Eu, an Eu-activated halosilicate phosphor such as $Sr_2Si_3O_5 \cdot 2SrCl_2$:Eu, a Mn-activated silica phosphor such as $Zn_2SiO_4$:Mn, a Tb-activated aluminate phosphor such as $CeMgAl_{11}O_{19}$:Tb, or $Y_3Al_5O_{12}$:Tb, a Tb-activated silica phosphor such as $Ca_2Y_8(SiO_4)_6O_2$:Tb, or $La_3Ga_5SiO_{14}$:Tb, an Eu,Tb,Sm-activated thiogalate phosphor such as $(Sr,Ba,Ca)Ga_2S_4$:Eu,Tb,Sm, a Ce-activated aluminate phosphor such as $Y_3(Al,Ga)_5O_{12}$:Ce or $(Y,Ga,Tb,La,Sm,Pr,Lu)_3(Al,Ga)_5O_{12}$:Ce, a Ce-activated silicate phosphor such as $Ca_3Sc_2Si_3O_{12}$:Ce, or $Ca_3(Sc,Mg,Na,Li)_2Si_3O_{12}$:Ce, a Ce-activated oxide phosphor such as $CaSc_2O_4$:Ce, an Eu-activated oxynitride phosphor such as an Eu-activated β-SiAlON, an Eu,Mn-activated aluminate phosphor such as $BaMgAl_{10}O_{17}$:Eu,Mn, an Eu-activated aluminate phosphor such as $SrAl_2O_4$:Eu, a Tb-activated oxysulfide phosphor such as $(La,Gd,Y)_2O_2S$:Tb, a Ce,Tb-activated phosphate phosphor such as $LaPO_4$:Ce,Tb, a sulfide phosphor such as ZnS:Cu,Al, or ZnS:Cu,Au,Al, a Ce,Tb-activated borate phosphor such as $(Y,Ga,Lu,Sc,La)BO_3$:Ce,Tb, $Na_2Gd_2B_2O_7$:Ce,Tb, or $(Ba,Sr)_2(Ca,Mg,Zn)B_2O_5$:K,Ce,Tb, an Eu,Mn-activated halosilicate phosphor such as $Ca_5Mg(SiO_4)_4Cl_2$:Eu,Mn, an Eu-activated thioaluminate phosphor or thiogalate phosphor such as $(Sr,Ca,Ba)(Al,Ga,In)_2S_4$:Eu, an Eu,Mn-activated halosilicate phosphor such as $(Ca,Sr)_8(Mg,Zn)(SiO_4)_4Cl_2$:Eu,Mn, and an Eu-activated oxynitride phosphor such as $M_3Si_6O_9N_4$:Eu, $M_3Si_6O_{12}N_2$:Eu (wherein M is an alkaline earth metal element).

Further, as the green phosphor, it is also possible to use a pyridine-phthalimide condensation derivative, a fluorescent pigment such as a benzoxazinone type, quinazolinone type, coumarin type, quinophthalone type or naphthalic acid imido type, or an organic phosphor such as a terbium complex. One of the above exemplified green phosphors may be used alone, or two or more of them may be used in an optional combination and ratio.

[4-2-3. Other Properties of First and Second Phosphors]

The weight median diameters of the first phosphor and the second phosphor are optional so long as the effects of the present invention are not substantially thereby impaired, but they are preferably within a range of usually at least 0.1 μm, preferably at least 0.5 μm and usually at most 30 μm, preferably at most 20 μm. If the weight median diameters are too small, the luminance tends to be deteriorated, and the phosphor particles tend to be agglomerated. On the other hand, if the weight median diameters are too large, the coating unevenness or clogging of the dispenser tends to occur.

[4-3. Combination of First Illuminant and First Phosphor and Second Phosphor]

In the light-emitting device of the present invention, use or non-use, or the type of the second phosphor (red phosphor, blue phosphor, green phosphor, etc.) as described above, may suitably be selected depending upon the particularly application of the light-emitting device. For example, in a case where the first phosphor is a yellow phosphor, when the light-emitting device of the present invention is to be constructed as a light-emitting device to emit a yellow color, only the first phosphor may be used, and it is usually unnecessary to use the second phosphor.

On the other hand, it is possible to construct the light-emitting device by suitably combining the first phosphor (yellow phosphor) and the second phosphor, as phosphors contained in the second illuminant, in order to obtain tight having a desired color.

The following combinations (i) to (iv) may be mentioned as examples of a preferred combination of the first illuminant, the first phosphor and the second phosphor in the case of constructing such a light-emitting device.

(i) As the first illuminant, a blue illuminant (such as short wavelength blue LED) having an emission peak wavelength in a wavelength range of from 420 nm to 450 nm is used, and as the first phosphor, a yellow phosphor (such as the phosphor of the present invention) is used. It is thereby possible to construct a light-emitting device which emits a pseudo white color.

(ii) As the first illuminant, a blue illuminant (such as blue LED) having an emission peak wavelength in a wavelength range of from 420 nm to 500 nm, is used; as the first phosphor, a yellow phosphor (such as the phosphor of the present invention) is used; and as the second phosphor, a red phosphor is used. It is thereby possible to construct a light-emitting device which emits a light bulb color.

(iii) As the first illuminant, a near ultraviolet illuminant (such as near ultraviolet LED) having an emission peak wavelength in a wavelength range of from 300 nm to 420 nm, is used; as the first phosphor, a yellow phosphor (such as the phosphor of the present invention) is used, and as the second phosphor, a blue phosphor is used. It is thereby possible to construct a light-emitting device which emits a pseudo white color.

(iv) As the first illuminant, a near ultraviolet illuminant (such as near ultraviolet LED) having an emission peak wavelength in a wavelength range of from 300 nm to 420 nm, is used; as the first phosphor, a yellow phosphor (such as the phosphor of the present invention) is used; and as the second phosphor, a blue phosphor, a green phosphor and a red phosphor are used. It is thereby possible to construct a light-emitting device which emits a light bulb color.

[4-4. Sealing Material]

In the light-emitting device of the present invention, the first and/or second phosphor is employed usually by dispersing and sealing it in a liquid medium being a sealing material, followed by curing by heat or light. As the liquid medium, the same one as disclosed in the above section [3. Phosphor-containing composition] may be mentioned.

Further, the liquid medium may contain a metal element which can be a metal oxide having a high refractive index in order to adjust the refractive index of the sealing component. Si, Al, Zr, Ti, Y, NB, B, etc. may be mentioned as examples for the metal element which presents a metal oxide having a high refractive index. One of these metal elements may be used alone, or two or more of them may be used in an optional combination and ratio.

The form of such a metal element to be present is not particularly limited so long as the transparency of the sealing component is not impaired. For example, it may form a uniform glass layer as a metalloxane bond or may be present in the form of particles in the sealing component. When it is present in the form of particles, the structure of the interior of the particles may be amorphous or a crystal structure, but in order to present a high refractive index, it is preferably a crystal structure. Further, its particle diameter is usually at most the emission wavelength of a semiconductor light-emitting element, preferably at most 100 nm, more preferably at most 50 nm, particularly preferably at most 30 nm, in order not to impair the transparency of the sealing component. For example, by mixing particles of silicon oxide, aluminum oxide, zirconium oxide, titanium oxide, yttrium oxide, niobium oxide or the like to a silicone material, it is possible to let the above metal element be present in the form of particles in the sealing component.

The above liquid medium may further contain known additives such as a diffusing agent, a filler, a viscosity-controlling agent, an ultraviolet absorber, etc. One of such additives may be used alone, or two or more of them may be used in an optional combination and ratio.

[4-5. Construction of Light-Emitting Device (Other)]

So long as the light-emitting device of the present invention comprises the above first illuminant and second illuminant, other constructions are not particularly limited. However, the above first illuminant and second illuminant are usually disposed on a suitable frame. At that time, the second illuminant is excited by the emission of the first illuminant (i.e. the first and second phosphors are excited) to emit light, and the arrangement is made so that the emission of this first illuminant and/or the emission of the second illuminant is taken out. In such a case, the first phosphor and the second phosphor may not necessarily be mixed in the same layer, and for example, phosphors may be contained in separate layers for the respective emission colors of the phosphors, for example, such that a layer containing the second phosphor is laminated on a layer containing the first phosphor.

In the light-emitting device of the present invention, in addition to the above excitation light source (the first illuminant), the phosphor (the second phosphor) and the frame, another component may be used. As such an example, the above-mentioned sealing material may be mentioned. In addition to the purpose of dispersing the phosphor (the second illuminant) in the light-emitting device, such a sealing material may be used for the purpose of bonding the excitation light source (the first illuminant), the phosphor (the second illuminant) and the frame.

[4-6. Embodiments of Light-Emitting Device]

Now, the light-emitting device of the present invention will be described in further detail with reference to a specific embodiment, but it should be understood that the light-emitting device of the present invention is by no means restricted to the following embodiment, and it may be practiced by modifying it optionally within a range not to depart from the gist of the present invention.

Figure 1:
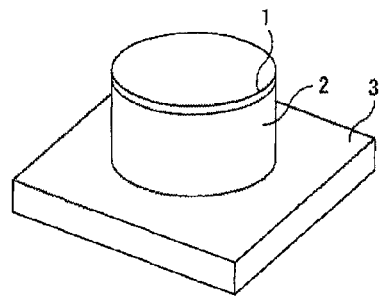
FIG. 1 is a diagrammatical perspective view illustrating the positional relation between an excitation light source (first illuminant) and a phosphor-containing portion (second illuminant) in one embodiment of the light-emitting device of the present invention.

FIG. 1 shows a diagrammatical perspective view illustrating the positional relation between the first illuminant to be an excitation light source and the second illuminant constructed as a phosphor-containing portion having the phosphor, in one embodiment of the light-emitting device of the present invention. In FIG. 1, reference numeral 1 represents a phosphor-containing portion (the second illuminant), reference numeral 2 represents a surface-emitting GaN type LD as an excitation light source (the first illuminant), and reference numeral 3 represents a substrate. In order to make a mutually contracted state, LD(2) and the phosphor-containing portion (the second illuminant) (1) may be prepared separately, and their surfaces may be bonded to each other by an adhesive or other means, or on the light-emitting surface of LD(2), the phosphor-containing portion (the second illuminant) may be formed as a film. Consequently, LD(2) and the phosphor-containing portion (the second illuminant) (1) can be made to be in contact with each other.

By adopting such a construction of the device, it is possible to avoid a loss of light quantity such that light from the excitation light source (the first illuminant) is reflected at the film surface of the phosphor-containing portion (the second illuminant) and discharged outside, whereby the luminous efficiency of the entire device can be made good.

FIG. 2(a) is a diagrammatical cross-sectional view illustrating an embodiment of the light-emitting device having an excitation light source (the first illuminant) and a phosphor-containing portion (the second illuminant), which is a typical example of a light-emitting device in the form which is commonly called a shell form. In the light-emitting device (4), reference numeral 5 represents a mount lead, reference numeral 6 an inner lead, reference numeral 7 an excitation light source (the first illuminant), reference numeral 8 a phosphor-containing resin portion, reference numeral 9 a conductive wire, and reference numeral 10 a molded component.

FIG. 2(b) is a diagrammatical cross-sectional view illustrating one embodiment of the light-emitting device having an excitation light source (the first illuminant) and a phosphor-containing portion (the second illuminant), which is a typical example of a light-emitting device in the form which is called a surface-mounting type. In the Fig., reference numeral 22 represents an excitation light source (the first illuminant), reference numeral 23 a phosphor-containing resin portion as the phosphor-containing portion (the second illuminant), reference numeral 24 a frame, reference numeral 25 a conductive wire, and reference numerals 26 and 27 electrodes.

[4-7. Uses of Light-Emitting Device]

Uses of the light-emitting device of the present invention are not particularly limited, and it is useful in various fields wherein usual light-emitting devices are employed. However, it is particularly suitably employed as a light source for a lighting system or an image display device, since its color reproduction range is wide and the color rendering properties are high.

[5. Lighting System]

The lighting system of the present invention is one provided with the light-emitting device of the present invention. In a case where the light-emitting device of the present invention is applied to the lighting system, the above-described light-emitting device may be suitably incorporated to a known lighting system. For example, as shown in FIG. 3, a surface-emitting lighting system (11) may be mentioned wherein the above-described light-emitting device (4) is incorporated.

FIG. 3 is a diagrammatical cross-sectional view illustrating an embodiment of the lighting system of the present invention. As shown in this FIG. 3, the surface-emitting lighting system is such that on the bottom surface of a rectangular casing (12) having the inner surface made opaque with e.g. a white smooth surface, many light-emitting devices (13) (corresponding to the above-described light-emitting device (4)) are disposed, while a light source, a circuit, etc. (not shown) to drive the light-emitting devices (13) are provided outside the light-emitting devices, and to make the emission uniform, a diffuse panel (14) made of e.g. a milky white acrylic plate, is fixed at the portion corresponding to a cover of the casing (12).

And, by driving the surface-emitting lighting system (11) to apply a voltage to the excitation light source (the first illuminant) of the light-emitting devices (13) to have light emitted, and a part of the emitted light is absorbed by the phosphor in the phosphor-containing resin portion as the phosphor-containing portion (the second illuminant) to have a visible light emitted, while by color mixing with blue light, etc. not absorbed by the phosphor, an emission having high color rendering properties can be obtained, and this light is transmitted through the diffuser panel (14) and emitted upwards in the drawing, whereby illumination light having a uniform brightness will be obtained in the plane of the diffuser panel (14) of the casing (12).

[6. Image Display Device]

The image display device of the present invention is one provided with the light-emitting device of the present invention. In a case where the light-emitting device of the present invention is used as a light source for an image display device, there is no particularly limitation to the specific construction of the image display device, but it is preferably used together with a color filter. For example, in a case where the image display device is a color image display device utilizing a color liquid crystal display element, it is possible to form an image display device by using the above-described light-emitting device as a backlight and combining an optical shutter utilizing liquid crystal with color filters having red, green and blue pixels.

The color reproduction range by light after passing through the color filters at that time, is, by NTSC ratio, usually at least 60%, preferably at least 80%, more preferably at least 90%, further preferably at least 100%, and usually at most 150%. Further, the amount of transmitted light from each color filter (light use efficiency) to the amount of transmitted light from the entire color filters is usually at least 20%, preferably at least 25%, more preferably at least 28%, further preferably at least 30%. The light use efficiency should better be high, but as three filters of red, green and blue are used, it is usually at most 33%.

EXAMPLES

Now, the present invention will be described in further detail with reference to Examples and Comparative Examples, but it should be understood that the present invention is by no means restricted to the following Examples, and may be practiced by making optional changes within a range not to depart from the gist of the present invention. Here, measurement of emission properties, etc. of phosphors in Examples and Comparative Examples were carried out by the following methods.

[Measuring Methods]

[Emission Spectrum]

The emission spectrum was measured by means of a fluorescence measuring apparatus (manufactured by JASCO Corporation) provided with a 150 W xenon lamp as an excitation light source and a multichannel CCD detector C7041 (manufactured by Hamamatsu Photonics) as a spectrum-measuring device. Light from the excitation light source was passed through a diffraction grating spectroscope having a focal distance of 10 cm, and only excitation light having a wavelength of 460 nm was radiated to the phosphor via an optical fiber. Light generated from the phosphor under irradiation with the excitation light was spectrally divided by a diffraction grating spectroscope having a focal distance of 25 cm, whereby emission intensities at various wavelengths were measured by the spectrum measuring apparatus within the wavelength range of from 300 nm to 800 nm, and via signal treatments such as sensitivity correction by a personal computer, an emission spectrum was obtained. Here, at the time of the measurement, the measurement was carried out by setting the slit width of the light-receiving side spectroscope to be 1 nm.

[Chromaticity Coordinates]

The chromaticity coordinates of x, y color system (CIE 1931 color system) were calculated as chromaticity coordinates x and y in the XYZ color system as stipulated in JIS Z8701 by a method in accordance with JIS Z8724 from the data in the wavelength region of from 420 nm to 800 nm of the emission spectrum obtained by the above-described method.

[Absorption Efficiency]

The absorption efficiency $\alpha_q$ of a phosphor was obtained as follows. Firstly, a phosphor sample to be measured was made to have its surface sufficiently smooth so that the measurement accuracy was maintained and packed into a cell, which was attached to an integrating sphere.

To this integrating sphere, light was introduced by means of an optical fiber from an emission light source (150 W Xe lamp) to excite the phosphor. The emission peak wavelength of light from the above emission light source was adjusted by means of e.g. a monochrometer (diffraction grating spectroscope) to be a monochromatic light of 455 nm. Such a monochromatic light was radiated as an excitation light to the phosphor sample to be measured, and by means of a spectroscopic apparatus (MCPD7000 manufactured by Otsuka Electronics Co., Ltd.), the emission (fluorescence) of the phosphor sample and the spectrum with respect to the reflected light, were measured. The light in the integrating sphere was led to a spectroscopic apparatus by means of an optical fiber.

The absorption efficiency $\alpha_q$ is a value obtained by dividing the photon number $N_{abs}$ of the excitation light absorbed by the phosphor sample, by the total photon number N of the excitation light.

The latter total photon number N of the excitation light is proportional to the numerical value obtained by the following formula (Formula a). Therefore, as a reflector having a reflectance R of substantially 100% to the excitation light, "Spectralon" manufactured by Labsphere (having a reflectance R of 98.8% to a light source of 455 nm) was attached, as an object to be measured, to the above-mentioned integrating sphere in the same disposition as the phosphor sample and irradiated with an excitation light, whereby the reflection spectrum $I_{ref}$ (λ) was measured by a spectroscopic apparatus, and the value of the following formula (Formula a) was obtained.

$$\frac{1}{R}\int \lambda \cdot I_{ref}(\lambda)d\lambda \qquad \text{Formula a}$$

Here, the integral interval was set to be from 410 nm to 480 nm to an excitation wavelength of 455 nm. The photon number $N_{abs}$ of the excitation light absorbed by the phosphor sample is proportional to the amount obtained by the following formula (Formula b).

$$\frac{1}{R}\int \lambda \cdot I_{ref}(\lambda)d\lambda - \int \lambda \cdot I(\lambda)d\lambda \qquad \text{Formula b}$$

Therefore, the reflection spectrum I (λ) was obtained when the reflection sample as the object to obtain the absorption efficiency $\alpha_q$ was attached. The integration range of the Formula b was set to be the same as the integration range set for the Formula a. The actual measured value of spectrum is usually obtained as digital data divided into finite band widths relating to λ, and accordingly, the integrations of the Formula a and the Formula b were obtained by summation based on the band widths. Thus, $\alpha_q = N_{abs}/N = $(Formula b)/(Formula a) was calculated. Here, the reflectance was obtained by using light with a wavelength of 780 nm whereby in the phosphor, substantially no absorption or emission takes place.

[Object Color]

The measurement of the object color was carried out by means of color difference meter CR300 manufactured MINOLTA using D65 as the standard light. A sample was packed in a circular cell and its surface was flattened, and the measurement was carried out by pressing the flattened surface to the measuring portion of the color difference meter.

[Carbon Content, Oxygen Content]

A sample was put in an impulse furnace, and oxygen and carbon were extracted by heating, whereupon the oxygen content concentration and the carbon content concentration were determined by nondispersive infrared detection.

[SEM-EDX]

The elemental composition of apart of phosphor particles, e.g. the composition of Gd, Y, etc., was analyzed by SEM- EDX (Scanning Electron Microscope-Energy Dispersive X-ray spectrometer) (S-3400N manufactured by Hitachi, Ltd.)

Example 1

(Production of Alloy)

Respective metal raw materials of Ca solid metal blank, La solid metal blank, Ce solid metal blank and Si solid metal blank, were weighed so that the compositional ratio of metal elements would be Ca:La:Ce:Si=0.45:2.5:0.1:6 (molar ratio) and melted by a high frequency meting furnaces to obtain an alloy. Then, the alloy was pulverized by a jet mill to obtain an alloy powder a having a median diameter of 4.3 μm.

(Firing of Raw Material)

In a glove box containing nitrogen as an operation atmosphere, 1 g of the alloy powder, 0.06 g of $MgF_2$ (6 wt % to the alloy material) and 0.08 g of $CeF_3$ (8 wt % to the alloy material) were mixed in an alumina mortar, and the mixture was spread on a molybdenum tray having a diameter of 30 mm and set in an electric furnace with a molybdenum inner wall having a tungsten heater. After vacuuming from room temperature to 120° C., 4% hydrogen-containing nitrogen gas was introduced to ordinary pressure, and while maintaining the supply rate of 0.5 L/min, the temperature was raised to 800° C. and then raised from 800 to 1,550° C. at a rate of 0.5° C./min, followed by firing at 1,550° C. for 15 hours, whereupon the fired product was pulverized in an alumina mortar.

(Treatment of Fired Product)

The obtained fired product was pulverized in an agate mortar, and the obtained powder was stirred and cleaned with a $NH_4HF_2$ aqueous solution having a concentration of 10 wt % for 1 hour, followed by washing with water and drying to obtain a phosphor. The firing conditions, etc. of this phosphor and the results of property evaluations (the emission properties, absorption efficiency and object color) are shown in Table 1. Here, in Table 1, the luminance (%) and the emission intensity (%) are relative values to a YAG commercial product (P46-Y3 manufactured by Kasei Optonix) being 100%. The phosphor in Example 1 had a luminance as high as 119% to P46-Y3; $a^*$ and $b^*$ representing the object color were −14 and 88, respectively; the chroma $(a^{*2}+b^{*2})^{1/2}$ was very high at 89; and the absorption efficiency was very high at 92%.

Example 2

A phosphor was obtained in the same manner as in Example 1 except that the cleaning with the ammonium hydrogen fluoride ($NH_4HF_2$) aqueous solution was not carried out, and evaluations of its properties were carried out. The firing conditions, etc. of this phosphor and the evaluation results of the properties are shown in Table 1. The phosphor in Example 2 had a luminance of 106% to P46-Y3; $a^*$ and $b^*$ representing the object color were −11 and 83, respectively; the chroma $(a^{*2}+b^{*2})^{1/2}$ was 84; and the absorption efficiency was 92%. When Example 2 is compared with Example 1, the absorption efficiency was equal, but Example 1 was superior with respect to other values, thus indicating that the effects of cleaning with the $NH_4HF_2$ aqueous solution are distinct.

Example 3

A phosphor was obtained in the same manner as in Example 1 except that the amount of $CeF_3$ added was 6 wt %, and evaluations of its properties were carried out. The firing conditions, etc. of this phosphor and the evaluation results of the properties are shown in Table 1.

The content concentration of carbon in the phosphor obtained in Example 3 was 0.03 wt %. The carbon content concentration in the raw material alloy of this phosphor was 0.3 wt %, and the oxygen content concentration was 0.6 wt %. This indicates that by the firing in 4% hydrogen-containing nitrogen gas, the carbon content in the phosphor was reduced to 0.03 wt %. That is, it is evident that in this Example, the firing in the hydrogen-containing nitrogen atmosphere finally contributed to reduction of the amount of carbon in the phosphor, and as a result, an extremely high luminance was obtained. Thus, according to the method of the present invention, it is possible to obtain a phosphor having high luminance by using an alloy produced by using a graphite crucible. This sample in Example 3 was further subjected to cleaning with 1N hydrochloric acid, and then, the same chemical analysis as in Example A1 was carried out, whereby the chemical formula of the phosphor obtained was found to be $Ca_{0.04}La_{2.7}Ce_{0.30}Si_6O_{11}O_{0.26}$.

Example 4

A phosphor was obtained in the same manner as in Example 3 except that the cleaning with the $NH_4HF_2$ aqueous solution was not carried out, and evaluations of its properties were carried out. The firing conditions, etc. of this phosphor and the evaluation results of the properties are shown in Table 1. When Example 3 and Example 4 are compared, it is evident that the effects for improving the luminance and emission intensity, of the cleaning with the $NH_4HF_2$ aqueous solution, are distinct.

Example 5

A phosphor was obtained in the same manner as in Example 1 except that the amount of $CeF_3$ was changed to 4 wt %, and evaluations of its properties were carried out. The firing conditions, etc. of this phosphor and the evaluation results of the properties are shown in Table 1.

Example 6

A phosphor was obtained in the same manner as in Example 5 except that the cleaning with the $NH_4HF_2$ aqueous solution was not carried out, and evaluations of its properties were carried out. The firing conditions, etc. of this phosphor and the evaluation results of the properties are shown in Table 1. When Example 5 and Example 6 are compared, it is evident that by the cleaning with the $NH_4HF_2$ aqueous solution, the luminance and the absorption efficiency are improved.

Example 7

A phosphor was obtained in the same manner as in Example 1 except that the amount of $CeF_3$ was changed to 2 wt %, and evaluations of its properties were carried out. The firing conditions, etc. of this phosphor and the evaluation results of the properties are shown in Table 1.

Example 8

A phosphor was obtained in the same manner as in Example 7 except that the cleaning with the $NH_4HF_2$ aqueous solution was not carried out, and evaluations of its properties were carried out. The firing conditions, etc. of this phosphor and the evaluation results of the properties are shown in Table 1. When Example 7 and Example 8 are compared, it is evident that the effects for improving the luminance and emission intensity, of the cleaning with the $NH_4HF_2$ aqueous solution, are distinct.

Example 9

A phosphor was obtained in the same manner as in Example 1 except that 6% of only $MgF_2$ was added, and $CeF_3$ was not added, and evaluations of its properties were carried out. The firing conditions, etc. of this phosphor and the evaluation results of the properties are shown in Table 1.

Comparative Example 1

A phosphor was obtained in the same manner as in Example 9 except that the cleaning with the $NH_4HF_2$ aqueous solution was not carried out, and evaluations of its properties were carried out. The firing conditions, etc. of this phosphor and the evaluation results of the properties are shown in Table 1. When Example 9 and Comparative Example 1 are compared, it is evident that by the cleaning with the $NH_4HF_2$ aqueous solution, the luminance, emission intensity and object color are improved.

Example 10

A phosphor was obtained in the same manner as in Example 1 except $MgF_2$ was 6%, $CeF_3$ was 6%, $LaF_3$ was 2%, and the heating retention time was 40 hours, and evaluations of its properties were carried out. The firing conditions, etc. of this phosphor and the evaluation results of the properties are shown in Table 1. The phosphor in Example 10 had a luminance of 118% to P46-Y3; $a*$ and $b*$ representing the object color were −13 and 89, respectively; the chroma $(a*^2+b*^2)^{1/2}$ was high at 90; and the absorption efficiency showed a high value of 93%.

Example 11

A phosphor was obtained in the same manner as in Example 10 except that the cleaning with the $NH_4HF_2$ aqueous solution was not carried out, and evaluations of its properties were carried out. The firing conditions, etc. of this phosphor and the evaluation results of the properties are shown in Table 1. The phosphor in Example 11 had a luminance as high as 97% to P46-Y3; $a*$ and $b*$ representing the object color were −10 and 79, respectively; the chroma $(a*^2+b*^2)^{1/2}$ was high at 80; and the absorption efficiency showed a high value of 94%. When Example 11 is compared with Example 10, the absorption efficiency is substantially equal, but Example 10 is superior with respect to other values, whereby it is evident that the effects of cleaning with the $NH_4HF_2$ aqueous solution are distinct.

Example 12

A phosphor was obtained in the same manner as in Example 10 except that the type and blend amount of the flux were as shown in Table 1, and evaluations of its properties were carried out. The firing conditions, etc. of this phosphor and the evaluation results of the properties are shown in Table 1.

Example 13

A phosphor was obtained in the same manner as in Example 12 except that the cleaning with the $NH_4HF_2$ aqueous solution was not carried out, and evaluations of its properties were carried out. The firing conditions, etc. of this phosphor and the evaluation results of the properties are shown in Table 1. When Example 12 and Example 13 are compared, it is evident that the effects for improving the luminance, of the cleaning with the $NH_4HF_2$ aqueous solution, are distinct.

Example 14

A phosphor was obtained in the same manner as in Example 10 except that the type and blend amount of the flux were as shown in Table 1, and evaluations of its properties were carried out. The firing conditions, etc. of this phosphor and the evaluation results of the properties are shown in Table 1.

Example 15

A phosphor was obtained in the same manner as in Example 14 except that the cleaning with the $NH_4HF_2$ aqueous solution was not carried out, and evaluations of its properties were carried out. The firing conditions, etc. of this phosphor and the evaluation results of the properties are shown in Table 1. When Example 14 and Example 15 are compared, it is evident that the effects for improving the luminance, of the cleaning with the $NH_4HF_2$ aqueous solution, are distinct.

Example 16

A phosphor was obtained in the same manner as in Example 10 except that the type and blend amount of the flux were as shown in Table 1, and evaluations of its properties were carried out. The firing conditions, etc. of this phosphor and the evaluation results of the properties are shown in Table 1.

Example 17

A phosphor was obtained in the same manner as in Example 16 except that the cleaning with the $NH_4HF_2$ aqueous solution was not carried out, and evaluations of its properties were carried out. The firing conditions, etc. of this phosphor and the evaluation results of the properties are shown in Table 1. When Example 16 and Example 17 are compared, it is evident that by the cleaning with the $NH_4HF_2$ aqueous solution, the luminance and object color are improved.

Example 18

A phosphor was obtained in the same manner as in Example 16 except $CeF_3$ was not added, and evaluations of its properties were carried out. The firing conditions, etc. of this phosphor and the evaluation results of the properties are shown in Table 1.

Comparative Example 2

A phosphor was obtained in the same manner as in Example 18 except that the cleaning with the $NH_4HF_2$ aqueous solution was not carried out, and evaluations of its properties were carried out. The firing conditions, etc. of this phosphor and the evaluation results of the properties are shown in Table 1. When Example 18 and Comparative Example 2 are compared, it is evident that by the cleaning with the $NH_4HF_2$ aqueous solution, the luminance, absorption efficiency and object color are improved.

TABLE 1

| Ex. or Comp. Ex. No. | Firing conditions | | | | | | Firing time (hr) | Cleaning with acid |
|---|---|---|---|---|---|---|---|---|
| | First flux | | Second flux | | Third flux | | | |
| | Type | Amount (%) | Type | Amount (%) | Type | Amount (%) | | |
| Ex. 1 | MgF$_2$ | 6 | CeF$_3$ | 8 | — | — | 15 | Yes |
| Ex. 2 | MgF$_2$ | 6 | CeF$_3$ | 8 | — | — | 15 | No |
| Ex. 3 | MgF$_2$ | 6 | CeF$_3$ | 6 | — | — | 15 | Yes |
| Ex. 4 | MgF$_2$ | 6 | CeF$_3$ | 6 | — | — | 15 | No |
| Ex. 5 | MgF$_2$ | 6 | CeF$_3$ | 4 | — | — | 15 | Yes |
| Ex. 6 | MgF$_2$ | 6 | CeF$_3$ | 4 | — | — | 15 | No |
| Ex. 7 | MgF$_2$ | 6 | CeF$_3$ | 2 | — | — | 15 | Yes |
| Ex. 8 | MgF$_2$ | 6 | CeF$_3$ | 2 | — | — | 15 | No |
| Ex. 9 | MgF$_2$ | 6 | CeF$_3$ | 0 | — | — | 15 | Yes |
| Comp. Ex. 1 | MgF$_2$ | 6 | CeF$_3$ | 0 | — | — | 15 | No |
| Ex. 10 | MgF$_2$ | 6 | CeF$_3$ | 6 | LaF$_3$ | 2 | 40 | Yes |
| Ex. 11 | MgF$_2$ | 6 | CeF$_3$ | 6 | LaF$_3$ | 2 | 40 | No |
| Ex. 12 | MgF$_2$ | 6 | CeF$_3$ | 8 | — | — | 40 | Yes |
| Ex. 13 | MgF$_2$ | 6 | CeF$_3$ | 8 | — | — | 40 | No |
| Ex. 14 | MgF$_2$ | 6 | CeF$_3$ | 10 | — | — | 40 | Yes |
| Ex. 15 | MgF$_2$ | 6 | CeF$_3$ | 10 | — | — | 40 | No |
| Ex. 16 | MgF$_2$ | 6 | CeF$_3$ | 6 | — | — | 40 | Yes |
| Ex. 17 | MgF$_2$ | 6 | CeF$_3$ | 6 | — | — | 40 | No |
| Ex. 18 | MgF$_2$ | 6 | CeF$_3$ | 0 | — | — | 40 | Yes |
| Comp. Ex. 2 | MgF$_2$ | 6 | CeF$_3$ | 0 | — | — | 40 | No |

| Ex. or Comp. Ex. No. | Evaluation results of properties | | | | | | | | |
|---|---|---|---|---|---|---|---|---|---|
| | Emission properties (455 nm excitation) | | | | | Absorption efficiency (%) | Object color | | |
| | Emission peak wavelength (nm) | Chromaticity coordinate x | Chromaticity coordinate y | Luminance (%) | Emission intensity (%) | | Luminosity L* | a* | b* | Chroma $(a^{*2}+b^{*2})^{0.5}$ |
| Ex. 1 | 540 | 0.441 | 0.539 | 119 | 119 | 92 | 96 | −14 | 88 | 89 |
| Ex. 2 | 542 | 0.444 | 0.537 | 106 | 107 | 92 | 92 | −11 | 83 | 84 |
| Ex. 3 | 540 | 0.440 | 0.540 | 115 | 115 | — | — | — | — | — |
| Ex. 4 | 540 | 0.441 | 0.539 | 101 | 103 | — | — | — | — | — |
| Ex. 5 | 542 | 0.442 | 0.539 | 117 | 117 | 92 | — | — | — | — |
| Ex. 6 | 542 | 0.440 | 0.540 | 102 | 105 | 88 | — | — | — | — |
| Ex. 7 | 540 | 0.441 | 0.539 | 117 | 117 | — | — | — | — | — |
| Ex. 8 | 540 | 0.440 | 0.540 | 99 | 101 | — | — | — | — | — |
| Ex. 9 | 540 | 0.430 | 0.545 | 105 | 105 | 84 | 95 | −16 | 75 | 76 |
| Comp. Ex. 1 | 537 | 0.429 | 0.545 | 94 | 96 | 84 | 94 | −14 | 64 | 66 |
| Ex. 10 | 540 | 0.438 | 0.542 | 118 | 120 | 93 | 95 | −13 | 89 | 90 |
| Ex. 11 | 539 | 0.439 | 0.541 | 97 | 98 | 94 | 86 | −10 | 79 | 80 |
| Ex. 12 | 540 | 0.441 | 0.540 | 117 | 120 | 92 | — | — | — | — |
| Ex. 13 | 538 | 0.442 | 0.539 | 98 | 100 | 94 | — | — | — | — |
| Ex. 14 | 541 | 0.441 | 0.540 | 116 | 117 | 94 | — | — | — | — |
| Ex. 15 | 542 | 0.444 | 0.538 | 97 | 98 | 93 | — | — | — | — |
| Ex. 16 | 541 | 0.440 | 0.541 | 113 | 115 | 94 | 95 | −13 | 90 | 91 |
| Ex. 17 | 540 | 0.440 | 0.540 | 94 | 95 | 93 | 86 | −10 | 78 | 79 |
| Ex. 18 | 537 | 0.426 | 0.549 | 108 | 110 | 92 | 93 | −16 | 79 | 81 |
| Comp. Ex. 2 | 534 | 0.426 | 0.548 | 85 | 86 | 88 | 88 | −12 | 65 | 66 |

Notes)
— : Nil or not measured.
Washing with acid: After the firing, washing for 1 hour with a 10% NH$_4$HF$_2$ aqueous solution.
Luminance (%): Relative value to luminance of YAG commercial product (P46-Y3) being 100%.
Emission intensity (%): Relative value to emission intensity of YAG commercial product (P46-Y3) being 100%.

Comparative Example 3

$CaSiN_2$, LaN, $CeO_2$ and $Si_3N_4$ (manufactured by Denki Kagaku Kogyo Kabushiki Kaisha, average particle diameter: 0.5 μm, oxygen content: 0.93 wt %, α-type content: 92%) were weighed as raw materials, and in a crucible made of boron nitride, 1.7 g of the raw material mixture was fired at 2,000° C. under a nitrogen pressure of 0.92 MPa to obtain a phosphor. Here, the charged amounts of the respective raw materials, the firing conditions, etc. are the same as in Example 8 in JP-A-2008-285659. The charged amounts and the firing conditions, etc. are shown in Table 2. Further, the evaluation results of the properties of the obtained phosphor (emission properties, absorption efficiency and object color) are shown in Table 3.

TABLE 2

| Comp. Ex. No. | Charged amounts of the respective raw materials (g) | | | | Charged amount (molar ratio) | | | Firing temp. (° C.) |
|---|---|---|---|---|---|---|---|---|
| | $CaSiN_2$ | LaN | $CeO_2$ | $Si_3N_4$ | Ca | La | Ce | |
| Comp. Ex. 3 | 0.546 | 0.642 | 0.044 | 0.467 | 2.2 | 1.6 | 0.10 | 2000 |

Note)
Charged amounts (molar ratio): Molar ratio of each element to 6 mol of Si charged.

TABLE 3

| Comp. Ex. No. | Emission properties (460 nm excitation) | | | | | Object color | | | |
|---|---|---|---|---|---|---|---|---|---|
| | Emission intensity (%) | Emission peak wavelength (nm) | Chromaticity coordinate x | Chromaticity coordinate y | Absorption efficiency (%) | Luminosity L* | a* | b* | Chroma $(a^{*2}+b^{*2})^{0.5}$ |
| Comp. Ex. 3 | 49 | 591 | 0.519 | 0.473 | 85 | 85 | 8 | 59 | 59 |

Note)
Emission intensity (%): Relative value to luminance of YAG commercial product (P46-Y3) being 100%.

Of the phosphor in Comparative Example 3, a* and b* representing the object color were 8 and 59, respectively; the chroma $(a^{*2}+b^{*2})^{1/2}$ was as low as 59; and the absorption efficiency showed a relatively low value of 85%. From such results, it is evident that the phosphors of the present invention in Examples 1 to 18 have higher luminance than the phosphor in Comparative Example 3 (Example 8 in JP-A-2008-285659) and have high chroma and high absorption efficiency and different values a* and b* for object color.

Comparative Example 4

$CaSiN_2$ powder, $α-Si_3N_4$ powder, LaN powder and $La_4CeSi_{10}$ alloy powder were mixed in weight ratios of 0.352, 0.975, 1.574 and 0.468, respectively. About 0.7 g of the mixture was charged into a crucible made of boron nitride and fired (primary firing) at 2,000° C. under a nitrogen pressure of 0.92 MPa, followed by secondary firing in the presence of $MgF_2$ flux to obtain a phosphor. The raw materials, charged amounts, firing conditions, etc. in this Comparative Example 4 are the same as in Example II-6 in WO2008-132954. The charged raw materials for the phosphor and the firing conditions, etc. in Comparative Example 4 are shown in Table 4. Further, the evaluation results of properties of the obtained phosphor (emission properties, absorption efficiency and object color) are shown in Table 5.

Comparative Example 5

$CaSiN_2$ powder, $β-Si_3N_4$ powder, LaN powder and $La_4CeSi_{10}$ alloy powder were mixed in weight ratios of 0:261, 0.723, 1.168 and 0.347, respectively. About 1.2 g of the mixture was charged into a crucible made of boron nitride and fired (primary firing) at 2,000° C. under a nitrogen pressure of 0.92 MPa, followed by secondary firing in the presence of $MgF_2$ flux to obtain a phosphor. The charged raw materials for the phosphor and the firing conditions, etc. in Comparative Example 5 are shown in Table 4. Further, the evaluation results of the properties of the obtained phosphor (emission properties, absorption efficiency and object color) are shown in Table 5.

TABLE 4

| | Primary firing conditions | | | | Second firing conditions | | | |
|---|---|---|---|---|---|---|---|---|
| Comp. Ex. No. | Charged raw materials | Atmosphere | Pressure (Pa) | Firing temperature × time | Flux | Atmosphere | Pressure (Pa) | Firing temperature × time |
| Comp. Ex. 4 | $La_4CeSi_{10}$ alloy + LaN + α-$Si_3N_4$ + $CaSiN_2$ | N2 | 0.92 | 1,580° C. × 57 hr + 2,000° C. × 0.08 hr | $MgF_2$ 0.9 wt % | N2 | 0.92 | 1,580° C. × 6 hr |
| Comp. Ex. 5 | $La_4CeSi_{10}$ alloy + LaN + β $Si_3N_4$ + $CaSiN_2$ | N2 | 0.92 | 1,580° C. × 57 hr + 2,000° C. × 0.08 hr | $MgF_2$ 0.9 wt % | N2 | 0.92 | 1,580° C. × 6 hr |

TABLE 5

| Comp. Ex. No. | Emission properties (460 nm excitation) | | | | | Object color | | | |
|---|---|---|---|---|---|---|---|---|---|
| | Emission intensity (%) | Emission peak wavelength (nm) | Chromaticity coordinate x | Chromaticity coordinate y | Absorption efficiency (%) | Luminosity L* | a* | b* | Chroma $(a^{*2} + b^{*2})^{0.5}$ |
| Comp. Ex. 4 | 76 | 564 | 0.457 | 0.520 | 83 | 94 | −8 | 62 | 62 |
| Comp. Ex. 5 | 78 | 561 | — | — | 87 | 94 | −7 | 70 | 71 |

Note)
Emission intensity (%): Relative value to luminance of YAG commercial product (P46-Y3) being 100%.

Of the phosphors in Comparative Examples 4 and 5, a* and b* representing the object color were −8 and −7, and 62 and 70, respectively; the chroma $(a^{*2}+b^{*2})^{1/2}$ was as low as 62 and 71, respectively; and the absorption efficiency showed relatively low values of 83 and 87%, respectively.

From such results, it is evident that the phosphors of the present invention in Examples 1 to 18 have higher luminance than the phosphor disclosed in Example in WO2008-132954, have high chroma and high absorption efficiency, and have different values a* and b* of object color.

Example 19

(Low temperature raise in alloy-nitriding temperature region) A phosphor was obtained by firing under the same conditions as in Example 9 except that in Example 9, only in the temperature region of from 1,250 to 1,350° C., the temperature raising rate was changed from 0.5° C./min to 0.1° C./min. The evaluation results of the properties of this phosphor (emission properties, absorption efficiency and object color) are shown in Table 6. Further, the evaluation results of the phosphor in Example 9 are shown for the purpose of comparison in Table 6.

The phosphor in Example 19 had a luminance of 112% to P46-Y3, which was higher than the luminance of 105% in Example 9. This temperature range corresponds to the portion of from rising to termination of the heat generation peak during the nitriding reaction of the raw material alloy. It was found that by reducing the temperature raising rate in this temperature range, it is possible to improve the luminance.

Examples 20 and 21

(Alloy Composition) An experiment was carried out under the same conditions as in Example 19 except that in Example 19, the flux was changed to 6 wt % of $MgF_2$, 6 wt % of $CeF_3$ and 2 wt % of $CaF_2$ (Example 20). An experiment was carried out under the same conditions as in Example 20 except that in this Example 20, the charged raw material was changed to an alloy of $Ca_{0.75}La_{2.6}Ce_{0.1}Si_6$ (Example 21). The charged raw materials for the phosphors (alloy compositions) and the firing conditions, etc. in Examples 20 and 21 are shown in Table 7. Further, the evaluation results of properties of the obtained phosphors (emission properties, absorption efficiency and object color) are shown in Table 8.

TABLE 6

| Comp. Ex. No. | Emission properties (455 nm excitation) | | | | | | Object color | | | |
|---|---|---|---|---|---|---|---|---|---|---|
| | Emission peak wavelength (nm) | Chromaticity coordinate x | Chromaticity coordinate y | Luminance (%) | Emission intensity (%) | Absorption efficiency (%) | Luminosity L* | a* | b* | Chroma $(a^{*2} + b^{*2})^{0.5}$ |
| Ex. 19 | 540 | 0.435 | 0.543 | 112 | 114 | 92 | 94 | −16 | 87 | 88 |
| Ex. 9 | 540 | 0.430 | 0.545 | 105 | 105 | 84 | 95 | −16 | 76 | 77 |

Note)
Luminance (%): Relative value to luminance of YAG commercial product (P46-Y3) being 100%.
Emission intensity (%): Relative value to luminance of YAG commercial product (P46-Y3) being 100%.

TABLE 7

| | Charged raw materials (alloy composition) | Firing conditions | | | | | |
|---|---|---|---|---|---|---|---|
| | | First flux | | Second flux | | Third flux | |
| Ex. No. | | Type | Amount (%) | Type | Amount (%) | Type | Amount (%) |
| Ex. 20 | $Ca_{0.45}La_{2.6}Ce_{0.1}Si_6$ | $MgF_2$ | 6 | $CeF_3$ | 6 | $LaF_3$ | 2 |
| Ex. 21 | $Ca_{0.75}La_{2.6}Ce_{0.1}Si_6$ | $MgF_2$ | 6 | $CeF_3$ | 6 | LaF3 | 2 |

TABLE 8

| | | Emission properties (455 nm excitation) | | | | | | | |
|---|---|---|---|---|---|---|---|---|---|
| | Emission peak | | | | Emission | Object color | | | |
| Comp. Ex. No. | wavelength (nm) | Chromaticity coordinate x | Chromaticity coordinate y | Luminance (%) | intensity (%) | Luminosity L* | a* | b* | Chroma $(a^{*2} + b^{*2})^{0.5}$ |
| Ex. 20 | 540 | 0.434 | 0.543 | 108 | 110 | 97 | −15 | 77 | 79 |
| Ex. 21 | 553 | 0.462 | 0.524 | 109 | 111 | 94 | −7 | 95 | 95 |

Note)
Luminance (%): Relative value to luminance of YAG commercial product (P46-Y3) being 100%.
Emission intensity (%): Relative value to luminance of YAG commercial product (P46-Y3) being 100%.

From the results in Examples 20 and 21, it is evident that when the amount of Ca in the alloy is changed from 0.45 to 0.75, the high luminance is maintained, while the chromaticity coordinate value x is remarkably increased.

The sample in this Example 21 was further subjected to washing with 1N hydrochloric acid, and then the same chemical analysis as in Example A1 was carried out, whereby it was found that the chemical formula of the obtained phosphor, wherein the amount of Si was 6 mol, was found to be $Ca_{0.10}La_{2.6}Ce_{0.29}Si_6N_{11}O_{0.05}$. This substantially agrees to x=0.03, y=0.05, z=0.29 and w1=w2=0.

Examples 22 to 24

(Effects of Rare Earth Fluorides) An experiment was carried out under the same conditions as in Example 19 except that in Example 19, the flux was changed to 6 wt % of $MgF_2$ and 6 wt % of $CeF_3$ (Example 22). An experiment was carried out under the same conditions as in Example 22 except that in this Example 22, the flux was changed to 6 wt % of $MgF_2$, 6 wt % of $CeF_3$ and 6 wt % of $GdF_3$ (Example 23). An experiment was carried out under the same conditions as in Example 22 except that in Example 22, the flux was changed to 6 wt % of $MgF_2$, 6 wt % of $CeF_3$ and 3 wt % of $YF_3$ (Example 24). The firing conditions for the phosphors in Example 22 to 24 and the evaluation results of properties of the obtained phosphors (emission properties) are shown in Table 9.

TABLE 9

| | | | | | | | Emission properties (455 nm excitation) | | |
|---|---|---|---|---|---|---|---|---|---|
| | Firing conditions | | | | | | Emission peak | | |
| | First flux | | Second flux | | Third flux | | | | |
| Ex. No. | Type | Amount (%) | Type | Amount (%) | Type | Amount (%) | wavelength (nm) | Chromaticity coordinate x | Chromaticity coordinate y |
| Ex. 22 | $MgF_2$ | 6 | $CeF_3$ | 6 | | | 546 | 0.445 | 0.537 |
| Ex. 23 | $MgF_2$ | 6 | $CeF_3$ | 6 | $GdF_3$ | 6 | 546 | 0.458 | 0.527 |
| Ex. 24 | $MgF_2$ | 6 | $CeF_3$ | 6 | $YF_3$ | 3 | 547 | 0.452 | 0.530 |

From the results in Examples 22 to 24, it is evident that $YF_3$ and $GdF_3$ have effects to increase the chromaticity coordinate value x. From the measurements by SEM-EDX, it was found that Gd and Y were introduced in the crystal particles of such $GdF_3$ type phosphor (Example 23) and $YF_3$ type phosphor (Example 24). In the crystal particles in Example 23, Gd was found to have been introduced in an amount of about 0.14 mol to 6 mol of Si. It is considered that Gd or Y was substituted for La to present an influence over the crystal field in the vicinity of the Ce activation element, so that the emission color was changed.

Examples 25 to 30

Types of Flux Experiments were carried out in the same manner as in Example 1 except that in Example 1, the temperature raising rate from 800° C. was increased to 10"C/min, the firing temperature was changed to 1,450° C., and the flux was changed to $MgF_2$, LIE, NaCl, KCL, $BaCl_2$ or $CaF_2$ (Examples 25 to 30). The firing conditions (fluxes) for the phosphors and the evaluation results of properties of the obtained phosphors (emission properties) in Examples 25 to 30 are shown in Table 10.

TABLE 10

| | Firing conditions (flux) | | Emission properties (455 nm excitation) | | |
|---|---|---|---|---|---|
| | | | Emission peak | | |
| Ex No. | Type | Amount (%) | wavelength (nm) | Chromaticity coordinate x | Chromaticity coordinate y |
| Ex. 25 | $MgF_2$ | 3 | 542 | 0.433 | 0.536 |
| Ex. 26 | LiF | 3 | 546 | 0.442 | 0.530 |
| Ex. 27 | NaCl | 3 | 556 | 0.444 | 0.530 |
| Ex. 28 | KCl | 3 | 554 | 0.446 | 0.529 |
| Ex. 29 | $BaCl_2$ | 3 | 553 | 0.454 | 0.525 |
| Ex. 30 | $CaF_2$ | 10 | 554 | 0.443 | 0.530 |

From the results in Example 25 to 30, it is evident that relative to $MgF_2$, LiF, NaCl, KCL, $BaCl_2$ or $CaF_2$ has an effect to increase the chromaticity coordinate value x.

Examples 31 to 36

With respect to phosphors obtained in the same manner as in Example 1 except that the firing conditions were changed to the conditions shown in Table 11, the effects of cleaning with an acid were studied (Examples 31 to 36). The conditions for acid cleaning and the emission properties of these phosphors are shown in Table 12.

TABLE 11

| | Firing conditions | | | | | | |
|---|---|---|---|---|---|---|---|
| | Alloy raw material | First flux | | Second flux | | Temp.-raising rate | Firing temp. | Firing time |
| Ex. No. | Amount (g) | Type | Amount (%) | Type | Amount (%) | (° C.) | (° C.) | (hr) |
| Ex. 31 | 14 | $MgF_2$ | 6 | $CeF_3$ | 6 | 0.1 | 1550 | 15 |
| Ex. 32 | 14 | $MgF_2$ | 6 | $CeF_3$ | 6 | 0.1 | 1550 | 15 |
| Ex. 33 | 14 | $MgF_2$ | 6 | $CeF_3$ | 6 | 0.1 | 1550 | 15 |
| Ex. 34 | 1 | $MgF_2$ | 6 | — | — | 0.5 | 1500 | 40 |
| Ex. 35 | 1 | $MgF_2$ | 6 | — | — | 0.5 | 1500 | 40 |
| Ex. 36 | 1 | $MgF_2$ | 6 | — | — | 0.5 | 1500 | 40 |

Note)
Temperature-raising rate: The temperature raising rate (° C.) in a region of from 1,250 to 1,350° C.

TABLE 12-1

| | Acid cleaning conditions | | | Emission properties (455 nm excitation) | | | | |
|---|---|---|---|---|---|---|---|---|
| Ex. No. | Type of acid | Concentration (wt %) | Time (hr) | Emission peak wavelength (nm) | Chromaticity coordinate x | Chromaticity coordinate y | Luminance (%) | Emission intensity (%) |
| Ex. 31 | — | — | — | 545 | 0.443 | 0.530 | 100 | 100 |
| Ex. 32 | $NH_4HF_2$ | 5 | 1 | 546 | 0.446 | 0.530 | 116 | 116 |
| Ex. 33 | $NH_4HF_2$ | 10 | 1 | 546 | 0.443 | 0.531 | 109 | 109 |
| Ex. 34 | — | — | — | 540 | 0.433 | 0.541 | 100 | 100 |
| Ex. 35 | $NH_4HF_2$ | 10 | 1 | 541 | 0.433 | 0.542 | 112 | 116 |
| Ex. 36 | $HNO_3$ | 35 | 1 | 541 | 0.436 | 0.541 | 112 | 116 |

Notes)
—: Nil.
Luminance (%): Relative value to luminance of a phosphor obtained under the same conditions without acid washing being 100%.
Emission intensity (%): Relative value to the emission strength of a phosphor obtained under the same conditions without acid cleaning being 100%.

From the comparison of Examples 31 and 32, it is evident that when ammonium hydrogen fluoride ($NH_4HF_2$) is 5%, the relative luminance increases by 16% between before and after the treatment, and from the comparison of Examples 31 and 33, the relative luminance increases by 9% when the ammonium hydrogen fluoride is 10%. From the results of Examples 34 to 36, it is evident that when 35% nitric acid is used instead of 10% ammonium hydrogen fluoride, the luminance increases by 12% between before and after the treatment.

Example A1

(Production of Alloy)

La metal and Si metal were mixed and melted by an arc melting method in an argon atmosphere to obtain a LaSi alloy. This alloy was pulverized by a jet mill to obtain an alloy powder having a weight median diameter of 7 μm.

(Firing of Raw Material)

In a glove box containing nitrogen as the operation atmosphere, 2.254 g of the alloy powder, 0.631 g of α-silicon nitride (SN-E10 manufactured by Ube Industries, Ltd.) and 0.177 g of $CeF_3$ were mixed in an alumina mortar, and the mixture was filled in a molybdenum crucible having a diameter of 20 mm. After covering with a molybdenum foil, the crucible was set in an atmosphere firing electric furnace. After vacuuming from room temperature to 300° C., 4% hydrogen-containing nitrogen gas was introduced to ordinary pressure, and the temperature was raised to 1,500° C. and maintained at 1,500° C. for 12 hours, followed by cooling to take out a fired product.

(Treatment of Fired Product)

The obtained fired product was pulverized in an alumina mortar, and the obtained powder was repeatedly stirred with 1 mol/L hydrochloric acid, cleaned, left to stand still and subjected to removal of the supernatant, and further left to stand still for 1 day and night, followed by washing with water and drying to obtain a phosphor.

(Evaluations)

The production conditions and the evaluation results of properties (emission properties, absorption efficiency, object color, etc.) of this phosphor are shown in Tables 12-5 and 12-6. Here, the luminance (%) and the emission intensity (%) are relatively values to a YAG commercial product (P46-Y3 manufactured by Kasei Optonix) being 100%. The phosphor in Example A1 had a very high luminance of 137% to P46-Y3; a* and b* representing the object color were −19.4 and 81.3, respectively; the chroma $(a^{*2}+b^{*2})^{1/2}$ was high at 83.5; and the absorption efficiency was very high at 92%.

As a result of the compositional analysis of this phosphor, the contents of La, Ce, Si, N and O were 52.0, 3.74, 22.3, 20.9 and 1.0 wt %, respectively. On this basis, the molar ratio was calculated based on the total number of moles of La and Ce being 3, La:Ce:Si:N:O=2.8:0.2:6.0:11:0.47. Here, the contents of La, Ce and Si were measured by an inductively coupled plasma atomic emission spectroscopy by using a solution prepared by dissolving the phosphor treated by alkali fusion treatment. The contents of O and N were measured by means of an oxygen/nitrogen analyzer TC600 manufactured by LECO. It is considered that since this phosphor was sufficiently cleaned with hydrochloric acid, a part of the phosphor was dissolved and converted to an oxide or hydroxide, whereby oxygen was detected to some extent. Otherwise, the ratio of La, Ce, Si and N agreed to the composition of a $(La,Ce)_3Si_6N_{11}$ crystal.

The powder X-ray diffraction pattern of this phosphor is shown in FIG. 4. A pattern was obtained which substantially agreed to No. 48-1805 of ICDD-JCPDS-PDF data which is a standard pattern of $La_3Si_6N_{11}$.

Examples A2 to A6

Phosphors were obtained by carrying out the same treatment as in Example A1 except that the composition of the raw material was changed as follows.

TABLE 12-2

|  | LaSi | $Si_3N_4$ | $CeF_3$ | $YH_3$ | $YF_3$ |
|---|---|---|---|---|---|
| Ex. A2 | 2.254 | 0.631 | 0.177 | 0.165 | 0 |
| Ex. A3 | 2.254 | 0.631 | 0.177 | 0.083 | 0.131 |
| Ex. A4 | 2.254 | 0.631 | 0.177 | 0.083 | 0 |
| Ex. A5 | 2.254 | 0.568 | 0.177 | 0.083 | 0.131 |
| Ex. A6 | 2.254 | 0.732 | 0.177 | 0.083 | 0.131 |

The production conditions and the evaluation results of properties of the obtained phosphors are shown in Tables 12-5 and 12-6.

In Example A2, by the addition of $YH_3$, the emission wavelength shifted towards a long wavelength side, but the luminance, etc. were deteriorated.

In Example A3, the same amount (molar amount) of Y as in Example A2 was added, but a part of $YH_3$ was added as $YF_3$, whereby the amount of fluorine in the system was increased, and the crystal growth was promoted, whereby the amount of Y taken into the phosphor was increased, and the emission wavelength shifted further to the long wavelength side. At the same time, the crystallinity became high, and the emission intensity became higher than in Example A2.

In Example A4, the amount of $YH_3$ was made to be a half as compared with Example A2. The chromaticity coordinate x and the luminance became intermediate values between Examples A1 and A2.

Example A5 represents a phosphor obtained by the same procedure as in Example A3 except that the amount of $Si_3N_4$ added was reduced. By the reduction of silicon nitride, the luminance and chroma decreased substantially, and the reason is considered to be an increase of byproducts which hinder the emission.

Example A6 represents a phosphor obtained by the same procedure as in Example A3 except that the amount of $Si_3N_4$ added was increased. By the increase of silicon nitride, the luminance and chroma were improved, and the reason is considered to be a reduction of byproducts which hinder the emission, contrary to Example A5.

Example A7

La metal and Si metal were mixed and melted by means of an arc melting method in an argon atmosphere to obtain a LaSi alloy. In a glove box containing nitrogen as an operation atmosphere, this alloy was pulverized in an alumina mortar and passed through a nylon mesh having an aperture of 25 μm.

In a glove box containing nitrogen as an operation atmosphere, 7.032 g of such an alloy powder, 1.97 g of α-silicon nitride (SN-E10 manufactured by Ube Industries, Ltd.) and 0.541 g of $CeF_3$ were mixed in an alumina mortar, and 3.1 g of this mixture was sampled and filled in a molybdenum crucible having a diameter of 20 mm. After covering with a molybdenum foil, the crucible was set in an atmosphere firing electric furnace. After vacuuming from room temperature to 300° C., 4% hydrogen-containing nitrogen gas was introduced to ordinary pressure, and the temperature was raised to 1,500° C. and maintained at 1,500° C. for 12 hours, followed by cooling to take out a fired product.

The obtained fired product was pulverized in an alumina mortar, and the obtained powder was stirred and cleaned with 1 mol/L hydrochloric acid, followed by washing with water and drying to obtain a phosphor.

The production conditions and the evaluation results of properties (emission properties, absorption efficiency, object color, etc.) of this phosphor are shown in Tables 12-5 and 12-6. This Example is one carried out substantially in the same procedure as in Example A1, but the pulverization method of the alloy is different, whereby the property values such as the luminance and chroma were different to some extent from those in Example A1.

As a result of the compositional analysis of this phosphor, the contents of La, Ce, Si, N and O were 53.0, 3.69, 22.3, 21.0 and 0.2 wt %, respectively. On this basis, the to molar ratios were calculated based on the total number of moles of La and Ce being 3, whereby La:Ce:Si:N:O=2.8:0.2:5.9:11:0.08.

Here, the quantitative measurement was carried out in the same method as carried out for the phosphor in Example A1. Thus, the results of measurement which substantially agree to the desired composition of the $(La,Ce)_3Si_6N_{11}$ phosphor, were obtained. The powder X-ray diffraction pattern of this phosphor is shown in FIG. 5. A pattern which substantially agrees to No. 48-1805 of ICDD-JCPDS-PDF data being a standard pattern of $La_3Si_6N_{11}$, was obtained.

Example A8

La metal and Si metal were mixed and melted by means of an arc melting method in an argon atmosphere to obtain a LaSi alloy. This alloy was pulverized by a jet mill to obtain an ally powder having a weight median diameter of 10 μm. The raw materials were weighed in the following weight ratio and mixed in an alumina mortar.

LaSi alloy=2.344 g, $Si_3N_4$=0.656 g, and $CeF_3$=0.18 g

The subsequent procedure was the same as in Example A1, and a phosphor was produced. The production conditions and the evaluation results of properties of the obtained phosphor are shown in Tables 12-5 and 12-6. This phosphor was not subjected to cleaning treatment, and therefore, the luminance and chroma were inferior as compared with the phosphor subjected to cleaning treatment with hydrochloric acid (the following Example A9).

Example A9

The phosphor in Example A8 was put in 1 mol/L hydrochloric acid and stirred. It was washed with water and dried to obtain a phosphor. The production conditions and the evaluation results of properties of the obtained phosphor are shown in Tables 12-5 and 12-6. The luminance of the phosphor in this Example was substantially the same as in Example A1, and the chroma of the phosphor in this Example was higher than the phosphor in Example A1.

Example A10

La metal and Si metal were mixed and dissolved by means of a high frequency melting method in a water-cooled copper crucible in an argon atmosphere to obtain a LaSi alloy. This alloy was pulverized by a jet mill to obtain an alloy powder having a weight median diameter of 11 μm. The raw materials were weighed in the following weight ratio and mixed in an alumina mortar.

Using the mixture, a phosphor was produced by the same procedure as in Examples A8 and A9. The production conditions and the evaluation results of properties of the obtained phosphor are shown in Tables 12-5 and 12-6.

Example A11

The respective metal raw materials were mixed so that the ratio of La, Ce, Y and Si became 0.42:0.03:0.05:0.5 and melted by means of an arc melting method in an argon atmosphere to obtain a (La,Ce,Y)Si alloy. This alloy was pulverized in an alumina mortar in a glove box with a nitrogen atmosphere and passed through a nylon mesh having an aperture of 37 μm.

Using this alloy, a phosphor was obtained by carrying out the same procedure as in Example A1 except that the blend raw materials and weight ratio were changed as follows.

(La,Ce,Y)Si alloy=2.328 g, $Si_3N_4$=0.672 g, and $LaF_3$=0.18 g

The production conditions and the evaluation results of properties of the obtained phosphor are shown in Tables 12-5 and 12-6.

Example A12

The respective raw materials were mixed so that the ratio of La, Ce, Y and Si became 0.42:0.03:0.05:0.5 and dissolved by means of a high frequency melting method in a water-cooled copper crucible in an argon atmosphere to obtain a (La,Ce,Y)Si alloy. This alloy was pulverized by a jet mill to obtain an alloy powder having a weight median diameter of 12 μm.

Using this alloy, a phosphor was obtained by carrying out the same procedure as in Example A1 except that the blend raw materials and weight ratio were changed as follows.

(La,Ce,Y)Si alloy=2.390 g, $Si_3N_4$=0.610 g, and $LaF_3$=0.18 g

The production conditions and the evaluation results of properties of the obtained phosphor are shown in Tables 12-5 and 12-6.

Example A13

La metal, Ce metal and Si metal were mixed so that the ratio of La:Ce:Si became 2.9:0.1:3.0 and melted by means of an arc melting method in an argon atmosphere to obtain a LaSi alloy. This alloy was pulverized by an alumina mortar in a glove box with a nitrogen atmosphere and passed through a nylon mesh having an aperture of 25 μm.

In a glove box containing nitrogen as an operation atmosphere, 2.345 g of such an alloy powder, 0.656 g of α-silicon nitride (SN-E10 manufactured by Ube Industries, Ltd.) and 0.180 g of $CeF_3$ were mixed in an alumina mortar, and the mixture was filled in a molybdenum crucible having a diameter of 20 mm, and after covering with a molybdenum foil, the crucible was set in an atmosphere firing electric furnace. After vacuuming from room temperature to 300° C., 4% hydrogen-containing nitrogen gas was introduced to ordinary pressure, and the temperature was raised to 1,500° C. and maintained at 1,500° C. for 12 hours, followed by cooling to take out a fired product.

The obtained fired product was pulverized in an alumina mortar, and the obtained powder was put in 1 mol/L hydrochloric acid and stirred. The mixture was left to stand still for 1 day and night, and then, the supernatant was removed, followed by washing with water and drying to obtain a phosphor. The production conditions and the evaluation results of properties (emission properties, absorption efficiency, object color, etc.) of this phosphor are shown in Tables 12-5 and 12-6.

Examples A14 to A17 and Comparative Example A1

Phosphors were obtained in the same manner as in Example A13 except that the composition of the alloy and the blend composition were changed as follows.

TABLE 12-3

| | Alloy compositional ratio (La:Ce:Gd:Si) | | | | Blend amounts | | | |
|---|---|---|---|---|---|---|---|---|
| | La | Ce | Gd | Si | Alloy | $Si_3N_4$ | $CeF_3$ | $LaF_3$ |
| Comp Ex. A1 | 2.7 | 0.3 | 0 | 3 | 2.344 | 0.655 | 0 | 0 |
| Ex. A14 | 2.7 | 0.3 | 0 | 3 | 2.344 | 0.656 | 0 | 0.179 |
| Ex. A15 | 2.7 | 0.3 | 0 | 3 | 2.345 | 0.656 | 0.180 | 0 |
| Ex. A16 | 2.6 | 0.1 | 0.3 | 3 | 2.349 | 0.650 | 0 | 0.180 |
| Ex. A17 | 2.4 | 0.3 | 0.3 | 3 | 2.349 | 0.651 | 0 | 0.180 |

The production conditions and the evaluation results of properties (emission properties, absorption efficiency, object color, etc.) of the phosphors are shown in Tables 12-5 and 12-6. The phosphor in Comparative Example A1 had no fluoride added, and therefore, the luminance was low, and the chroma was also small.

By changing the amount of Ce in the raw materials as in Examples A14 and A15, it is possible to change the emission color (chromaticity coordinates). By incorporation Ge to the alloy as in Examples A16 and A17, it is possible to change the emission color.

Example A18

La metal, Ce metal and Si metal were mixed so that the ratio of La:Ce;Si became 4.05:0.45:5.5 and melted by means of an arc melting method in an argon atmosphere to obtain a LaSi alloy. This alloy was pulverized by an alumina mortar in a glove box with a nitrogen atmosphere and passed through a nylon mesh having an aperture of 25 μm.

In a glove box containing nitrogen as an operation atmosphere, 2.481 g of such an alloy powder, 0.520 g of α-silicon nitride (SN-E10 manufactured by Ube Industries, Ltd.) and 0.180 g of $LaF_3$ were mixed in an alumina mortar, and the mixture was filled in a molybdenum crucible having a diameter of 20 mm, and after covering with a molybdenum foil, the crucible was set in an atmosphere firing electric furnace. After vacuuming from room temperature to 300° C., 4% hydrogen-containing nitrogen gas was introduced to ordinary pressure, and the temperature was raised to 1,500° C. and maintained at 1,500° C. for 12 hours, followed by cooling to take out a fired product.

The obtained fired product was pulverized in an alumina mortar, and the obtained powder was put in 1 mol/L hydrochloric acid and stirred. The mixture was left to stand still for 1 day and night, and then, the supernatant was removed, followed by washing with water and drying to obtain a phosphor.

The production conditions and the evaluation results of properties (emission properties, absorption efficiency, object color, etc.) of this phosphor are shown in Tables 12-5 and 12-6.

Examples A19 to A22

Phosphors were obtained by treatment in the same manner as in Example A18 except that the composition of the alloy and the blend composition were changed as follows.

TABLE 12-4

| | Alloy compositional ratio (La:Ce:Si) | | | Blend amounts (g) | | |
|---|---|---|---|---|---|---|
| | La | Ce | Si | Alloy | $Si_3N_4$ | $LaF_3$ |
| Ex. A19 | 2.7 | 0.3 | 3 | 2.344 | 0.656 | 0.18 |
| Ex. A20 | 4.5 | 0.5 | 4 | 2.226 | 0.774 | 0.18 |
| Ex. A21 | 2.7 | 0.3 | 2 | 2.150 | 0.85 | 0.18 |
| Ex. A22 | 4.5 | 0.5 | 3 | 2.112 | 0.888 | 0.18 |

The production conditions and the evaluation results of properties (emission properties, absorption efficiency, object color, etc.) of these phosphors are shown in Tables 12-5 and 12-6.

Phosphors in Examples A18 to A22 are ones prepared from raw materials obtained by mixing an alloy having a different ratio of (La+Ce) and Si, and $Si_3N_4$ to obtain the desired phosphor composition, and further mixing a fluoride flux. It was found that even by using such raw materials, it was possible to prepare a $(La,Ce)_3Si_6N_{11}$ phosphor.

Example A23

La metal and Si metal were mixed and melted by means of an arc melting method in an argon atmosphere to obtain a LaSi alloy. This alloy was pulverized by an alumina mortar in a glove box with a nitrogen atmosphere and passed through a nylon mesh having an aperture of 37 µm.

In a glove box containing nitrogen as an operation atmosphere, 2.344 g of such an alloy powder, 0.656 g of α-silicon nitride (SN-E10 manufactured by Ube Industries, Ltd.) and 0.180 g of $CeF_3$ were mixed in an alumina mortar, and the mixture was filled in a molybdenum crucible having a diameter of 20 mm, and after covering with a molybdenum foil, the crucible was set in an atmosphere firing electric furnace. After vacuuming from room temperature to 300° C., 4% hydrogen-containing nitrogen gas was introduced to ordinary pressure, and the temperature was raised to 1,500° C. and maintained at 1,500° C. for 36 hours, followed by cooling to take out a fired product.

The obtained fired product was pulverized in an alumina mortar, and the obtained powder was put in 1 mol/L hydrochloric acid and stirred. The mixture was left to stand still for 1 day and night, and then, the supernatant was removed, followed by washing with water and drying to obtain a phosphor.

Example A24

In the procedure of Example A23, the heating temperature and time were changed to 1,550° C. for 12 hours, to obtain a phosphor.

TABLE 12-5

| | Production conditions | | | | |
|---|---|---|---|---|---|
| | Pulverization | Alloy composition | Additives (in the bracket, molar ratio to $La_3Si_6N_{11}$ is indicated) | Firing temperature (° C.) | Retention time (hr) |
| Ex. A1 | Jet mill 7 µm | LaSi | CeF3(0.2) | 1500 | 12 |
| Ex. A2 | Jet mill 7 µm | LaSi | CeF3(0.2) + YH3(0.4) | 1500 | 12 |
| Ex. A3 | Jet mill 7 µm | LaSi | CeF3(0.2) + YH3(0.2) + YF3(0.2) | 1500 | 12 |
| Ex. A4 | Jet mill 7 µm | LaSi | CeF3(0.2) + YH3(0.2) | 1500 | 12 |
| Ex. A5 | Jet mill 7 µm | LaSi | CeF3(0.2) + YH3(0.2) + YF3(0.2) | 1500 | 12 |
| Ex. A6 | Jet mill 7 µm | LaSi | CeF3(0.2) + YH3(0.2) + YF3(0.2) | 1500 | 12 |
| Ex. A7 | Aperture 25 µm | LaSi | CeF3(0.2) | 1500 | 12 |
| Ex. A8 | Jet mill 10 µm | LaSi | CeF3(0.2) | 1500 | 12 |
| Ex. A9 | Jet mill 10 µm | LaSi | CeF3(0.2) | 1500 | 12 |
| Ex. A10 | Jet mill 11 µm | LaSi | CeF3(0.2) | 1500 | 12 |
| Ex. A11 | Aperture 37 µm | (La0.84Ce0.06Y0.1)Si | CeF3(0.2) | 1500 | 12 |
| Ex. A12 | Jet mill 12 µm | (La0.84Ce0.06Y0.1)Si | CeF3(0.2) | 1500 | 12 |
| Ex. A13 | Aperture 25 µm | (La2.9Ce0.1)Si3 | CeF3(0.2) | 1500 | 12 |
| Comp. Ex. A1 | Aperture 25 µm | (La2.7Ce0.3)Si3 | Nil | 1500 | 12 |
| Ex. A14 | Aperture 25 µm | (La2.7Ce0.3)Si3 | LaF3(0.2) | 1500 | 12 |
| Ex. A15 | Aperture 25 µm | (La2.7Ce0.3)Si3 | CeF3(0.2) | 1500 | 12 |
| Ex. A16 | Aperture 25 µm | (La2.6Ce0.1Gd0.3)Si3 | LaF3(0.2) | 1500 | 12 |
| Ex. A17 | Aperture 25 µm | (La2.4Ce0.3Gd0.3)Si3 | LaF3(0.2) | 1500 | 12 |
| Ex. A18 | Aperture 25 µm | (La4.05Ce0.45)Si5.5 | LaF3(0.2) | 1500 | 12 |
| Ex. A19 | Aperture 25 µm | (La2.7Ce0.3)Si3 | LaF3(0.2) | 1500 | 12 |
| Ex. A20 | Aperture 25 µm | (La4.5Ce0.5)Si4 | LaF3(0.2) | 1500 | 12 |
| Ex. A21 | Aperture 25 µm | (La2.7Ce0.3)Si2 | LaF3(0.2) | 1500 | 12 |
| Ex. A22 | Aperture 25 µm | (La4.5Ce0.5)Si3 | LaF3(0.2) | 1500 | 12 |
| Ex. A23 | Aperture 37 µm | LaSi | CeF3(0.2) | 1500 | 36 |
| Ex. A24 | Aperture 37 µm | LaSi | CeF3(0.2) | 1550 | 12 |

TABLE 12-6

| | Properties of phosphor | | | | | | | | |
|---|---|---|---|---|---|---|---|---|---|
| | Emission peak wavelength (nm) | Chromaticity coordinate value x | Chromaticity coordinate value y | Luminance (%) | Emission peak intensity (%) | Internal quantum yield (%) | Absorption efficiency (%) | External quantum yield (%) | Reflectance (770 nm) |
| Ex. A1 | 531 | 0.414 | 0.557 | 137 | 146 | 74.6 | 91.6 | 68.3 | 87.3 |
| Ex. A2 | 538 | 0.431 | 0.544 | 110 | 112 | 65.3 | 88.3 | 57.7 | 85.6 |
| Ex. A3 | 545 | 0.443 | 0.538 | 117 | 122 | 66.5 | 92.2 | 61.3 | 84.1 |
| Ex. A4 | 537 | 0.426 | 0.548 | 120 | 123 | 67.2 | 91.0 | 61.1 | 85.8 |
| Ex. A5 | 545 | 0.446 | 0.534 | 87 | 89 | 52.0 | 88.9 | 46.3 | 77.0 |
| Ex. A6 | 541 | 0.445 | 0.538 | 123 | 130 | 68.2 | 93.1 | 63.5 | 78.0 |
| Ex. A7 | 535 | 0.427 | 0.551 | 128 | 134 | 67.3 | 94.4 | 63.5 | 80.5 |
| Ex. A8 | 533 | 0.420 | 0.552 | 103 | 107 | 55.1 | 89.8 | 49.4 | 84.1 |
| Ex. A9 | 532 | 0.418 | 0.555 | 136 | 144 | 66.5 | 94.4 | 62.8 | 84.0 |
| Ex. A10 | 533 | 0.417 | 0.555 | 131 | 138 | 66.5 | 93.7 | 62.4 | 83.7 |
| Ex. A11 | 537 | 0.433 | 0.545 | 109 | 114 | 56.9 | 92.7 | 52.8 | 71.1 |
| Ex. A12 | 540 | 0.433 | 0.544 | 111 | 116 | 56.9 | 92.6 | 52.6 | 72.6 |
| Ex. A13 | 533 | 0.420 | 0.554 | 124 | 131 | 67.7 | 91.0 | 61.6 | 82.8 |
| Comp. Ex. A1 | 533 | 0.421 | 0.549 | 78 | 80 | 41.5 | 89.6 | 37.2 | 64.2 |
| Ex. A14 | 534 | 0.423 | 0.553 | 124 | 131 | 67.7 | 92.1 | 62.4 | 82.2 |
| Ex. A15 | 537 | 0.434 | 0.546 | 118 | 123 | 64.2 | 93.5 | 60.0 | 81.5 |
| Ex. A16 | 537 | 0.426 | 0.549 | 103 | 109 | 62.1 | 87.6 | 54.4 | 74.3 |
| Ex. A17 | 542 | 0.442 | 0.540 | 107 | 113 | 59.6 | 92.3 | 55.0 | 72.6 |
| Ex. A18 | 536 | 0.421 | 0.553 | 129 | 135 | 68.6 | 92.9 | 63.8 | 83.5 |
| Ex. A19 | 533 | 0.423 | 0.553 | 122 | 127 | 63.5 | 93.3 | 59.2 | 77.8 |
| Ex. A20 | 535 | 0.422 | 0.552 | 121 | 127 | 64.8 | 92.5 | 59.9 | 80.5 |
| Ex. A21 | 536 | 0.423 | 0.551 | 118 | 122 | 62.8 | 92.8 | 58.3 | 80.1 |
| Ex. A22 | 534 | 0.424 | 0.551 | 122 | 126 | 64.4 | 93.1 | 59.9 | 81.5 |
| Ex. A23 | 533 | 0.419 | 0.555 | 132 | 141 | 70.2 | 92.7 | 65.1 | 83.1 |
| Ex. A24 | 533 | 0.415 | 0.556 | 126 | 134 | 72.5 | 88.9 | 64.5 | 85.6 |

| | Object color | | | |
|---|---|---|---|---|
| | Luminosity L* | a* | b* | Chroma $(a^{*2} + b^{*2})^{0.5}$ |
| Ex. A1 | 99.43 | −19.39 | 81.25 | 83.5 |
| Ex. A2 | 96.17 | −13.12 | 75.14 | 76.3 |
| Ex. A3 | 97.2 | −12.89 | 85.96 | 86.9 |
| Ex. A4 | 96.77 | −14.68 | 78.87 | 80.2 |
| Ex. A5 | 91.97 | −8.51 | 79.97 | 71.5 |
| Ex. A6 | 96.41 | −13.34 | 90.63 | 91.6 |
| Ex. A7 | 96.91 | −16.54 | 94.37 | 95.8 |
| Ex. A8 | 93.97 | −13.53 | 73.32 | 74.6 |
| Ex. A9 | 99.11 | −19.03 | 89.4 | 91.4 |
| Ex. A10 | 97.96 | −18.76 | 86.88 | 88.9 |
| Ex. A11 | 92.55 | −15.33 | 79.34 | 80.8 |
| Ex. A12 | 92.97 | −15.15 | 77 | 78.5 |
| Ex. A13 | 98.16 | −18.45 | 81.78 | 83.8 |
| Comp. Ex. A1 | 82.49 | −10.78 | 60.54 | 61.5 |
| Ex. A14 | 97.32 | −17.87 | 87.02 | 88.8 |
| Ex. A15 | 95.73 | −13.97 | 90.02 | 91.1 |
| Ex. A16 | 94.67 | −17.12 | 72.87 | 74.9 |
| Ex. A17 | 92.33 | −13.51 | 85.07 | 86.1 |
| Ex. A18 | 97.03 | −18.09 | 84.76 | 86.7 |
| Ex. A19 | 94.72 | −17.32 | 86.04 | 87.8 |
| Ex. A20 | 96.23 | −17.46 | 83.89 | 85.7 |
| Ex. A21 | 85.69 | −17.25 | 81.5 | 83.3 |
| Ex. A22 | 96.08 | −16.63 | 84.88 | 86.5 |
| Ex. A23 | 98.15 | −19.07 | 89.43 | 91.4 |
| Ex. A24 | 98.85 | −19.08 | 77.99 | 80.3 |

Examples 37 to 40

(Production of Phosphor (LSCN))

A phosphor powder (LCSN) was obtained by carrying out an experiment in the same manner as in Example 19 except that in Example 19, the flux was changed to 6 wt % of $MgF_2$ and 6 wt % of $CeF_3$, and as a treatment after the firing, stirring/cleaning with 5N hydrochloric acid was added after the stirring/cleaning with the 10% $NH_4HF_2$ aqueous solution. The emission properties of this phosphor under excitation with 455 nm were such that the chromaticity coordinate value x was 0.451, the value y was 0.533, the emission peak wavelength was 546 nm, and the luminance to P46-Y3 was 113%.

(Production of Light-Emitting Device)

A white light-emitting device was prepared by combining the obtained phosphor (LCSN) and a short wavelength blue-emitting GAN type LED chip (ES-CEDBV15 manufactured by Epistar). Here, in order to disperse and seal the above phosphor powder, a sealing material silicone resin (SCR-1011 manufactured by Shin-Etsu Chemical Co., Ltd.) and a dispersant (REOLOSIL QS-30 manufactured by Tokuyama Corporation) were used. A phosphor composition was prepared by adjusting the weight ratio of the phosphor (LCSN):the sealing material (SCR1011):the dispersant (QS30) to be w:100:2, wherein w was as shown in Table 13. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained light-emitting device are shown in Table 13. As shown by the chromaticity coordinate values x and y in Table 13, it is evident that white emission can easily be realized by only one type of this phosphor. In the case of white light of (x,y)=(0.330,0.327) in the light-emitting device in Example 38, the average color rendering evaluation number Ra was 68.2, and the emission efficiency was 81.5 Lm/W. By changing the filling amount of LCSN, the emission color can be freely changed from a bluish white color to a yellowish white color.

1011 manufactured by Shin-Etsu Chemical Co., Ltd.) and a dispersant (REOLOSIL QS-30 manufactured by Tokuyama Corporation) were used. A phosphor composition was prepared by adjusting the weight ratio of the phosphor (LCSN): the sealing material (SCR1011):the dispersant (QS30) to be w:100:2, wherein w was as shown in Table 14. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained white light-emitting device are shown in Table 14. As shown by the chromaticity coordinate values x and y in Table 14, it is

TABLE 13

| | Mixing amounts of raw materials | | | | | LED device | | |
|---|---|---|---|---|---|---|---|---|
| Ex. No. | Amount of LCSN (w) | SCR1011 A (g) | SCR1011 B (g) | QS30 (g) | Amount of LCSN (g) | x | y | Lumen |
| Ex. 37 | 3 | 0.50 | 0.50 | 0.02 | 0.03 | 0.271 | 0.225 | 5.11 |
| Ex. 38 | 6 | 0.50 | 0.50 | 0.02 | 0.06 | 0.330 | 0.327 | 5.30 |
| Ex. 39 | 9 | 0.50 | 0.50 | 0.02 | 0.09 | 0.399 | 0.440 | 5.93 |
| Ex. 40 | 12 | 0.50 | 0.50 | 0.02 | 0.12 | 0.434 | 0.486 | 5.15 |

| | LED device | | | Short wavelength blue LED ES-CEDBV15) | | | | |
|---|---|---|---|---|---|---|---|---|
| Ex. No. | Luminous power (lm/W) (lumen/W1) | Emission efficiency (lm/W) (lumen/W2) | Ra | Peak wavelength (nm) | W1 (mW) | Applied voltage (V) | Applied current (mA) | Applied voltage × current W2 (mW) |
| Ex. 37 | 238 | 77.5 | 69.8 | 441 | 21.48 | 3.30 | 20.0 | 66.0 |
| Ex. 38 | 319 | 81.5 | 68.2 | 442 | 16.59 | 3.30 | 19.7 | 65.0 |
| Ex. 39 | 388 | 92.5 | 60.9 | 443 | 15.29 | 3.34 | 19.2 | 64.1 |
| Ex. 40 | 417 | 80.7 | 59.4 | 443 | 12.36 | 3.34 | 19.1 | 63.8 |

Examples 41 to 44

(Production of Phosphor (LCSN))

A phosphor powder (LCSN) was obtained in the same manner as in Examples 37 to 40.

(Production of Light-Emitting Device)

A white light-emitting device was prepared by combining the obtained phosphor (LCSN) and a long wavelength blue-emitting GAN type LED chip (NL8436W manufactured by Showa Denko). Here, in order to disperse and seal the above phosphor powder, a sealing material silicone resin (SCR-evident that white emission can easily be realized by only one type of this phosphor. Further, the emission color can freely be changed from bluish white to yellowish white by changing the filling amount of LSCN. In the case of white light of (x,y)=(0.349, 0.369) in the light-emitting device in Example 42, the average color rendering evaluation number Ra was 68.3, and the emission efficiency was 77.7 Lm/W. When compared with the same emission color, it is evident that the results in Table 13 using short wavelength blue LED showed higher emission efficiency than the results in Table 14 using long wavelength blue LED.

TABLE 14

| | Mixing amounts of raw materials | | | | | LED device | | |
|---|---|---|---|---|---|---|---|---|
| Ex. No. | Amount of LCSN (w) | SCR1011 A (g) | SCR1011 B (g) | QS30 (g) | Amount of LCSN (g) | x | y | Lumen |
| Ex. 41 | 3 | 0.50 | 0.50 | 0.02 | 0.03 | 0.267 | 0.231 | 4.73 |
| Ex. 42 | 6 | 0.50 | 0.50 | 0.02 | 0.06 | 0.349 | 0.369 | 5.19 |
| Ex. 43 | 9 | 0.50 | 0.50 | 0.02 | 0.09 | 0.391 | 0.430 | 5.17 |
| Ex. 44 | 12 | 0.50 | 0.50 | 0.02 | 0.12 | 0.421 | 0.470 | 5.17 |

TABLE 14-continued

| | LED device | | | Long wavelength blue LED (NL8436W) | | | | |
|---|---|---|---|---|---|---|---|---|
| Ex. No. | Luminous power (lm/W) (lumen/W1) | Emission efficiency (lm/W) (lumen/W2) | Ra | Peak wavelength (nm) | W1 (mW) | Applied voltage (V) | Applied current (mA) | Applied voltage × current W2 (mW) |
| Ex. 41 | 262 | 69.1 | 81.4 | 451 | 18.03 | 3.46 | 19.8 | 68.5 |
| Ex. 42 | 288 | 77.7 | 68.3 | 451 | 18.02 | 3.44 | 19.4 | 66.7 |
| Ex. 43 | 293 | 75.9 | 63.5 | 451 | 17.66 | 3.46 | 19.7 | 68.2 |
| Ex. 44 | 286 | 75.8 | 61.3 | 451 | 18.05 | 3.44 | 19.8 | 68.1 |

Examples 45 to 48

(Production of Phosphor (LCSN))

A phosphor powder (LCSN) was obtained in the same manner as in Examples 37 to 40.

(Production of Red Phosphor (SCASN)

The respective metals were weighed so that the metal element compositional ratio became Al:Si=1:1 (molar ratio). Using a graphite crucible, the raw material metals were melted by means of a high frequency melting furnace in an argon atmosphere and then poured from the crucible to a mold and solidified to obtain an alloy (matrix alloy) wherein the metal element compositional ratio was Al:Si=1:1.

The above matrix alloy and other raw material metals were weighed so that the compositional ratio became Eu:Sr:Ca:Al:Si:0.008:0.792:0.2:1:1 (molar ratio). The interior of the furnace was evacuated to $5\times10^{-2}$ Pa, then the evacuation was stopped, and argon was filled in the furnace to a prescribed pressure. In this furnace, the matrix alloy was melted in a calcia crucible, then Sr was melted, and the melt was poured from the crucible into a mold and solidified to obtain a raw material alloy for a phosphor.

The raw material alloy for a phosphor thus obtained was roughly pulverized by an alumina mortar in a nitrogen atmosphere and then pulverized by means of a supersonic jet pulverizer in a nitrogen atmosphere under a pulverization pressure of 0.15 MPa at a raw material supplying rate of 0.8 kg/hr. The obtained alloy powder was washed with water, classified and dried to obtain a phosphor powder of $Sr_{0.792}Ca_{0.200}AlEu_{0.008}SiN_3$ (SCASN).

(Production of Light-Emitting Device)

A white light-emitting device was prepared by combining the obtained phosphor (LCSN) and red phosphor (SCASN), and a long wavelength-blue-emitting GAN type LED chip (NL8436W manufactured by Showa Denko). Further, in order to disperse and seal the above phosphor powder, a sealing material silicone resin (SCR-1011 manufactured by Shin-Etsu Chemical Co., Ltd.) and a dispersant (REOLOSIL QS-30 manufactured by Tokuyama Corporation) were used. A phosphor composition was prepared by adjusting the weight ratio of the phosphor (LCSN):the red phosphor (SCASN):the sealing material (SCR1011):the dispersant (QS30) to be u:v:100:2, respectively, wherein u and v are as shown in Table 15. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained white light-emitting device are shown in Table 15. As shown by the chromaticity coordinate values x and y in Table 15, it is evident that a white emission having a warm white color or light bulb color can easily be realized. In the case of a warm white light of (x,y)=(0.410,0.395) in the light-emitting device in Example 45, the average color rendering evaluation number Ra was 72.2. When compared with the same emission color to a combination of the long wavelength blue LED with only LCSN in the light-emitting device in Example 43, e.g. Ra63.5(x,y)=(0.391, 0.430) in the light-emitting device in Example 43, it is evident that the color rendering property is higher when the red phosphor SCASN is combined.

TABLE 15

| | Mixing amounts of raw materials | | | | | | | LED device | | | | | |
|---|---|---|---|---|---|---|---|---|---|---|---|---|---|
| Ex. No. | Amount of LCSN (u) | Amount of SCASN (v) | SCR1011 A (g) | SCR1011 B (g) | QS30 (g) | Amount of LCSN (g) | Amount of SCASN (g) | x | y | Lumen | Luminous power (lm/W) (lumen/W1) | Emission efficiency (lm/W) (lumen/W2) | Ra |
| Ex. 45 | 6 | 1 | 0.50 | 0.50 | 0.2 | 0.06 | 0.01 | 0.410 | 0.395 | 4.78 | 271 | 70.5 | 72.2 |
| Ex. 46 | 3 | 3 | 0.50 | 0.50 | 0.2 | 0.03 | 0.03 | 0.444 | 0.335 | 4.25 | 226 | 61.7 | 71.4 |
| Ex. 47 | 6 | 2 | 0.50 | 0.50 | 0.2 | 0.06 | 0.02 | 0.459 | 0.401 | 4.75 | 273 | 73.2 | 72.1 |
| Ex. 48 | 6 | 3 | 0.50 | 0.50 | 0.2 | 0.06 | 0.03 | 0.478 | 0.399 | 4.27 | 244 | 64.4 | 70.3 |

TABLE 15-continued

Long wavelength blue LED
(NL8436W)

| Ex. No. | Peak wavelength (nm) | W1 (mW) | Applied voltage (V) | Applied current (mA) | Applied voltage × current W2 (mW) |
|---|---|---|---|---|---|
| Ex. 45 | 451 | 17.65 | 3.46 | 19.6 | 67.8 |
| Ex. 46 | 451 | 18.79 | 3.46 | 19.9 | 68.9 |
| Ex. 47 | 451 | 17.43 | 3.38 | 19.2 | 64.9 |
| Ex. 48 | 451 | 17.49 | 3.42 | 19.4 | 66.3 |

Examples 49 to 54

(Production of Phosphor (LCSN))

A phosphor powder (LCSN) was obtained in the same manner as in Examples 37 to 40.

(Production of Blue Phosphor (BAM))

0.7 mol of barium carbonate ($BaCO_3$), 0.15 mol of europium oxide ($Eu_2O_3$), 1 mol (as Mg) of basic magnesium carbonate (mass per 1 mol of Mg:93.17) and 5 mol of α-alumina ($Al_2O_3$) were weighed so that the composition of the respective raw materials charged for a phosphor would be $Ba_{0.7}Eu_{0.3}MgAl_{10}O_{17}$, mixed for 30 minutes in a mortar and filled in an alumina crucible. This mixture was fired in a box type firing furnace at 1,200° C. for 5 hours while supplying nitrogen, and after cooling, the fired product was taken out from the crucible and pulverized to obtain a precursor for a phosphor. To this precursor, 0.3 wt % of $AlF_3$ was added, then pulverized and mixed in a mortar for 30 minutes, then filled in an alumina crucible and fired by a box type atmosphere firing furnace at 1,450° C. for 3 hours in a nitrogen gas containing 4 wt % of hydrogen, and after cooling, the obtained fired product was pulverized to obtain a pale blue powder.

To this powder, 0.42 wt % of $AlF_3$ was added, then pulverized and mixed for 30 minutes in a mortar, then filled in an alumina crucible, and by setting graphite in the beads form in a space around the crucible, fired at 1,550° C. for 5 hours by supplying nitrogen to the box type firing furnace at a rate of 4 liters per minute. The obtained fired product was pulverized for 6 hours in a ball mill, then classified and subjected to water washing treatment to obtain a blue phosphor powder (BAM). The obtained blue phosphor (BAM) had an emission peak wavelength of 455 nm and an emission peak full width at half maximum of 51 nm.

(Production of Light-Emitting Device)

A white light-emitting device was prepared by combining the obtained phosphor (LCSN) and blue phosphor (BAM), and a near ultraviolet light-emitting GAN type LED chip (C395 MB290 manufactured by Cree). Here, in order to disperse and seal the above phosphor powder, a sealing material silicone resin (U111 manufactured by Mitsubishi Chemical Corporation) and a dispersant (Aerosil RX200 manufactured by Nippon Aerosil Co., Ltd.) were used. A phosphor composition was prepared by adjusting the weight ratio of the blue phosphor (BAN):the phosphor (LCSN):the sealing material (U111):the dispersant (RX200) to be p:q:100:15, wherein p and q are as shown in Table 16. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained white light-emitting device are shown in Table 16. As shown by the chromaticity coordinate values x and y in Table 16, it is evident that a high color rendering white emission from bluish white to yellowish white can easily be realized. In the case of white light of (x,y)=(0.321,0.361) in the light-emitting device in Example 52, the average color rendering evaluation number Ra was high at 78.3. As compared to a light-emitting device with a combination of the long wavelength blue LED with only LCSN in Example 42 having the same emission color, Ra is of a value exceeding 68.3, and it is evident that the color rendering property is improved.

TABLE 16

| | Mixing amounts of raw materials | | | | | | LED device | | | | |
|---|---|---|---|---|---|---|---|---|---|---|---|
| Ex. No. | Amount of BAM (p) | Amount of LCSN (q) | U111 (g) | RX200 (g) | Amount of BAM (g) | Amount of LCSN (g) | x | y | Lumen | Luminous power (lm/W) (lumen/W1) | Emission efficiency (lm/W) (lumen/W2) | Ra |
| Ex. 49 | 9 | 3 | 1.00 | 0.15 | 0.09 | 0.03 | 0.278 | 0.311 | 1.78 | 272 | 24.9 | 82.4 |
| Ex. 50 | 9 | 6 | 1.00 | 0.15 | 0.09 | 0.06 | 0.294 | 0.329 | 1.70 | 264 | 22.6 | 81.7 |
| Ex. 51 | 9 | 9 | 1.00 | 0.15 | 0.09 | 0.09 | 0.317 | 0.366 | 1.46 | 221 | 19.4 | 79.5 |
| Ex. 52 | 9 | 12 | 1.00 | 0.15 | 0.09 | 0.12 | 0.321 | 0.361 | 1.73 | 266 | 24.3 | 78.3 |
| Ex. 53 | 12 | 8 | 1.00 | 0.15 | 0.12 | 0.08 | 0.417 | 0.492 | 1.76 | 271 | 24.5 | 64.8 |
| Ex. 54 | 15 | 10 | 1.00 | 0.15 | 0.15 | 0.10 | 0.429 | 0.488 | 1.40 | 211 | 19.3 | 64.8 |

TABLE 16-continued

| | | Near ultraviolet LED (C395MB290) | | | |
|---|---|---|---|---|---|
| Ex. No. | Peak wavelength (nm) | W1 (mW) | Applied voltage (V) | Applied current (mA) | Applied voltage × current W2 (mW) |
| Ex. 49 | 400 | 6.53 | 3.74 | 19.1 | 71.4 |
| Ex. 50 | 400 | 6.44 | 3.76 | 20.0 | 75.2 |
| Ex. 51 | 400 | 6.61 | 3.76 | 20.0 | 75.2 |
| Ex. 52 | 400 | 6.51 | 3.74 | 19.1 | 71.4 |
| Ex. 53 | 400 | 6.48 | 3.74 | 19.2 | 71.8 |
| Ex. 54 | 400 | 6.64 | 3.74 | 19.4 | 72.6 |

Examples 55 to 58

(Production of Phosphor (LCSN))

A phosphor powder (LCSN) was obtained in the same manner as in Examples 37 to 40.

(Production of Blue Phosphor (BAM))

A blue phosphor powder (BAM) was obtained in the same manner as in

Examples 49 to 54.

(Production of Red Phosphor (CASON))

$Ca_3N_2$ (manufactured by CERAC, 200 mesh pass), AlN (Grade F manufactured Tokuyama Corporation), $Si_3N_4$ (SN-E10 manufactured Ube Industries, Ltd.) and $Eu_2O_3$ (manufactured by Shin-Etsu Chemical Co., Ltd.) were weighed so that the molar ratio would be Eu:Ca:Al:Si=0.008:0.992:1:1.14 by an electrobalance in a glove box filled with nitrogen with an oxygen concentration of not more than 1 ppm. In this glove box, all of these phosphor raw materials were pulverized and mixed for 20 minutes in an alumina mortar until the mixture became uniform. The obtained raw material mixture was filled in a boron nitride crucible and fired at 1,800° C. for 2 hours under a nitrogen pressure of 0.5 MPa. Cleaning, dispersion and classification were carried out to obtain a red phosphor powder (CASON) having a weight median diameter ($D_{50}$) of 8 μm to 10 μm. The composition of the obtained phosphor was $Ca_{0.992}Eu_{0.008}AlSi_{1.14}N_{3.18}O_{0.01}$ by the charged composition, the emission peak wavelength was 650 nm, and the full width at half maximum was 92 nm.

(Production of Light-Emitting Device)

A white light-emitting device was prepared by combining the obtained phosphor (LCSN), blue phosphor (BAM) and red phosphor (CASON), and a near ultraviolet light-emitting GAN type LED chip (C395MB290 manufactured by Cree). Here, in order to disperse and seal the above phosphor powder, a sealing material silicone resin (U111 manufactured by Mitsubishi Chemical Corporation) and a dispersant (Aerosil RX200 manufactured by Nippon Aerosil Co., Ltd.) were used. A phosphor composition was prepared by adjusting the weight ratio of the blue phosphor (BAN):the phosphor (LCSN):the red phosphor (CASON):the sealing material (U111):the dispersant (RX200) to be r:s:t:100:15, wherein r, s and t are as shown in Table 17. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained white light-emitting device are shown in Table 17. As shown by the chromaticity coordinate values x and y in Table 17, it is evident that a high color rendering warm white or light bulb color emission can easily be realized. In the case of warm white light of (x,y)=(0.408, 0.417) in the light-emitting device in Example 55, the average color rendering evaluation number Ra was 77.1. As compared to the light-emitting device with a combination where no CASON was added in Example 53 having a similar emission color, Ra is of a value exceeding 64.8, and it is evident that the color rendering property is improved.

TABLE 17

| | Mixing amounts of raw materials | | | | | | | | LED device | | | | | |
|---|---|---|---|---|---|---|---|---|---|---|---|---|---|---|
| | | | | | | | | | | | | Luminous power (lm/W) (lumen/ | Emission efficiency (lm/W) (lumen/ | |
| Ex. No. | Amount of BAM (r) | Amount of LCSN (s) | Amount of CASON (t) | U111 (g) | RX200 (g) | Amount of BAM (g) | Amount of LCSN (g) | Amount of CASON (g) | x | y | Lumen | W1) | W2) | Ra |
| Ex. 55 | 9 | 9 | 1 | 1.00 | 0.15 | 0.09 | 0.09 | 0.01 | 0.408 | 0.417 | 1.82 | 279 | 24.5 | 77.1 |
| Ex. 56 | 15 | 6 | 1 | 1.00 | 1.15 | 0.15 | 0.06 | 0.01 | 0.448 | 0.458 | 1.59 | 249 | 21.9 | 71.4 |
| Ex. 57 | 9 | 3 | 3 | 1.00 | 0.15 | 0.09 | 0.03 | 0.03 | 0.465 | 0.363 | 1.55 | 232 | 21.4 | 74.4 |
| Ex. 58 | 9 | 6 | 3 | 1.00 | 0.15 | 0.09 | 0.06 | 0.03 | 0.469 | 0.368 | 1.46 | 218 | 19.4 | 74.4 |

| | | Near ultraviolet LED (C395MB290) | | | |
|---|---|---|---|---|---|
| Ex. No. | Peak wavelength (nm) | W1 (mW) | Applied voltage (V) | Applied current (mA) | Applied voltage × current W2 (mW) |
| Ex. 55 | 400 | 6.53 | 3.76 | 19.8 | 74.4 |
| Ex. 56 | 400 | 6.38 | 3.74 | 19.4 | 72.6 |

TABLE 17-continued

| Ex. 57 | 400 | 6.68 | 3.74 | 19.3 | 72.2 |
| Ex. 58 | 400 | 6.72 | 3.76 | 20.0 | 75.2 |

Examples 59 and 60

(Production of Phosphor (LCSN))

A phosphor powder (LCSN) was obtained in the same manner as in Examples 37 to 40.

(Production of Blue Phosphor (BAM))

A blue phosphor powder (BAM) was obtained in the same manner as in

Examples 49 to 54.

(Production of Green Phosphor (BSON))

As raw material compounds, $BaCO_3$ (267 g), $SiO_2$ (136 g) and $Eu_2O_3$ (26.5 g) were sufficiently stirred and mixed so that the composition of respective raw materials charged for a phosphor would be $Ba_{2.7}Eu_{0.3}Si_{6.9}O_{12}N_{3.2}$ and then filled in an alumina mortar. This mixture was placed in a resistance-heating system electric furnace provided with a temperature controller, then heated at a temperature raising rate of 5° C./min to 1,100° C. under atmospheric pressure and held at that temperature for 5 hours and then left to cool to room temperature. The obtained sample was pulverized in an alumina mortar to at most 100 μm.

The sample (295 g) obtained as described above and $Si_3N_4$ (45 g) as a raw material compound were sufficiently stirred and mixed, and then, for the first firing, filled in an alumina crucible. This mixture was heated to 1,200° C. under atmospheric pressure, while supplying a mixed gas of 96 vol % of nitrogen and 4 vol % of hydrogen at a rate of 0.5 L/min and maintained at that temperature for 5 hours, and then left to cool to room temperature. The obtained fired powder was pulverized in an alumina mortar to at most 100 μm.

300 g of the fired powder obtained by the above first firing, $BaF_2$ (6 g) as a flux and $BaHPO_4$ (6 g) were sufficiently stirred and mixed, then filled in an alumina mortar, and then, as the second firing, heated to 1,350° C. under atmospheric pressure while supplying a mixed gas of 96 vol % of nitrogen and 4 vol % of hydrogen at a rate of 0.5 L/min and held at that temperature for 8 hours, and then left to cool to room temperature. The obtained fired powder was pulverized in an alumina mortar to at most 100 μm.

The sample (70 g) obtained by the above second firing, $BaCl_2$ (5.6 g) as a flux and $BaHP_4$ (3.5 g) were sufficiently stirred and mixed, then filled in an alumina mortar, and then, as the third firing, heated to 1,200° C. under atmospheric pressure, while supplying a mixed gas of 96 vol % of nitrogen and 4 vol % of hydrogen at a rate of 0.5 L/min and held at that temperature for 5 hours, and then left to cool to room temperature. The obtained fired powder was slurried and dispersed by means of glass beads, then sieved to at most 100 μm, followed by cleaning treatment, and then, by using a calcium solution and a phosphate solution, surface coating with a calcium phosphate was carried out.

2 g of the obtained phosphor was heated to 700° C. in about 40 minutes in atmospheric air by means of a quartz container having a diameter of 30 mm and held at 700° C. for 10 minutes, whereupon the quartz container was taken out from the furnace and cooled to room temperature on a heat resistant brick to obtain a green phosphor powder (BSON).

(Production of Red Phosphor (CASON))

A red phosphor powder (CASON) was obtained in the same manner as in

Examples 55 to 58.

(Production of Light-Emitting Device)

A white light-emitting device was prepared by combining the obtained phosphor (LCSN), blue phosphor (BAM), green phosphor (BSON), and red phosphor (CASON), and a near ultraviolet light-emitting GAN type LED chip (C395 MB290 manufactured by Cree). Here, in order to disperse and seal the above phosphor powder, a sealing material silicone resin (U111 manufactured by Mitsubishi Chemical Corporation) and a dispersant (Aerosil RX200 manufactured by Nippon Aerosil Co., Ltd.) were used. A phosphor composition was prepared by adjusting the weight ratio of the blue phosphor (BAN):the green phosphor (BSON):the phosphor (LCSN):the red phosphor (CASON):the sealing material (U111):the dispersant (RX200) to be h:k:l:m:100:2, wherein h, k, l and m are as shown in Table 18. Such a mixture was heated at 70° C. for 1 hour and then heated at 150° C. for 5 hours for curing to form a phosphor-containing portion thereby to obtain a surface-mounted type white light-emitting device.

(Emission Properties)

The spectrum characteristics of the obtained white light-emitting device are shown in Table 18. As shown by the chromaticity coordinate values x and y in Table 18, it is evident that a high color rendering warm white or light bulb white emission can easily be realized. In the case of a light bulb color emission of (x,y)=(0.442, 0.426) in the light-emitting device in Example 60, the average color rendering evaluation number Ra was high at 83.1. As compared to the light-emitting device with a combination where no BSON was added in Example 56 having a similar emission color, Ra is of a value exceeding 71.4, and it is evident that the color rendering property is very much improved.

TABLE 18

| | Mixing amounts of raw materials | | | | | | | | | |
|---|---|---|---|---|---|---|---|---|---|---|
| Ex. No. | Amount of BAM (h) | Amount of BSON (k) | Amount of LCSN (l) | Amount of CASON (m) | U111 (g) | RX200 (g) | Amount of BAM (g) | Amount of BSON (g) | Amount of LCSN (g) | Amount of CASON (g) |
| Ex. 59 | 15 | 1 | 1 | 1 | 1.00 | 0.15 | 0.15 | 0.01 | 0.01 | 0.01 |
| Ex. 60 | 9 | 6 | 3 | 3 | 1.00 | 0.15 | 0.09 | 0.06 | 0.03 | 0.03 |

TABLE 18-continued

| | | | | LED device | | | Near ultraviolet LED (C395MB290) | | | | |
|---|---|---|---|---|---|---|---|---|---|---|---|
| Ex. No. | x | y | Lumen | Luminous power (lm/W) (lumen/ W1) | Emission efficiency (lm/W) (lumen/ W2) | Ra | Peak wavelength (nm) | W1 (mW) | Applied voltage (V) | Applied current (mA) | Applied voltage × current W2 (mW) |
| Ex. 59 | 0.411 | 0.432 | 2.03 | 309 | 28.3 | 82.2 | 400 | 6.55 | 3.74 | 19.1 | 71.4 |
| Ex. 30 | 0.442 | 0.426 | 1.56 | 241 | 21.9 | 83.1 | 400 | 6.49 | 3.74 | 19.1 | 71.4 |

Comparative Example 6

A LED device disclosed in Example 39 in JP-A-2008-285659 is presented as Comparative Example 6 in this application. The LED device in this Comparative Example is one obtained by combining a phosphor (one obtained by firing a mixture of $CaSiN_2$ powder, lanthanum nitride powder, cerium oxide powder, silicon nitride powder and 0.5 wt % of $CaF_2$ flux at 2,000° C. for 5 minutes under nitrogen pressure of 0.92 MPa and having a charged composition of $Ca_{0.75}La_{2.4}Ce_{0.1}Si_6N_{11}$) and a blue-emitting GAN type LED chip (460EZ manufactured by Cree). The curing conditions are the same as in Example 37. The raw material mixing amounts, the emission properties, etc. of the light-emitting device in Comparative Example 6 are shown in Table 19.

In the light-emitting device in Comparative Example 6, a white light of (x,y)=(328,313) was obtained, and its luminous power was 281 Lm/W. The luminous power in the light-emitting device in Example 38 having a similar emission color is 319 Lm/W, which is higher than in Comparative Example 6, and it is evident that one having the phosphor of the present invention mounted on LED is capable of emitting brighter white light under the same output condition.

TABLE 19

| | | | | LED device | | | | |
|---|---|---|---|---|---|---|---|---|
| Comp. Ex. No. | Mixing amounts of raw materials (weight ratio) | | | | | Luminous power (lm/W) | Short wavelength blue LED |
| | LCSN | SCR1011 | QS30 | x | y | Lumen | (lumen/W1) | W1 (mW) |
| Comp. Ex. 6 | 4 | 97 | 3 | 0.328 | 0.313 | 1.57 | 281 | 5.58 |

Note)
Short wavelength blue LED: 460EZ manufactured by Cree

Example 61

(Production of Alloy)

The respective metal raw materials of La solid metal blank, Ce solid metal blank and Si solid metal blank were weighed so that the metal element compositional ratio would be La:Ce:Si=2.9:0.1:6 (molar ratio), gently mixed and introduced into an arc melting furnace (ACM-CO1P manufactured by DIA-VAC Limited). After evacuating the interior of the furnace to $1\times10^{-2}$ Pa, argon was introduced, and the mixture was melted by conducting an electric current of about 100 mA to the raw material metals in an argon atmosphere. After confirming that the molten metal was sufficiently rotated by the principle of electromagnetic induction, application of the current was stopped, and the molten metal was naturally cooled and solidified to obtain an alloy for a phosphor raw material. The obtained alloy for a phosphor raw material was confirmed to be a uniform alloy having the above metal element compositional ratio by SEM-EDX. By means of an alumina mortar and a nylon mesh sieve, the alloy for a phosphor raw material was pulverized to an alloy powder having a particle size of at most 37 µm, which was used as a raw material for nitriding treatment.

(Firing of Raw Material)

In a glove box containing nitrogen as an operation atmosphere, 1 g of such an alloy powder and 0.06 g of $CeF_3$ (6 wt % to the alloy raw material) were mixed in an alumina mortar, and the mixture was pressed on a molybdenum tray having a diameter of 30 mm and set in an electric furnace with a molybdenum inner wall having a tungsten heater. After vacuuming from room temperature to 120° C., 4% hydrogen-containing nitrogen gas was introduced to ordinary pressure, and while maintaining the supply rate of 0.5 L/min, the temperature was raised to 800° C., and then the temperature was raised at 0.5° C./min within ranges of from 800° C. to 1,250° C. and from 1,350° C. to 1,550° C., and at 0.1° C./min within a range of from 1,250° C. to 1,350° C., and then firing was carried out at 1,550° C. for 15 hours, followed by pulverization in an alumina mortar.

(Treatment of Fired Product)

The obtained fired product was pulverized in an agate mortar, and the obtained powder was stirred and cleaned with a $NH_4HF_2$ aqueous solution having a concentration of 10 wt % for 1 hour, then washed with water, and then stirred and cleaned with 5N hydrochloric acid for 1 hour and then dried to obtain a phosphor. The evaluation results of properties (emission properties and object color) of this phosphor are shown in Table 20. Here, in Table 20, the luminance (%) and the emission intensity (%) are relative values to a YAG commercial product (P46-Y3 manufactured by Kasei Optonix) being 100%.

The phosphor in Example 61 had a luminance as high as 121% to P46-Y3; a* and b* representing the object color were −17 and 82, respectively; and the chroma $(a^{*2}+b^{*2})^{1/2}$ was very high at 84. On the other hand, evaluation was carried out without treatment with the $NH_4HF_2$ aqueous solution or hydrochloric acid, whereby the luminance to P46-Y3 was 92%.

Examples 62 to 68

Experiments were all carried out in the same manner as in Example 61 except that in Example 61, the composition of the raw material alloy was changed from $La_{2.9}Ce_{0.1}Si_6$ to the compositions disclosed in lines for Examples 62 to 68 in Table 20. The evaluation results of properties (emission properties and object color) of the obtained phosphors are shown in Table 20.

With phosphors obtained by using, as the raw material, an alloy containing e.g. Gd, Y or Sc, or an alloy having the amount of Ce increased from 0.15 to 0.45, the chromaticity coordinate value x is increased from 0.425 to 0.431 or 0.458, which indicates effectiveness to make the emission color to be genuine yellow. Of these phosphors (Examples 62 to 68), $a^*$ and $b^*$ are from $-8$ to $-14$ and from 73 to 88, respectively, and the chroma $(a^{*2}+b^{*2})^{1/2}$ is very high at from 73 to 89, which indicates that they are phosphors having a good object color.

The blue emission intensity due to a Ce-activated $LaSi_3N_5$ type byproduct slightly included in the phosphors (Examples 61, 65 and 66) obtained by using, as the raw material, $La_{2.9}Ce_{0.1}Si_6$, $La_{2.75}Gd_{0.15}Ce_{0.1}Si_6$, and $La_{2.6}Gd_{0.3}Ce_{0.1}Si_6$, respectively, becomes 9.6%, 5.9% and 5.9%, respectively, as represented by the relative intensity to the yellow emission intensity of P46-Y3 excited with 455 nm, which indicates that is effective to substantially prevent blue emission due to the Ce-activated $LaSi_3N_5$ type.

As is apparent from the foregoing results, it has been found that a light-emitting device using the phosphor of the present invention is provided with properties which are useful for practically advantageous applications.

Industrial Applicability

Uses of the phosphor of the present invention are not particularly limited, and it is useful in various fields in which a usual phosphor is employed. However, by utilizing the characteristic such that it is excellent in the temperature properties, it is suitable for the purpose of realizing an illuminant for common illumination to be excited by a light source such as near ultraviolet LED or blue LED. Further, the light-emitting device of the present invention employing the phosphor of the present invention having the above characteristic, is useful in various fields in which a usual light-emitting device is employed. However, it is particularly useful as a light source for an image display device or a lighting device.

This application is a continuation of PCT Application No. PCT/JP2010/055934, filed Mar. 31, 2010, which is based upon and claims the benefit of priority from Japanese Patent Application No. 2009-086840 filed on Mar. 31, 2009 and Japanese Patent Application No. 2009-236147 filed on Oct. 13, 2009. The contents of those applications are incorporated herein by reference in its entirety.

| REFERENCE SYMBOLS | |
|---|---|
| 1: | Second illuminant |
| 2: | Surface-emitting GaN type LD |
| 3: | Substrate |
| 4: | Light-emitting device |
| 5: | Mount lead |

TABLE 20

| | Raw material alloy $La_{(3-x-y)}A_xB_ySi_6$ | | | | Firing | | Emission properties (455 nm excitation) | | | | |
|---|---|---|---|---|---|---|---|---|---|---|---|
| | Metal element A | | Metal element B | | condition Flux | | Emission peak | | | Relative luminance | Emission intensity |
| Ex. No. | Type | Molar ratio x | Type | Molar ratio y | Type | Amount (wt %) | wavelength (nm) | Chromaticity coordinate x | Chromaticity coordinate y | to P46-Y3 (%) | to P46-Y3 (%) |
| Ex. 61 | Ce | 0.1 | — | 0 | $CeF_3$ | 6 | 535 | 0.425 | 0.551 | 121 | 126 |
| Ex. 62 | Ce | 0.15 | — | 0 | $CeF_3$ | 6 | 536 | 0.431 | 0.547 | 115 | 119 |
| Ex. 63 | Ce | 0.3 | — | 0 | $CeF_3$ | 6 | 537 | 0.438 | 0.543 | 113 | 118 |
| Ex. 64 | Ce | 0.45 | — | 0 | $CeF_3$ | 6 | 544 | 0.444 | 0.539 | 107 | 111 |
| Ex. 65 | Ce | 0.1 | Gd | 0.15 | $CeF_3$ | 6 | 541 | 0.442 | 0.540 | 99 | 102 |
| Ex. 66 | Ce | 0.1 | Gd | 0.3 | $CeF_3$ | 6 | 542 | 0.448 | 0.536 | 96 | 101 |
| Ex. 67 | Ce | 0.1 | Y | 0.3 | $CeF_3$ | 6 | 545 | 0.450 | 0.534 | 93 | 98 |
| Ex. 68 | Ce | 0.1 | Sc | 0.3 | $CeF_3$ | 6 | 547 | 0.458 | 0.528 | 76 | 80 |

| | Object color | | | |
|---|---|---|---|---|
| Ex. No. | Luminosity L* | a* | b* | Chroma $(a^{*2} + b^{*2})^{0.5}$ |
| Ex. 61 | 96 | −17 | 82 | 84 |
| Ex. 62 | 93 | −14 | 85 | 86 |
| Ex. 63 | 92 | −13 | 88 | 89 |
| Ex. 64 | 89 | −10 | 85 | 86 |
| Ex. 65 | 88 | −12 | 81 | 82 |
| Ex. 66 | 85 | −11 | 78 | 79 |
| Ex. 67 | 86 | −11 | 79 | 80 |
| Ex. 68 | 78 | −8 | 73 | 73 |

What is claimed is:

1. A phosphor containing a crystal phase represented by the following formula [I], wherein when its object color is expressed by the $L^*a^*b^*$ color system, the values of $a^*$, $b^*$ and $(a^{*2}+b^{*2})^{1/2}$ satisfy $-20 \le a^* \le -2$, $71 \le b^*$ and $71 \le (a^{*2}+b^{*2})^{1/2}$, respectively:

$$R_{3-x-y-z+w2}M_zA_{1.5x+y-w2}Si_{6-w1-w2}Al_{w1+w2}O_{y+w1}N_{11-y-w1} \qquad [I]$$

wherein R is at least one rare earth element selected from the group consisting of La, Gd, Lu, Y and Sc; M is at least one metal element selected from the group consisting of Ce, Eu, Mn, Yb, Pr and Tb; A is at least one bivalent metal element selected from the group consisting of Ba, Sr, Ca, Mg and Zn; and x, y, z, w1 and w2 represent numerical values within the following ranges, respectively:

$(1/7) \le (3-x-y-z+w2)/6 < (1/2)$, $0 \le (1.5x+y-w2)/6 < (9/2)$, $0 \le x < 3$, $0 \le y < 2$, $0 < z < 1$, $0 \le w1 \le 5$, $0 \le w2 \le 5$, $0 \le w1+w2 \le 5$.

2. The phosphor according to claim 1, wherein $0 < (1.5x+y-w2)/6 < (9/2)$.

3. The phosphor according to claim 1, wherein the values of $b^*$ and $(a^{*2}+b^{*2})^{1/2}$ satisfy $71 \le b^* \le 105$ and $71 \le (a^{*2}+b^{*2})^{1/2} \le 105$, respectively.

4. The phosphor according to claim 1, wherein x is $0 < x < 3$.

5. The phosphor according to claims 1, wherein $0 \le (1.5x+y-w2) < (9/2)$.

6. The phosphor according to claim 1, wherein the absorption efficiency is at least 88%.

7. A method for producing a phosphor containing a crystal phase represented by the following formula [I], wherein when its object color is expressed by the $L^*a^*b^*$ color system, the values of $a^*$, $b^*$ and $(a^{*2}+b^{*2})^{1/2}$ satisfy $-20 < a^* < -2$, $71 < b^*$ and $71 < (a^{*2}+b^{*2})^{1/2}$, respectively, which comprises nitriding an alloy for production of a phosphor, containing at least elements of R, A and Si, wherein said alloy is subjected to firing in the presence of a flux:

$$R_{3-x-y-z+w2}M_zA_{1.5x+y-w2}Si_{6-w1-w2}Al_{w1+w2}O_{y+w1}N_{11-y-w1} \qquad [I]$$

wherein R is at least one rare earth element selected from the group consisting of La, Gd, Lu, Y and Sc; M is at least one metal element selected from the group consisting of Ce, Eu, Mn, Yb, Pr and Tb; A is at least one bivalent metal element selected from the group consisting of Ba, Sr, Ca, Mg and Zn; and x, y, z, w1 and w2 represent numerical values within the following ranges, respectively:

$(1/7) \le (3-x-y-z+w2)/6 < (1/2)$, $0 \le (1.5x+y-w2)/6 < (9/2)$, $0 \le x < 3$, $0 \le y < 2$, $0 < z < 1$, $0 \le w1 \le 5$, $0 \le w2 \le 5$, $0 \le w1+w2 \le 5$.

8. The method for producing a phosphor according to claim 7, wherein $0 < (1.5x+y-w2)/6 < (9/2)$.

9. The method for producing a phosphor according to claim 7, wherein $0 \le (1.5x+y-w2) < (9/2)$.

10. The method for producing a phosphor according to claim 7, wherein the firing is carried out under a temperature condition such that the rate of temperature rise during the firing is at most 0.5° C./min within a temperature range corresponding to at least a part of the low temperature side of an exothermic peak obtainable by TG-DTA (Thermogravimetry/Differential Thermal Analysis) during the nitriding reaction of the alloy for production of a phosphor.

11. The method for producing a phosphor according to claim 7, wherein the firing is carried out in a hydrogen-containing nitrogen gas atmosphere.

12. The method for producing a phosphor according to claim 7, wherein after the firing, the obtained fired product is washed with an acidic aqueous solution.

13. A phosphor containing a composition represented by the following formula [I'], wherein when its object color is expressed by the $L^*a^*b^*$ color system, the values of $a^*$, $b^*$ and $(a^{*2}+b^{*2})^{1/2}$ satisfy $-20 \le a^* \le -2$, $71 \le b^*$ and $71 \le (a^{*2}+b^{*2})^{1/2}$, respectively:

$$(Ln,Ca,Ce)_{3+\alpha}Si_6N_{11} \qquad [I']$$

wherein Ln is at least one rare earth element selected from the group consisting of La, Gd, Lu, Y and Sc, and $\alpha$ is a numerical value within a range of $-0.1 \le \alpha \le 1.5$.

14. A phosphor-containing composition comprising the phosphor as defined in claim 1 and a liquid medium.

15. A light-emitting device having a first illuminant and a second illuminant which emits visible light under irradiation with light from the first illuminant, wherein the second illuminant contains, as a first phosphor, at least one phosphor selected from the group consisting of the phosphor as defined in claim 1.

16. The light-emitting device according to claim 15, wherein the first phosphor has an emission peak wavelength within a wavelength range of from 420 nm to 450 nm.

17. The light-emitting device according to claim 15, wherein the second illuminant contains, as a second phosphor, at least one phosphor different in the emission peak wavelength from the first phosphor.

18. The light-emitting device according to claim 15, wherein the first phosphor has an emission peak within a wavelength range of from 420 nm to 500 nm, and the second illuminant contains, as a second phosphor, at least one phosphor having an emission peak within a wavelength range of from 565 nm to 780 nm.

19. The light-emitting device according to claim 15, wherein the first phosphor has an emission peak within a wavelength range of from 300 nm to 420 nm, and the second illuminant contains, as a second phosphor, at least one phosphor having an emission peak within a wavelength range of from 420 nm to 500 nm.

20. The light-emitting device according to claim 15, wherein the first phosphor has an emission peak within a wavelength range of from 300 nm to 420 nm, and the second illuminant contains, as a second phosphor, at least one phosphor having an emission peak within a wavelength range of from 420 nm to 500 nm, at least one phosphor having an emission peak within a wavelength range of from 500 nm to 550 nm, and at least one phosphor having an emission peak within a wavelength range of from 565 nm to 780 nm.

21. A lighting system provided with the light-emitting device as defined in claim 15.

22. An image display device provided with the light-emitting device as defined in claim 15.

* * * * *